United States Patent
Dombrowski et al.

(10) Patent No.: US 10,412,853 B2
(45) Date of Patent: Sep. 10, 2019

(54) STORAGE SYSTEM

(71) Applicant: Bretford Manufacturing, Inc., Franklin Park, IL (US)

(72) Inventors: Mike Dombrowski, Elk Grove Village, IL (US); Patrick Eiswerth, Chicago, IL (US); Cary Maguire, Chicago, IL (US); Matthew Banach, Gurnee, IL (US); Joe Doran, Round Rock, TX (US); John Sadler, Des Plaines, IL (US)

(73) Assignee: Bretford Manufacturing, Inc., Franklin Park, IL (US)

( * ) Notice: Subject to any disclaimer, the term of this patent is extended or adjusted under 35 U.S.C. 154(b) by 533 days.

(21) Appl. No.: 15/210,237

(22) Filed: Jul. 14, 2016

(65) Prior Publication Data

US 2017/0027079 A1    Jan. 26, 2017

Related U.S. Application Data

(60) Provisional application No. 62/194,402, filed on Jul. 20, 2015, provisional application No. 62/273,509, filed on Dec. 31, 2015.

(51) Int. Cl.
*H05K 7/14* (2006.01)
*H02J 5/00* (2016.01)
(Continued)

(52) U.S. Cl.
CPC .......... *H05K 7/1492* (2013.01); *B62B 3/005* (2013.01); *B62B 5/061* (2013.01); *G06F 1/1628* (2013.01);
(Continued)

(58) Field of Classification Search
CPC .... G06F 1/1632; G06F 1/1628; H02J 7/0068; H02J 5/005; H02J 5/00; H02J 7/0044;
(Continued)

(56) References Cited

U.S. PATENT DOCUMENTS 6,008,621 A  * 12/1999 Madison ............... H02J 7/0042
                                              320/107
6,218,796 B1 *  4/2001 Kozlowski ............ G06F 1/1632
                                              318/139

(Continued)

OTHER PUBLICATIONS

International Search Report and Written Opinion from corresponding International Application No. PCT/US2016/042313, dated Nov. 22, 2016 (16 pages).

(Continued)

*Primary Examiner* — Dimarys S Lopez Cruz
*Assistant Examiner* — Ingrid D Wright
(74) *Attorney, Agent, or Firm* — Anderson Gorecki LLP

(57) ABSTRACT

A storage system includes a computer storage compartment, a first shelf, and a first power configuration unit. The first power configuration unit has a first base and a first bridge, the first bridge extending from the first base and spanning above the first shelf. A first plurality of dividers are connected to the first bridge and extend downward toward the first shelf, the first plurality of dividers forming first individual storage bays within the computer storage compartment and the first plurality of dividers do not contact the first shelf. The power configuration units are modular to enable the storage system to selectively contain power configuration units designed to provide AC power, DC power, or a mix of both AC and DC power within the storage system depending on the power requirements of the portable computing devices to be stored therein.

37 Claims, 52 Drawing Sheets

(51) Int. Cl.
   *H02M 7/04* (2006.01)
   *H05K 5/02* (2006.01)
   *G06F 1/16* (2006.01)
   *H02J 7/00* (2006.01)
   *H02J 50/12* (2016.01)
   *B62B 5/06* (2006.01)
   *B62B 3/00* (2006.01)

(52) U.S. Cl.
   CPC ............. *G06F 1/1632* (2013.01); *H02J 5/00* (2013.01); *H02J 7/0044* (2013.01); *H02M 7/04* (2013.01); *H05K 5/0234* (2013.01); *B62B 2202/56* (2013.01); *H02J 50/12* (2016.02)

(58) Field of Classification Search
   CPC ............. H02J 2007/0098; H02J 7/0027; H02J 7/0057; H02J 7/0075; H02J 50/12; H02M 7/04; H05K 5/0234; H05K 7/1492; B62B 3/005; B62B 5/061; B62B 3/00; B62B 25/061; B62B 2202/56
   See application file for complete search history.

(56) References Cited

U.S. PATENT DOCUMENTS

| | | | |
|---|---|---|---|
| 7,055,833 B2 | 6/2006 | Wixted et al. | |
| 7,130,190 B1* | 10/2006 | Baker | G06F 1/1632 361/695 |
| 7,160,113 B2* | 1/2007 | McConnell | G09B 7/00 434/365 |
| 7,325,891 B1 | 2/2008 | Kinsley et al. | |
| 7,494,356 B2 | 2/2009 | Byrne | |
| 7,800,914 B2* | 9/2010 | Dully | G06F 1/1632 361/756 |
| 7,844,770 B2 | 11/2010 | Petrick et al. | |
| 8,188,714 B2 | 5/2012 | Petrick et al. | |
| 8,312,199 B2 | 11/2012 | Johnson | |
| 8,585,419 B2 | 11/2013 | Byrne | |
| 8,657,312 B2 | 2/2014 | Guasta et al. | |
| 8,752,848 B2 | 6/2014 | Petrick et al. | |
| 8,870,195 B2 | 10/2014 | Guasta et al. | |
| 8,909,839 B2 | 12/2014 | Petrick et al. | |
| 8,916,991 B2 | 12/2014 | Petrick et al. | |
| 8,934,254 B2 | 12/2015 | Petrick et al. | |
| 2003/0111245 A1 | 6/2003 | Haggerty | |
| 2009/0016008 A1* | 1/2009 | Hock | G06F 1/1632 361/679.4 |
| 2009/0179501 A1* | 7/2009 | Randall | H01R 25/147 307/104 |
| 2013/0175993 A1 | 7/2013 | Chen | |
| 2013/0200584 A1* | 8/2013 | Guasta | B62B 3/005 280/79.2 |
| 2014/0175031 A1 | 6/2014 | Roberts | |

OTHER PUBLICATIONS

International Preliminary Report on Patentability from corresponding International Application No. PCT/US2016/042313, dated Jan. 23, 2018 (10 pages).

Invitation to Pay Additional Fees and Partial International Search (PCT/ISA/206) From Corresponding International Application PCT/US2016/042313, 7 pages, dated Sep. 26, 2016.

* cited by examiner

STORAGE SYSTEM

CROSS-REFERENCE TO RELATED APPLICATIONS

This application claims priority to U.S. Provisional Application No. 62/194,402, filed Jul. 20, 2015, entitled Multiple Portable Computing Device Storage System, and also claims priority to U.S. Provisional Application No. 62/273,509, filed Dec. 31, 2015, entitled Portable Computer Storage system, the content of each of which is hereby incorporated herein by reference.

BACKGROUND OF THE INVENTION

1. Field of the Invention

The present invention relates to storage systems and, more particularly, to a storage systems for portable computers, tablet computers, and handheld electronic devices.

SUMMARY

In one aspect, a storage system includes a computer storage compartment, a first shelf, and a first power configuration unit. The first power configuration unit has a first base and a first bridge, the first bridge extending from the first base and spanning above the first shelf. A first plurality of dividers are connected to the first bridge and extend downward toward the first shelf, the first plurality of dividers forming first individual storage bays within the computer storage compartment and the first plurality of dividers do not contact the first shelf.

In some implementations the storage system also includes a second shelf and a second power configuration unit. The second power configuration unit has a second base and a second bridge, the second bridge extending from the second base and spanning above the second shelf. A second plurality of dividers are connected to the second bridge and extend downward toward the second shelf, the second plurality of dividers forming second individual storage bays within the computer storage compartment and the second plurality of dividers do not contact the second shelf.

In certain implementations the first plurality of dividers are removably connected to the first bridge and attachable to the first bridge in a plurality of spacing intervals to form first individual storage bays of different widths, and the second plurality of dividers are removably connected to the second bridge and attachable to the second bridge in a plurality of spacing intervals to form second individual storage bays of different widths.

In some implementations the storage system further includes a power distribution unit, the power distribution unit supplying power within the storage system to the first power configuration unit and to the second power configuration unit.

In certain implementations the power distribution unit supplies approximately 5V DC power to the first power configuration unit and supplies approximately 110V AC power to the second power configuration unit.

In some implementations, the power distribution unit supplies approximately 20V DC power to the first power configuration unit and supplies approximately 110V AC power to the second power configuration unit.

In certain implementations the power distribution unit supplies approximately 5V DC power to the first power configuration unit and supplies approximately 20V DC power to the second power configuration unit.

In some implementations, the power distribution unit supplies approximately 110V AC power to the first and second power configuration units, and at least one of the first and second power configuration units includes an AC/DC power transformer to convert 110V AC power to a selected DC power level for distribution to DC outlets in the power configuration unit.

In certain implementations the storage system also includes a battery connected to the power distribution unit to supply power to the first power configuration unit and to the second power configuration unit when the power distribution unit is not connected to an external source of power.

In certain implementations the storage system also includes a battery connected to the power distribution unit to supply power to the first power configuration unit and to the second power configuration unit to supplement an amount of power available at the power distribution unit from an external source of power.

In some implementations the storage system also includes a wire-free charging pad on the shelf below the first plurality of dividers to span across at least a plurality of the first individual storage bays within the computer storage compartment.

In one aspect, a storage system, includes an enclosure, a first power configuration unit in the enclosure configured to supply AC power to a first set of AC adapters of a first set of portable computing devices within the enclosure, and a second power configuration unit in the enclosure to supply DC power to a second set of portable computing devices within the enclosure.

In some implementations, the storage system also includes an AC/DC power supply to receive AC power from an external source of power and convert the AC power to DC power for the second power configuration unit.

In certain implementations, the AC/DC power supply is contained in the second power configuration unit.

In some implementations the storage system also includes a power distribution unit to transmit AC power from the AC/DC power supply to the first power configuration unit and to transmit DC power from the AC/DC power supply to the second power configuration unit.

In one aspect, an insert for a storage system includes a base, a bridge connected to the base, and a plurality of dividers connected to the bridge and extending downward from the bridge toward the base. The bridge is connectable to the base in two vertical positions.

In some implementations the bridge has a pair of side plates, each side plate having first and second connectors for selective connection to the base, wherein the first and second connectors are vertically spaced to enable the bridge to be connected to the base in a first of the two vertical positions in which the bridge is at a first vertical height relative to the base and enable the bridge to be connected to the base in a second of the two vertical positions in which the bridge is at a second vertical height relative to the base.

In certain implementations, the first and second connectors connect the bridge to the base to enable the bridge to be articulated in a transverse and rotational direction relative to the side plates.

In some implementations, the first connectors comprise pivots to retain the bridge and enable the bridge to be pivoted relative to the base to expose a bottom area of the bridge to provide a user with easy accessibility to the dividers connected to the bridge.

In certain implementations, the bridge includes a first set of divider mounting apertures having a first lateral spacing and a second set of divider mounting apertures having a second lateral spacing.

In some implementations, the first set of divider mounting apertures has fewer apertures than the second set of divider mounting apertures.

In certain implementations, the bridge further includes a numbering strip, the numbering strip having a first set of numbers on a first side corresponding to the first lateral spacing and having a second set of numbers on a second side corresponding to the second lateral spacing.

In some implementations, the first set of divider mounting apertures has fewer apertures than the second set of divider mounting apertures.

In certain implementations, when the plurality of dividers are connected to the bridge using the first set of divider mounting apertures the lateral spacing between adjacent dividers is larger than when the plurality of dividers are connected to the bridge using the second set of divider mounting apertures.

In some implementations, the bridge further includes a third set of divider mounting apertures having a third lateral spacing, wherein the first set of divider mounting apertures has fewer apertures than the third set of divider mounting apertures, and wherein the third lateral spacing is smaller than the first lateral spacing.

In certain implementations, the insert for the storage system further includes a transformer to receive AC power and transform the AC power into DC power at a first DC power level.

In certain implementations, when the plurality of dividers are connected to the bridge using the first set of divider mounting apertures the lateral spacing between adjacent dividers is larger than when the plurality of dividers are connected to the bridge using the second set of divider mounting apertures.

In one aspect, a storage system, includes a plurality of individual storage bays, each bay being sized to contain a portable computing device, and a wire-free charging pad extending across at least two adjacent individual storage bays to provide contact-based wire-free charging power to portable computing devices stored within the at least two adjacent individual storage bays.

In some implementations the wire-free charging pad includes a plurality of contact strips with alternating power polarity.

In certain implementations the storage system also includes a plurality of cases for the plurality of portable computing devices, each case having at least two contacts to receive power from the plurality of contact strips of the wire-free charging pad.

BRIEF DESCRIPTION OF THE DRAWINGS

Aspects of the present invention are illustrated by way of example in the following drawings in which like references indicate similar elements. The following drawings disclose various embodiments of the present invention for purposes of illustration only and are not intended to limit the scope of the invention. For purposes of clarity, not every component may be labeled in every figure.

DETAILED DESCRIPTION

Figure 1:
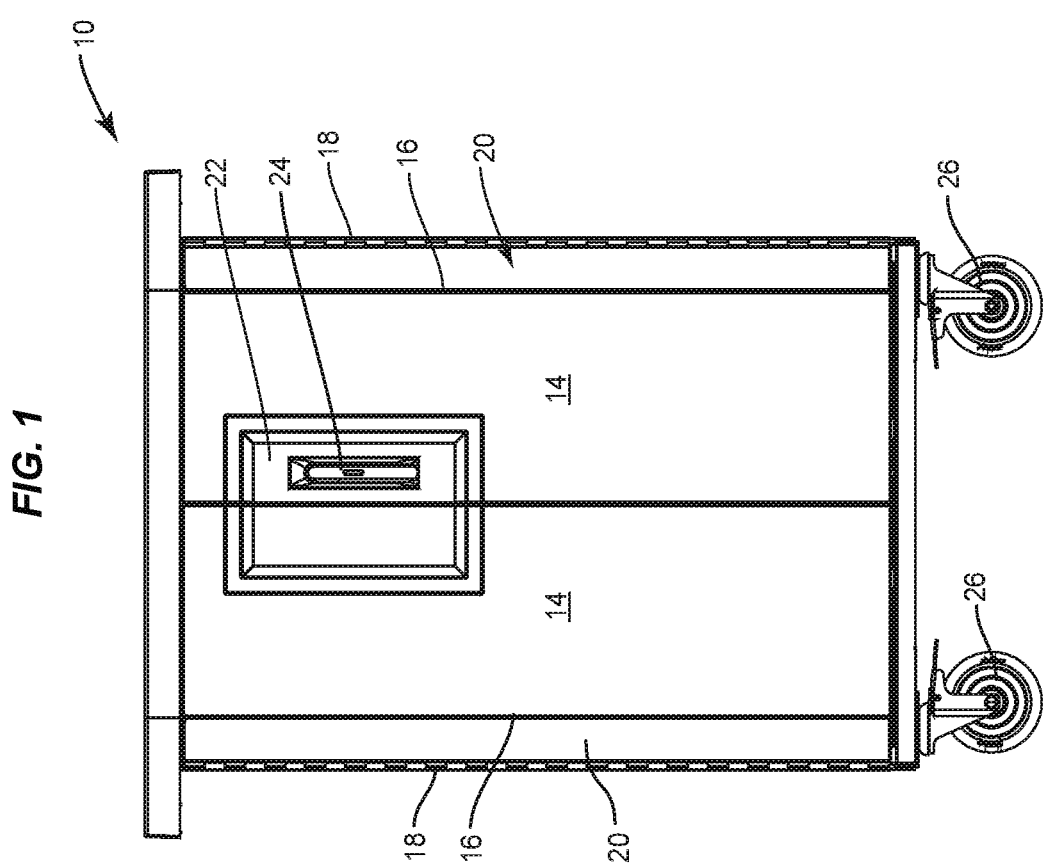
FIG. 1 is a front view of an example portable computer storage system with front doors closed.
Figure 2:
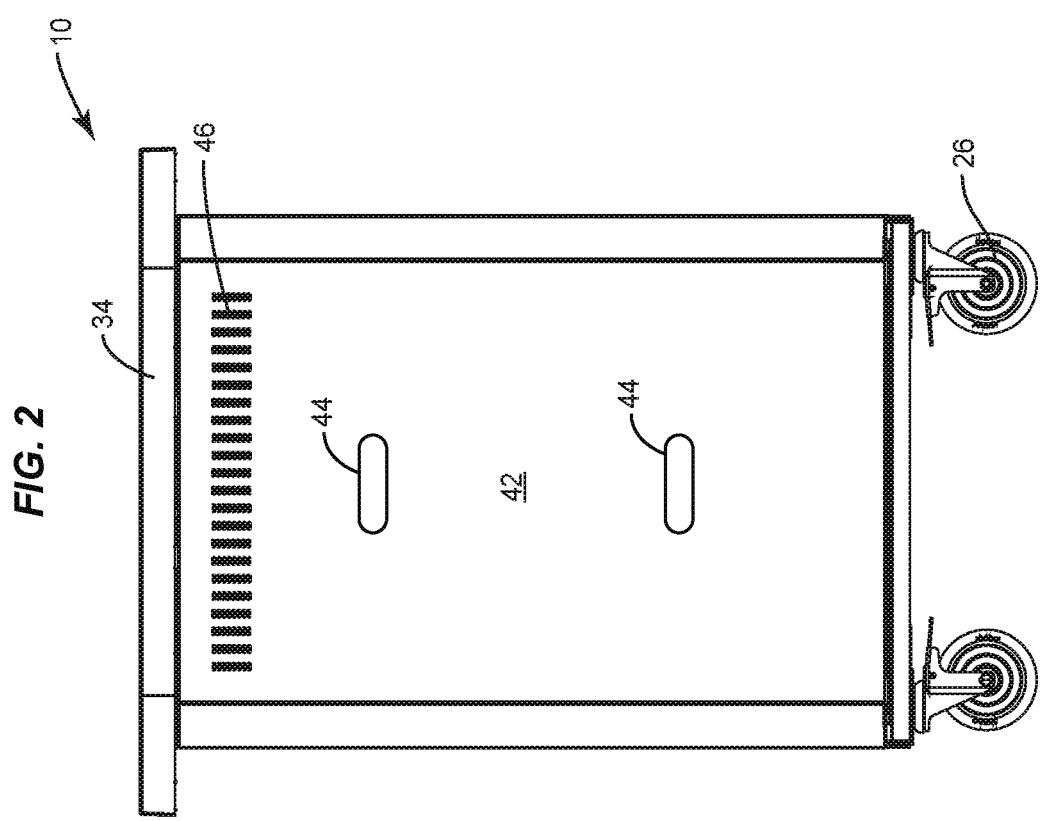
FIG. 2 is a rear view of the example portable computer storage system of FIG. 1.

Portable computing devices, such as laptop and tablet computers, are commonly used in educational facilities to enrich the curriculum provided to students. As used herein, the term "portable computing device" will be used to generically to refer to laptop and tablet type computers. A laptop computer generally has a screen and a body with a keyboard. A tablet computer generally is formed as a unit that includes enclosed electronics that allows the tablet to perform computational functions without attaching to a body, and a screen such as a touch screen. Peripheral devices such as a keyboard may be attached to a tablet but are not essential for it to function. Portable computing devices have rechargeable batteries that may be charged to enable the portable computing devices to be used while not connected to an electrical outlet.

In some educational facilities, students are provided with a portable computing device to be used in school and at home. In other institutions, students are encouraged to bring their own portable computing devices. In still other institutions, the educational facility may provide groups of portable computing devices which are stored at the institution and able to be checked out and used by the students as needed.

Enclosed carts, desktop cabinets, wall mounted cabinets, and individual storage lockers can be used to store portable computing device when not in use and may also be used to charge these devices while the devices are being stored so that they are ready for use when needed. As used herein, the term "storage system" will be used generically to refer to computer carts, desktop cabinets, wall mounted cabinets, rolling cases, open trays, and storage lockers, all of which are designed to store portable computing devices and provide charging power to the portable computing devices while stored therein. Portable computing devices are electrically connected to the storage system while stored within the storage system to enable the portable computing devices to be charged and optionally synchronized with an external computer while stored in the storage system.

Different types of portable computing devices have different power requirements. For example, many laptop batteries are charged using DC power at a voltage level between around 19.5V and 24V. To enable power to be supplied to the laptop in the preferred format (voltage and amperage) a transformer is commonly used to convert 120/240 volt 60/50 Hz AC electrical power available in a standard electrical wall outlet to the lower voltage DC power required by the device. Generally, AC transformers are computer specific, in that each type/model of computer may have its own AC transformer configured to supply power according to the particular power requirements of that type of computer. An external AC transformer is commonly referred to as a "power brick".

Where a storage system is designed to hold multiple laptop computers, e.g. 24, 36, or more laptop computers, storage of the AC transformers and associated wires may require considerable space in the storage system. Accordingly, storage systems designed to store laptop computers generally are configured to provide 110/220V AC power at outlets within the storage system and also are configured to provide storage area(s) for the laptop AC transformers.

Other portable computing devices such as many tablet computers are designed to receive a lower voltage DC charging power, such as power at 5V DC defined by one of the USB standards. Where the storage system is designed to hold multiple tablet computers, e.g. 24, 36, or more tablet computers, the storage system will often be designed to provide outlets that supply 5V DC power rather than 110/220V AC power. Due to the lower power consumption of these devices, the storage system often will have different a different type of power management system than a storage system designed to manage laptop computers. Likewise, since the tablets don't require external AC transformers or have significantly smaller AC transformers, the storage system may be optimized from a space perspective to not include as much dedicated AC transformer storage area.

According to an implementation, a storage system is provided that is capable of storing multiple types of portable computing devices and is capable of quickly and easily being converted from being configured for storage of one type of portable computing device into being configured for storage of another type of portable computing device.

According to an implementation, a storage system is provided that is capable of being configured to store and charge only laptop computers, only tablet computers, a mix of both laptop and tablet computers. The storage system is also capable of quickly and easily being changed from being configured to store and charge only laptop computers into a storage system that is configured to store and charge both laptop and tablet computers, or into a storage system that is configured to store and charge only tablet computers. Likewise, the storage system is also capable of quickly and easily being changed from being configured to store and charge only tablet computers into a storage system that is configured to store and charge both tablet and laptop computers, or into a storage system that is configured to store and charge only laptop computers. A storage system that is initially configured to store and charge both tablet and laptop computers may likewise be reconfigured to store and charge only tablet computers or to store and charge only laptop computers.

Physical Structure

FIGS. 1-5 show an example storage system 10 implemented as a computer cart that is designed to maintain a large number of portable computing devices such as laptop computers and/or tablet computers. Although an implementation will be described in which the storage system 10 is implemented as a computer cart, the storage system 10 may likewise be implemented as a desk-top cabinet, wall mounted cabinet, or other type of storage system. Thus, although an implementation will be described in connection with a computer cart, the invention is not so limited.

As shown in FIG. 1, the storage system 10 is generally formed as a metallic box including an interior frame 12 (see FIG. 10) surrounded by exterior panels. In the implementation shown in FIG. 1, the storage system 10 has a pair of front doors 14 that are supported by first front hinges 16 and second front hinges 18. First front hinge 16 and second front hinge 18 of each door is separated by a spacer 20. Using two sets of front hinges (two hinges spaced apart by spacer 20) enables the door 14 to rotate away from the front of the storage system 10 to lay flat along the side panels of the storage system 10 (see FIGS. 10-15) when the doors are open.

Figure 12:
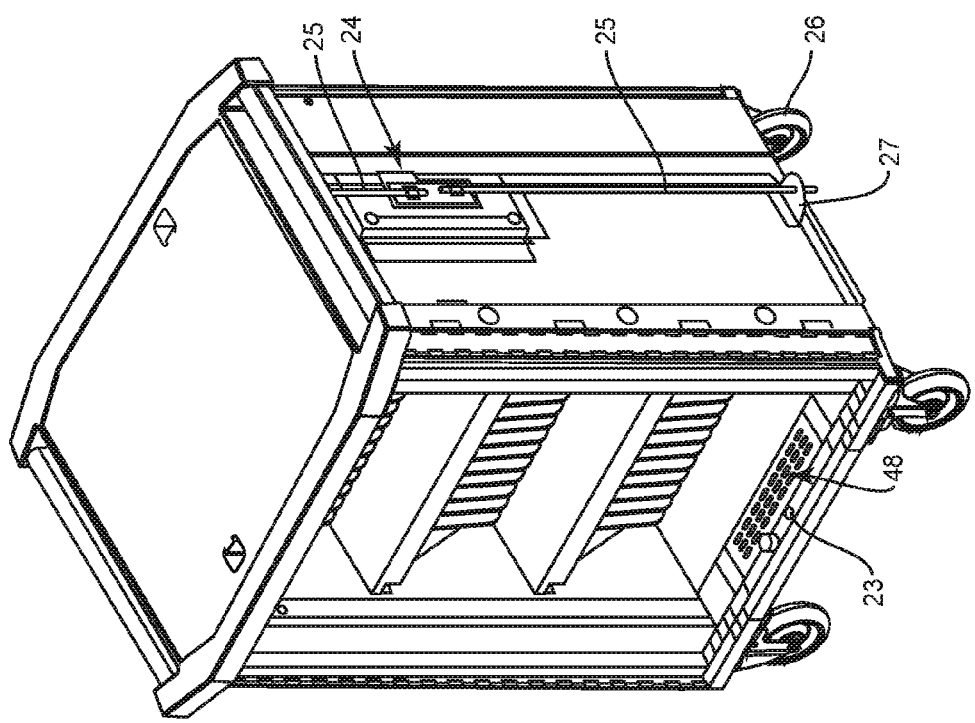
Figure 13:
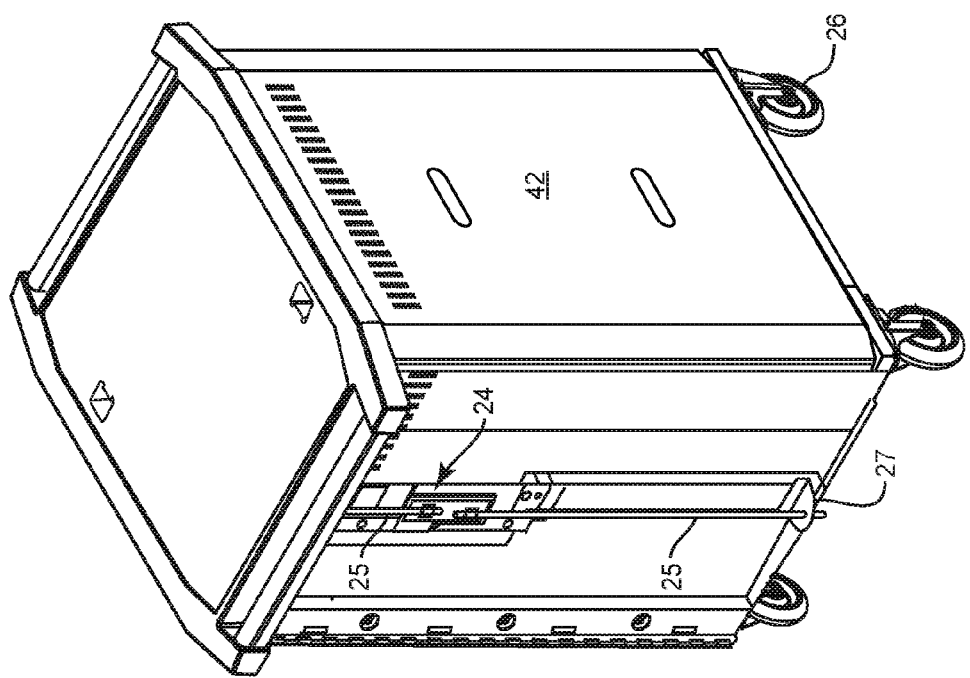
FIGS. 13 and 14 are rear perspective views of the example portable computer storage system of FIG. 1 with the front doors open and folded along the sides of the storage system.
Figure 14:
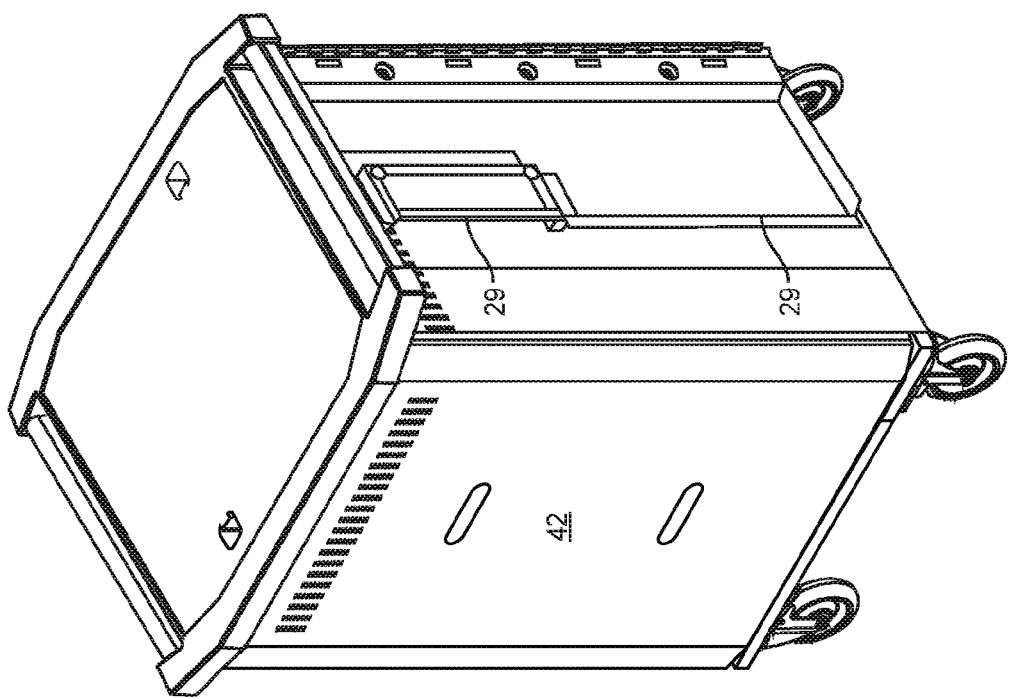

The storage system 10 includes a handle 22 and lock 24 to enable the front doors 14 to be secured while in a closed position (FIGS. 1-9) and to enable the front doors 14 to be opened as shown in FIGS. 10-15. FIGS. 12-13 show an example interior of an implementation of a door locking system. As shown in FIG. 13, the lock 24 in one implementation is connected to two vertical rods 25 which are supported by brackets 27. Movement of the lock 24 causes rods 25 on the right front door to move vertically relative to the bottom and top of the storage system 10. When the front doors 14 are locked, rods 25 engage apertures or other mechanical structures such as lock holes 23 in the top and bottom front edge of the frame 12 of the storage system 10. When the doors are unlocked, the rods are moved vertically to not protrude into lock holes 23 to disengage from the top and bottom of the storage system 10 so that the doors may be opened. As shown in FIG. 14, the left door has tab 29 along its edge which sits behind the front edge of the right door when the doors are closed. Hence, locking the right door also secures the left door due to the presence of tab 29 behind the front edge of the right door. Where the lock 24 is a key lock, the rods 25 may be moved mechanically by turning a handle or by turning the key in the lock 24. Where the lock is electronic, an electronic actuation mechanism may move rods 25 depending on the state of the electronic lock. For example, if the electronic lock has a keypad, entry of the correct access code into the keypad may cause the electronic lock to move rods 25 to provide access to the interior of the storage system 10. Similarly, where the electronic lock is associated with an RFID reader, detection of an RFID chip associated with a person authorized to access the interior of the storage system 10 may cause the electronic lock to move the rods 25 to enable access to the storage system.

In an implementation that is intended to be mobile, such as the storage system 10 shown in FIGS. 1-15, castors 26 may be provided on a lower surface of the storage system 10.

Figure 4:
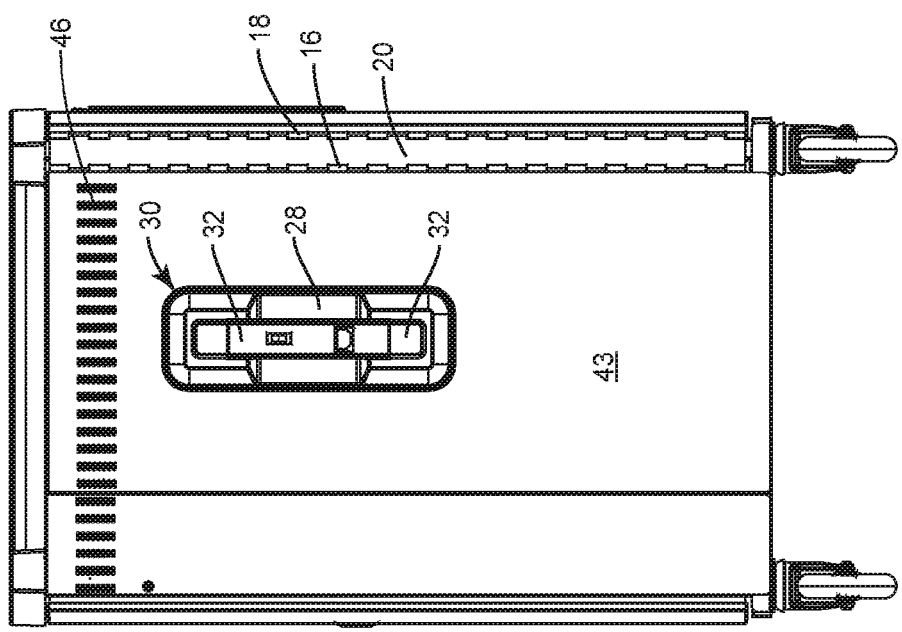
FIG. 4 is a left side view of the example portable computer storage system of FIG. 1.
Figure 5:
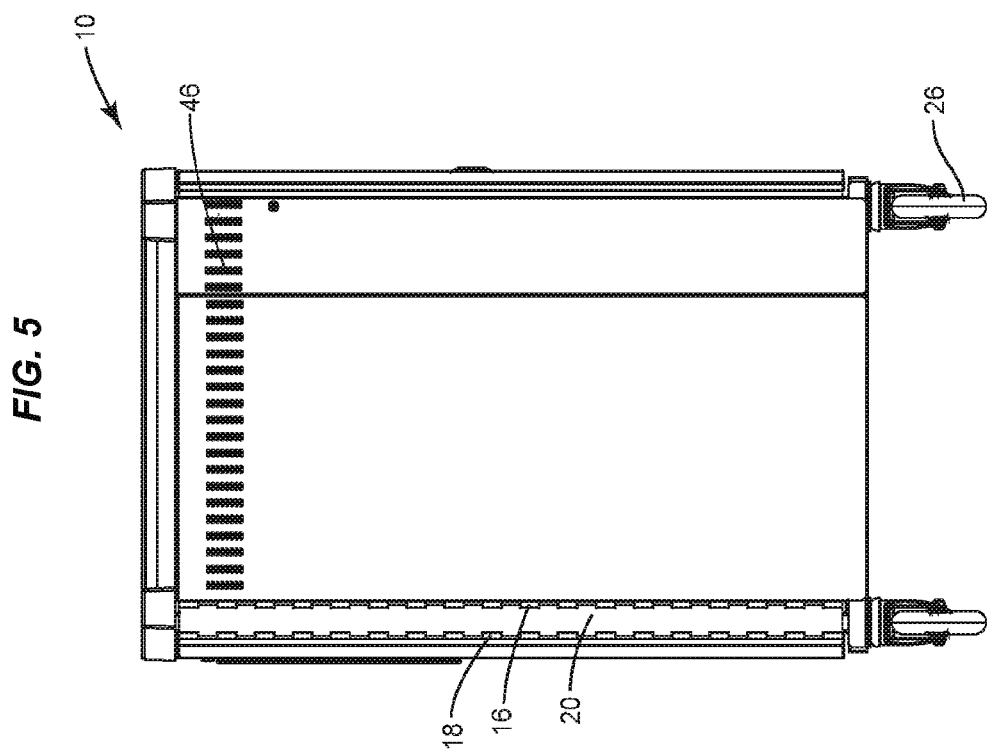
FIG. 5 is a right side view of the example portable computer storage system of FIG. 1.
Figure 6:
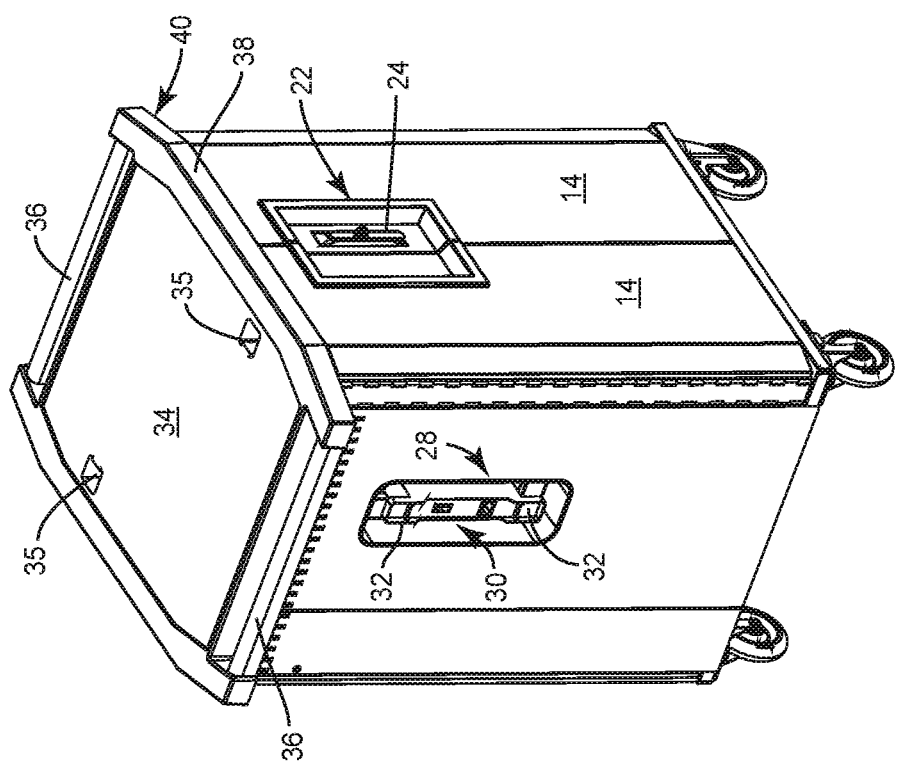
FIGS. 6 and 7 are front perspective views of the example portable computer storage system of FIG. 1 with the front doors closed.
Figure 7:
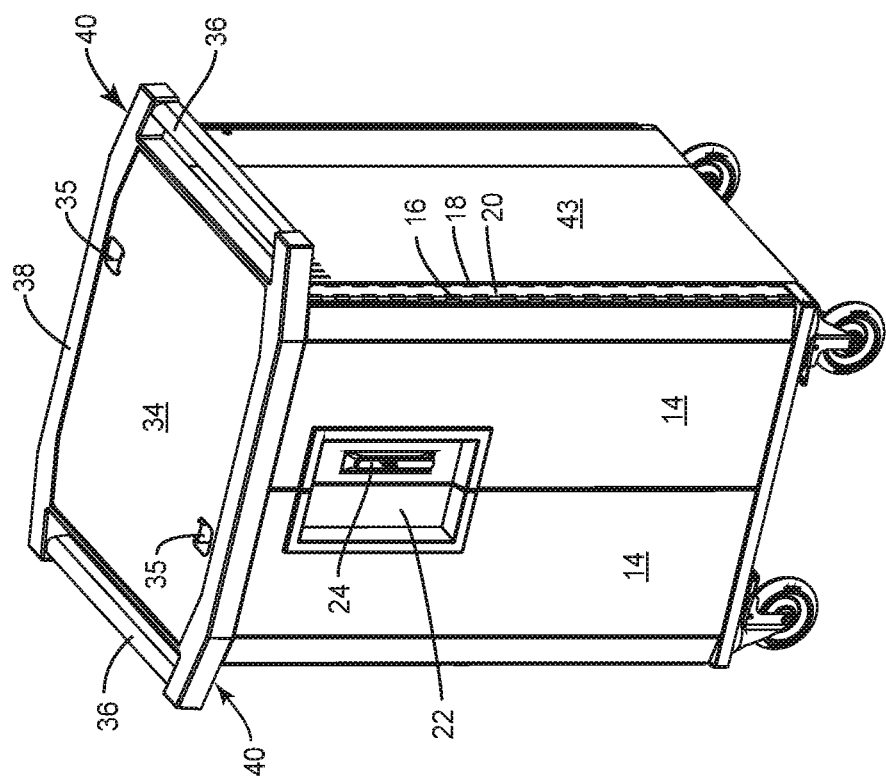
Figure 8:
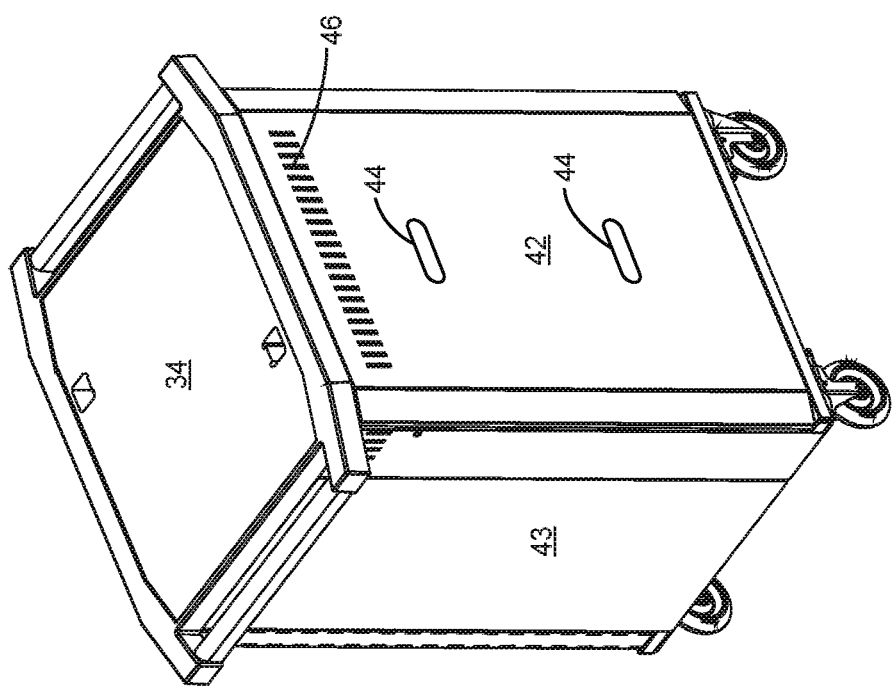
FIGS. 8 and 9 are rear perspective views of the example portable computer storage system of FIG. 1 with the front doors closed.

Power is provided to the storage system 10 by a power cord (not shown) that is wound on power cord winding 28 (see FIGS. 4 and 6). The power cord winding 28 in this implementation has a recessed area 30 and a pair of tabs 32 that extend above the recessed area 30. A power cord may be wound around the tabs within the recessed area to retain the power cord when the power cord is not connected to a wall outlet.

Figure 3:
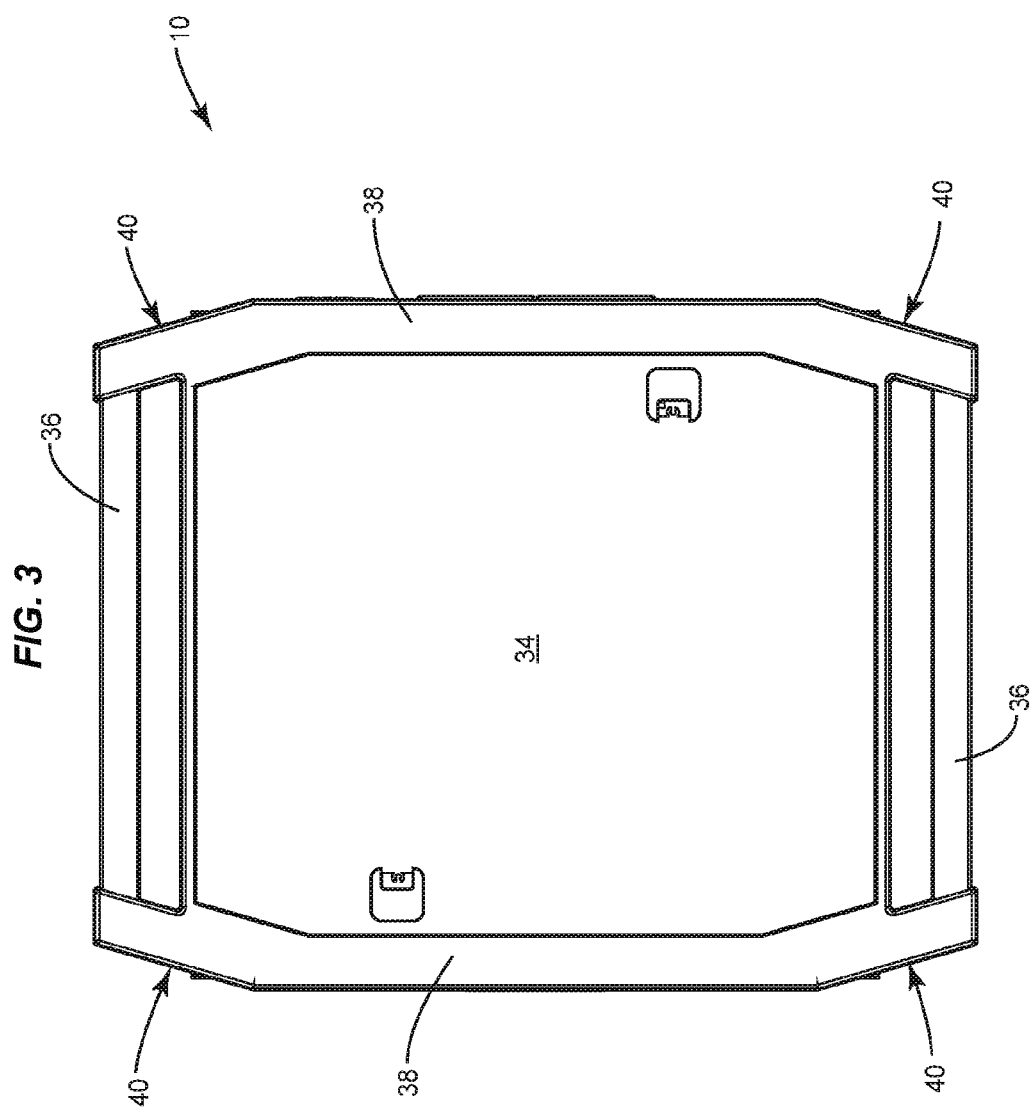
FIG. 3 is a top plan view of the example portable computer storage system of FIG. 1.

A top surface 34 of the storage system 10 is formed as a work surface and includes integral handles 36 along the sides of the storage system 10. Edges 38 are formed of softer material and form bumpers which protect the environment in which the storage system 10 is used, for example to prevent the storage system 10 from damaging a wall if the storage system 10 accidentally bumps into the wall. In one implementation, for example as shown in FIGS. 3 and 6, the corners 40 are angled in toward the storage system 10 to further reduce the likelihood that a corner 40 of the storage system 10 will mar or otherwise damage the wall if the storage system 10 accidentally bumps into the wall.

Optionally the top surface 34 may include one or more grommet holes 35 that may be used to route power cables from the top work surface to an auxiliary outlet within the storage system 10. Having the grommet holes allows the user to route a power cable to the top work surface to enable a device placed on the top work surface to receive power while the doors of the storage system 10 are secured. The grommet holes 35 may also be used to attach a cable such as an Ethernet cable to one or more of the portable computers stored in the storage system 10 while the doors are secured.

The rear of the storage system 10 (See FIG. 2) is enclosed by a removable rear panel 42. Rear panel 42 is secured to the interior frame 12 of the storage system 10 by connectors (not shown) such as bolts or screws. By attaching the rear panel 42 with connectors that are accessible from the inside of the storage system 10, the rear panel 42 cannot be easily removed when the doors 14 of the storage system 10 are secured. In an implementation, the rear panel 42 has one or more hand holds 44 to enable the rear panel 42 to be grasped when the rear panel 42 is to be detached from the storage system 10. Hand holds 44 also provide additional ventilation to the interior of the storage system 10.

Ventilation holes 46 are formed in the rear panel 42 and side panels 43 of the storage system 10 to enable heat generated in connection with charging batteries of the portable computers to be dissipated from the storage system 10. Ventilation holes 48 (see FIGS. 11 and 12) are also formed on the bottom panel of the storage system 10 to allow cool air to enter the interior of the storage system from the bottom and to allow warm air to convect upward and out of the ventilation holes 46 on the upper area of the sides/back of the storage system 10. Optionally one or more active cooling systems, such as one or more air fans, may be used to draw cool air into the storage system 10 or to expel warm air from the storage system 10.

Power Configuration Units

FIGS. 16-20 show an implementation of a storage system 10 in which the front, rear, and side panels of the storage system 10 have been removed so that the features of the interior of the storage system 10 to be seen. In one implementation, the storage system 10 has interchangeable power configuration units 50 configured to support different electrical needs of different types of portable computing devices. In one implementation, the power configuration units 50 provide AC or DC electrical power via USB or other DC power plugs, NEMA electrical outlets, and/or wire free charging pads. Power is distributed within the storage system 10 to the power configuration units by a power distribution unit 150.

Figure 17:
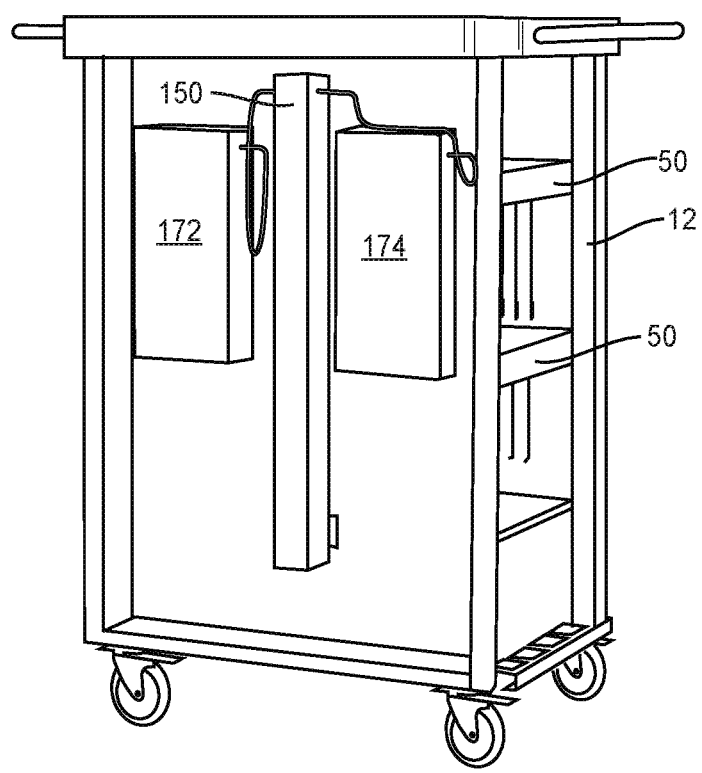
FIG. 17 is a rear perspective view of the example storage system for portable computing devices of FIG. 16.
Figure 18:
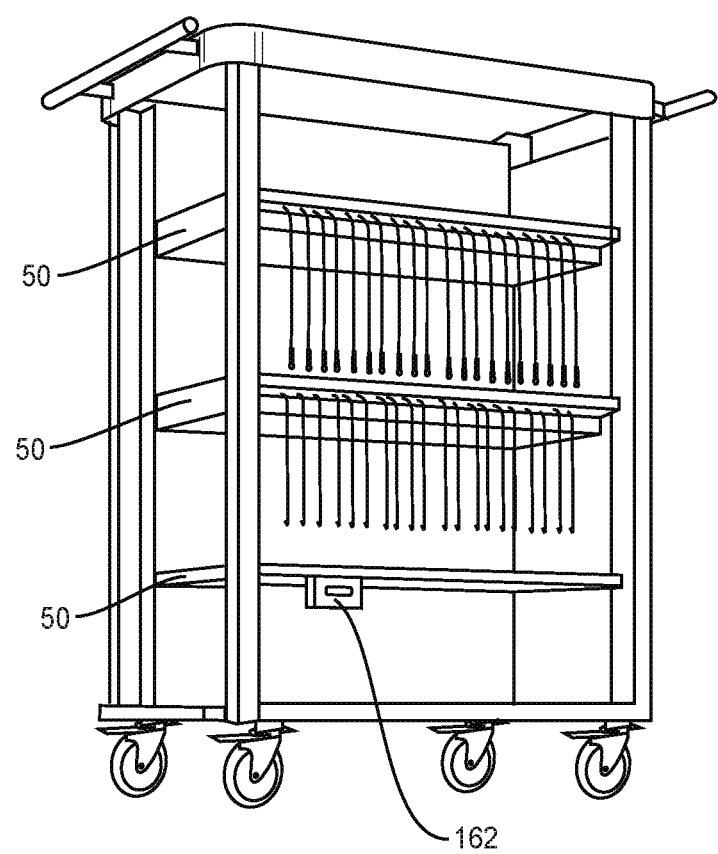
FIG. 18 is another front perspective view of the example storage system for portable computing devices of FIG. 1.

As shown in FIG. 17, the electrical components of the storage system 10 include a power distribution unit 150, which distributes power to one or more power configuration units 50. Power distribution is described in greater detail below. In the implementation shown in FIGS. 16-21, the power configuration units 50 are formed as shelves, in which the electrical components associated with the power configuration units are formed inside the associated shelf. FIGS. 41-65 show another implementation in which the power configuration units 50 are formed as a separate modules that sit on top of and are supported by shelves in the storage system 10.

Figure 19:
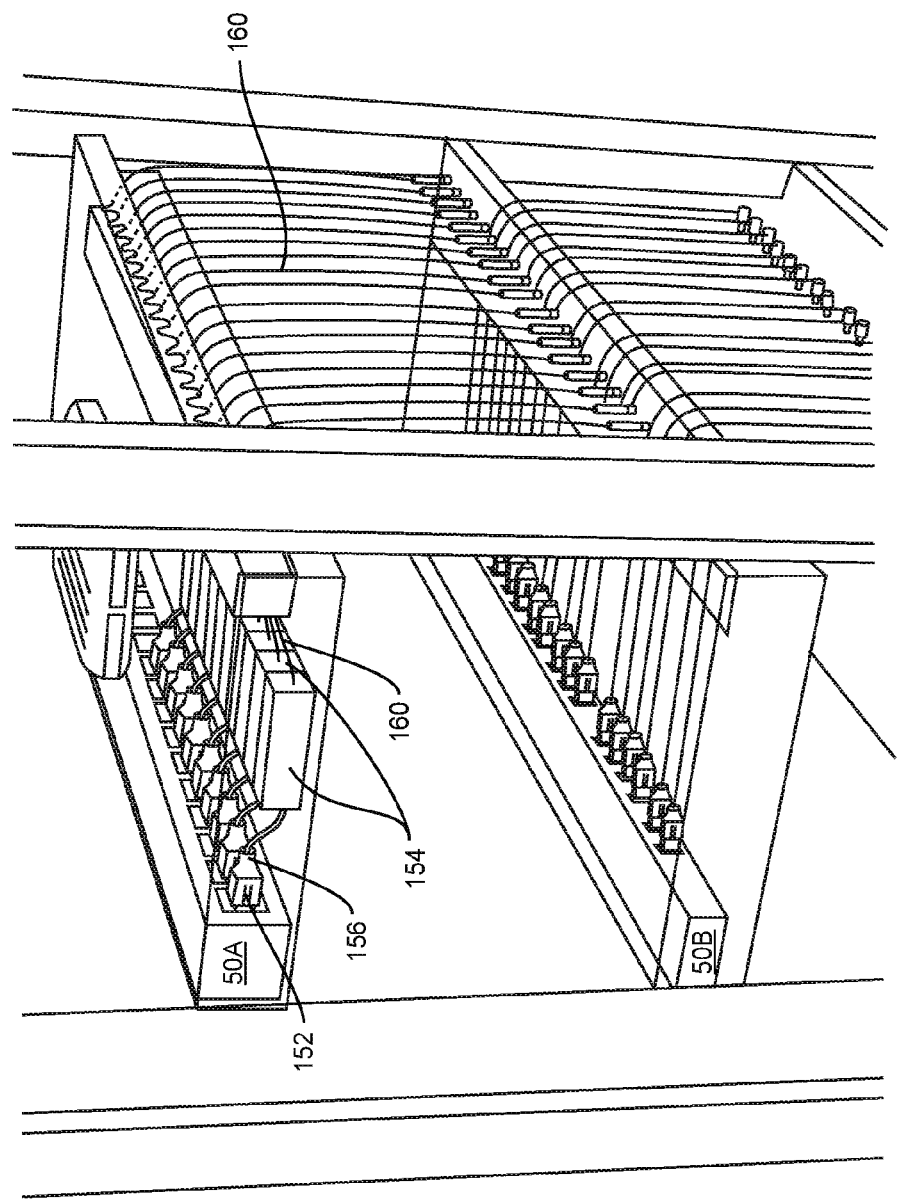
FIGS. 19-21 are perspective partial see-through views of portions of power configuration unit of the example storage system for portable computing devices of FIG. 1.
Figure 20:
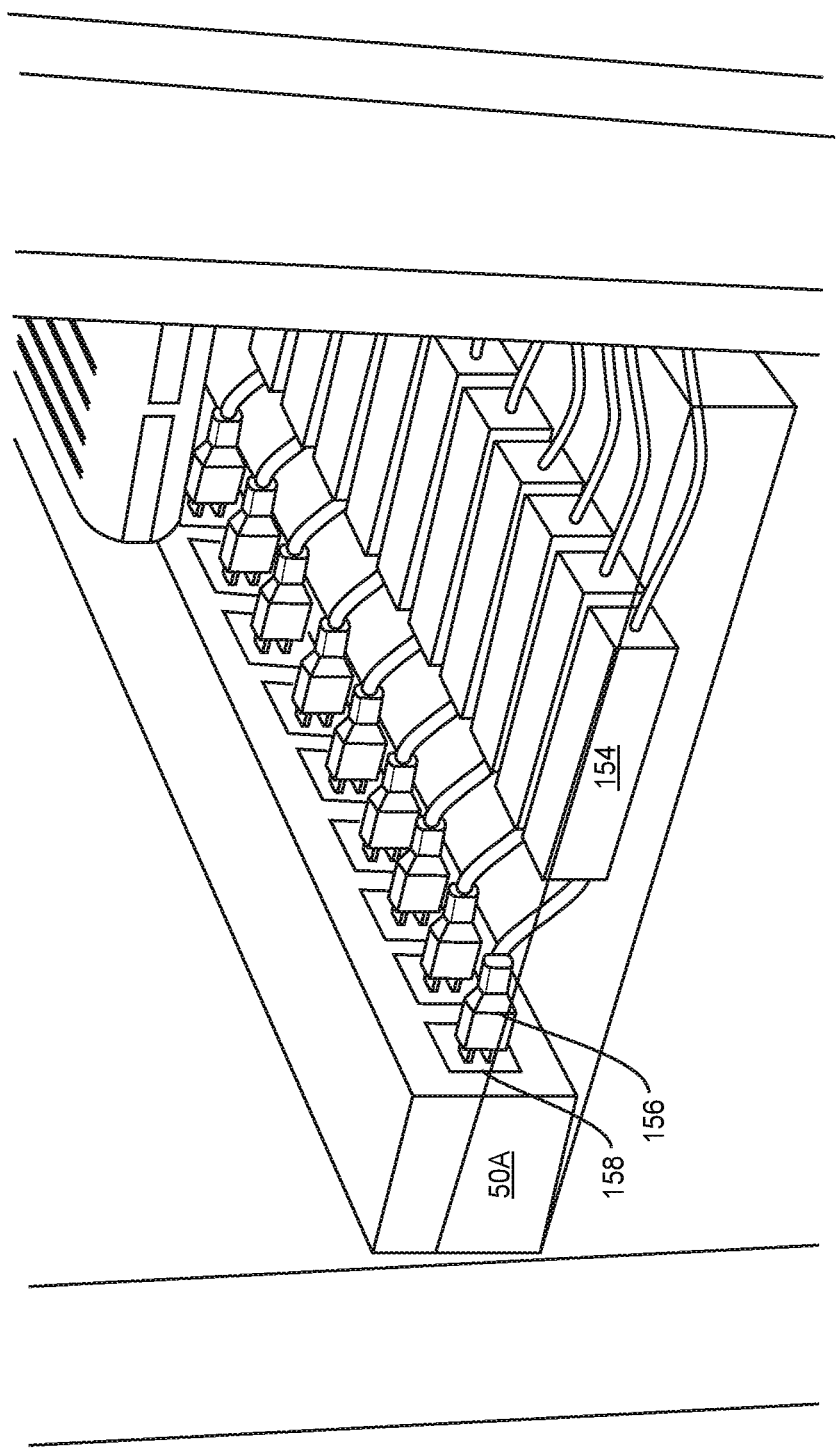

In one implementation, one or more of the power configuration units 50 may have a number of National Electrical Manufacturers Association (NEMA) electrical outlets 152 to provide AC power to laptop computers within the storage system 10. In this implementation, as shown in FIG. 19, laptop computer AC transformers 154 may have an AC cord 156 that is plugged into the AC electrical outlets 152 provided by the power configuration unit 50. A cavity 158 within the shelf 54 holds the AC transformers 154 to provide convenient storage for the AC transformers 154 within the storage system 10. DC power cords 160 extend from the AC transformers 154 out of front apertures (not shown) of the shelf 54 so that connectors on ends of the DC power cords 160 are available for connection to the laptop computers at the front edge of the shelf 54. This enables the DC power cords 160 to be available to be connected to the laptop computers when the laptop computers are placed into the storage system 10 for storage. Likewise the DC power cords 160 may be disconnected from the laptop computers and remain in the storage system 10 when the laptop computers are removed from the storage system 10 for use.

In another implementation, one or more of the power configuration units 50 is designed to provide DC power at a set of DC power outlets. In this implementation, rather than provide AC power which is converted individually using laptop computer AC transformers 154, the power configuration unit directly supplies DC power to the set of DC power outlets. Example DC power outlets may include cylindrical plugs such as barrel connectors, USB-C connectors, USB-A or USB-B connectors, proprietary connectors, or other types of DC connectors depending on the implementation.

DC power cords 160 in this implementation are connected directly to the DC power outlets of power configuration unit 50 to directly provide DC power to the set of laptop or tablet computers stored in the storage system 10 without requiring individual AC transformers 154 to be stored within the storage system 10. For example, power configuration unit 50 may be configured to provide power to a set of laptop computers by supplying DC power at between 19 and 24.5 V DC, or in an implementation, at approximately 20 VDC and at a current level of up to approximately 8.5 A. This DC power may be conditioned to mimic charging profiles recommended by battery 174 manufacturers or may be unconditioned to supply whatever power the electronic device will accept. This enables DC power to be supplied directly from the power configuration unit to the laptop computers without requiring individual AC transformers 154 to be used to convert AC power to DC power for consumption by the laptops.

In one implementation, the power system implements a mapping profile to mimic a charging profile that ordinarily would be supplied by the AC transformer 154. In this implementation, the amount of power being drawn by the laptop computer connected to a particular DC outlet is sensed, and the amount of power provided at the DC outlet is adjusted according to the charging profile for the laptop computer connected to the DC outlet. This enables the power configuration unit to provide charging power to the laptop computer by mimicking the charging profile normally generated by the laptop computer's AC transformer. In addition to not requiring the AC transformers to be stored in the storage system 10, this enables the AC transformers to be used for other purposes, for example to be sent home with students, so that the students have a source of power at home when the laptop computers are brought home by the students for use outside of school.

Many tablet and laptop computers are designed to receive power at a voltage level specified in one of the USB standards, i.e. 5V DC and up to 0.9 A. Apple iPad devices, for example, are configured to receive 5 VDC power at up to 2.4 A. USB 3 and subsequent versions of the USB protocol may specify other voltage/amperage charging profiles. According to an implementation, one or more of the power configuration units 50 is configured to include a set of USB ports designed to provide power at 5 VDC. In this implementation, the USB cables connect to the USB ports and extend through apertures at the front of the shelf.

As described above, power configuration units 50 may be designed to provide 120/250V AC power, DC power at 20 VDC, DC power at 5 VDC, or may be configured to provide power at other voltage and amperage levels. Different power configuration units 50 are optimized for providing power to different types of laptop and tablet computers, so the type of power configuration units provided in a given storage system 10 will depend on the type of laptop computers and tablet computers to be stored in the storage system 10 and their respective requirements. Since the power configuration units are modular, different power configuration units may be included in the same storage system 10. For example, a storage system 10 may have one or more power configuration units 50 designed to provide AC power and one or more power configuration units 50 designed to provide DC power. This allows multiple types of laptop computers and tablet computers to be stored within the same storage system 10 and to be charged while stored within the storage system 10.

For example, as shown in FIG. 19, the storage system 10 has a first power configuration unit 50A (top power configuration unit) which is configured to include a plurality of NEMA electrical AC outlets 152 to supply 120 VAC power. The storage system 10 of FIG. 19 also has a second power configuration unit 50B (bottom power configuration unit) which is configured to include a plurality of USB ports to supply 5 VDC power.

Because the power configuration units are modular, it becomes easy to repurpose a storage system 10 to accommodate different types of portable computing devices. Specifically, to configure a storage system 10 to accommodate laptop computers, power configuration units with NEMA electrical AC outlets 152 may be installed into the storages system 10. If that storage system is then to be reconfigured to store tablet computers, one or all of the AC power configuration units may be removed and replaced with a DC power configuration unit containing DC outlets to supply power to the tablet computers. A mix of AC and DC power configuration units may be included in a given storage system 10 to enable both types of laptop and tablet computers to be stored in a given storage system.

A given storage system may have any desired number of power configuration units. For example, a desktop storage system may have a single power configuration unit or two or more power configuration units. A cart storage system may have a single power configuration unit, two power configuration units, three power configuration units, or more than three power configuration units depending on the size of the cart storage system. Other types of storage systems, such as a wall mounted storage system, may have larger numbers of power configuration units. Since the power configuration units are modular, a given storage system may have any desired combination of power configuration units providing different types of power. The following table shows example combinations of power configuration units that may be included in a storage system with the capacity of including three power configuration units, when the set of available power configuration units are configured to individually provide 5V DC, 20V DC, and 110V AC power:

hold tablet computers requiring power at 5V DC, the power configuration unit may include a transformer to transform 110V AC to 5V DC to be supplied at a set of USB ports. Likewise, if the power configuration unit is to hold laptop computers requiring power at 20V DC, the power configuration unit may include a transformer to transform 110V AC to 20V DC power to be supplied to the laptops at a set of DC power ports. If the power configuration unit is to supply 110V AC power, the power configuration unit does not need to include a power transformer.

In implementations where the power configuration unit may potentially supply a greater amount of power than is available at a standard wall outlet, i.e. if the power configuration unit is to supply 110V AC power to more than 8 or 9 laptop computers, then the power configuration unit further includes a power distributor to selectively allocate power to the power outlets associated with the power configuration unit to adjust which sets of portable computing devices

|  | Number of 5 V DC power configuration units | Number of 20 V DC power configuration units | Number of 110 V AC power configuration units |
| --- | --- | --- | --- |
| Storage system configuration option #1 | 3 | 0 | 0 |
| Storage system configuration option #2 | 0 | 3 | 0 |
| Storage system configuration option #3 | 0 | 0 | 3 |
| Storage system configuration option #4 | 2 | 1 | 0 |
| Storage system configuration option #5 | 2 | 0 | 1 |
| Storage system configuration option #6 | 1 | 2 | 0 |
| Storage system configuration option #7 | 0 | 2 | 1 |
| Storage system configuration option #8 | 1 | 0 | 2 |
| Storage system configuration option #9 | 0 | 1 | 2 |
| Storage system configuration option #10 | 1 | 1 | 1 |

Power Distribution Unit

Figure 54:
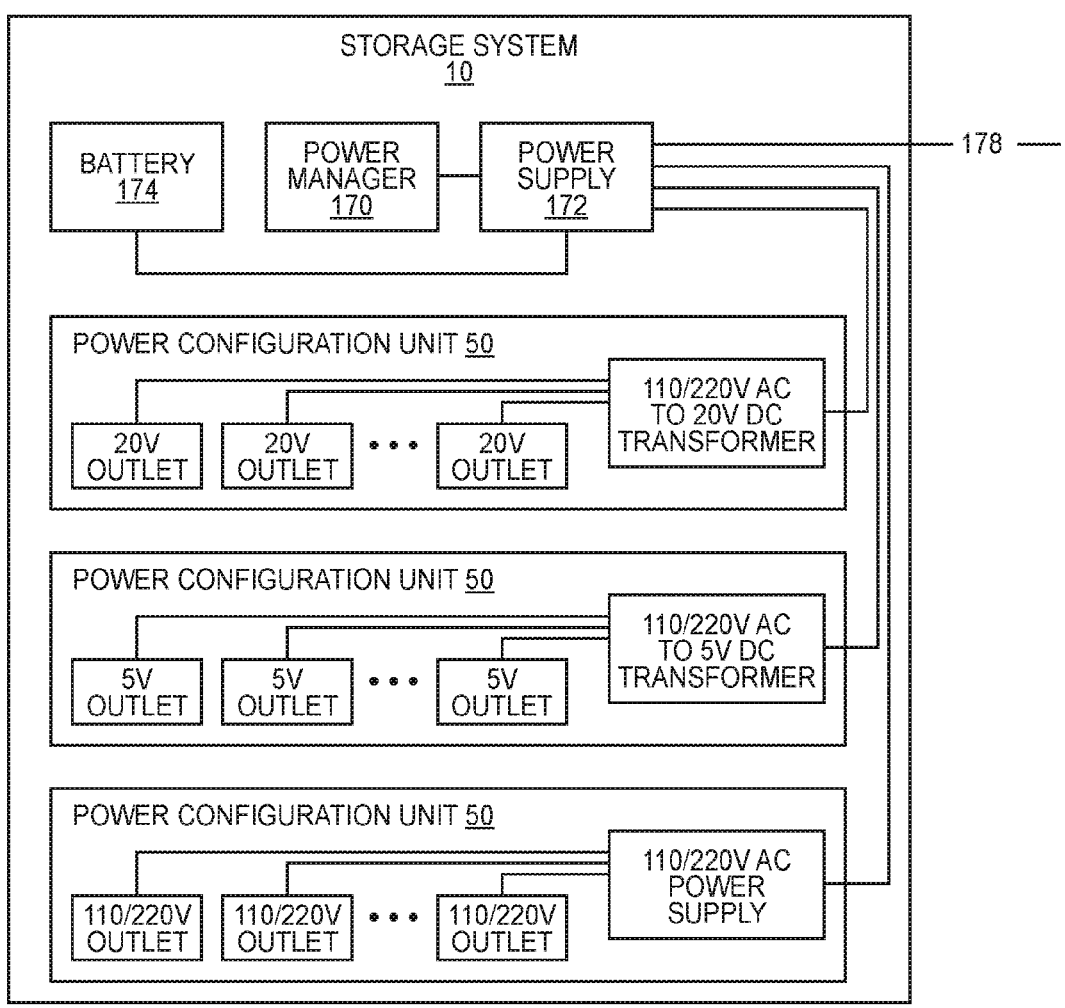
FIG. 54 is a functional block diagram of an example storage system in which the power configuration units perform power transformation.

In one implementation, as shown in FIG. 54, power is received at the storage system 10 from an external source, such as a wall outlet on power cord 178, and distributed within the storage system to a set of internal outlets. In this implementation, each power configuration unit has a power cord with a standard AC plug (see e.g. FIG. 26) that allows the power configuration unit to plug into one of the internal outlets. For example, where the storage system is designed to connect to an external source of 110V AC electrical power, the power received at the storage system is distributed to the set of outlets within the storage system at 110V AC.

Each power configuration unit, in this implementation, has a self-contained local transformer to convert the power received from the internal outlet to the format required by the portable computing devices to be stored in the storage system. For example, if the power configuration unit is to receive charging power over time to manage the distribution of power within the storage system.

Figure 22:
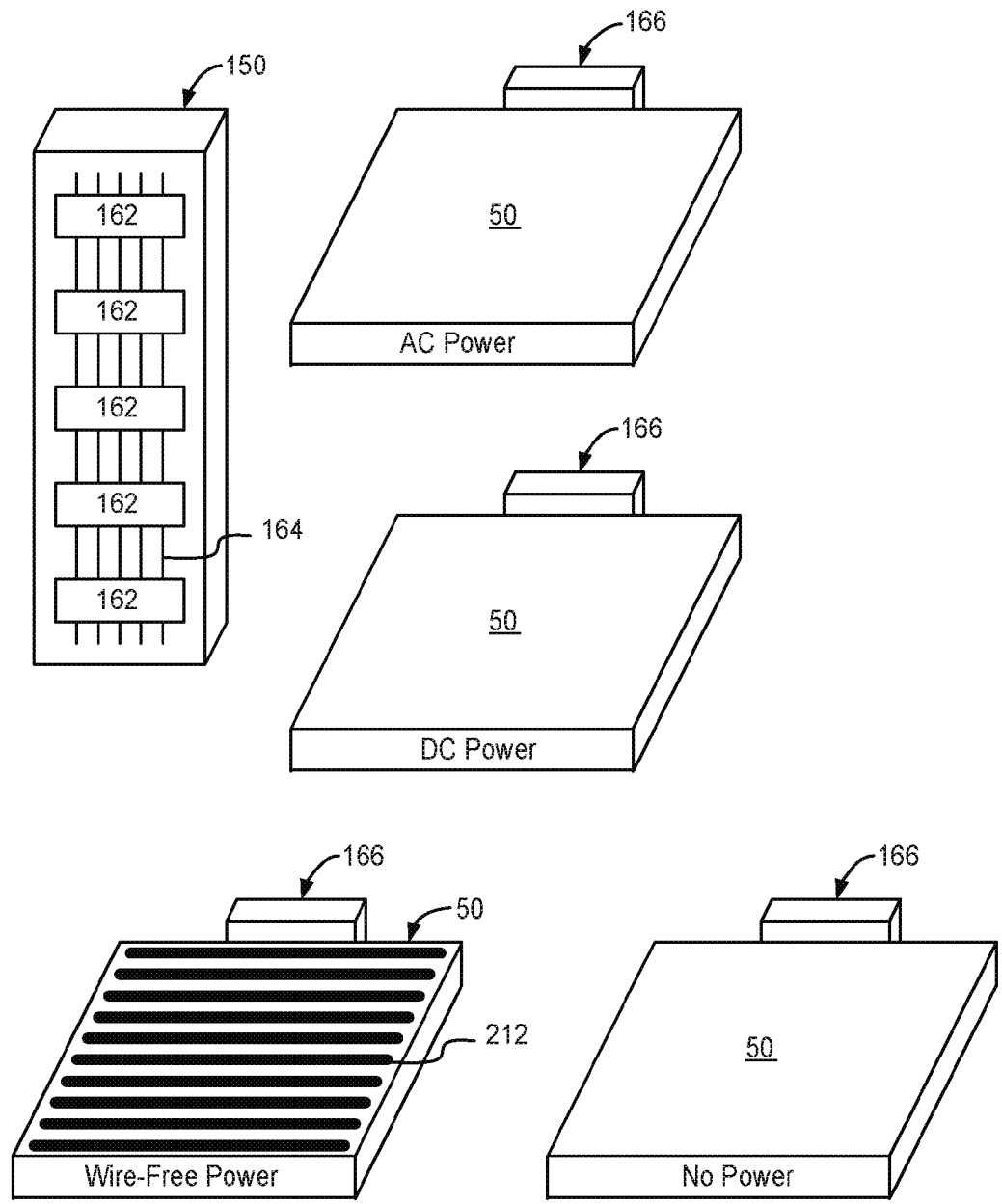
FIG. 22 is a perspective view of several components of the example storage system for portable computing devices of FIG. 1.

In another implementation, the power configuration units 50 electrically connect to a power distribution unit 150. For example, as shown in FIG. 22, the power distribution unit 150 may include a plurality of ports 162 spaced along a power bus 164. Ports 162 may be spaced to coincide with locations where shelves 54 are able to be located in storage system 10. Optionally, the ports 162 may be movable along power bus 164 to interconnect with power bus 164 at a set of fixed locations or to interconnect with power bus 164 at any desired location along its length. Matching connectors 166 on the power configuration units 50 interconnect with the ports 162 on power bus 164 to receive power from power distribution unit 150.

As shown in FIG. 22, in an implementation, the power bus 166 includes multiple contacts 168, sets of which carry different voltages within the storage system 10. For example, in an implementation designed to provide AC power, DC 20V power, and DC 5V power, three of the contacts 168 may provide AC power (hot, neutral, and ground), two of the contacts 168 may provide DC 20V power (hot and ground), and two of the contacts 168 may provide DC 5V power (hot and ground). Optionally, the DC 20V and DC 5V may share a ground contact 168. The power bus 164 may be implemented using solid connectors designed to be connected to the outlet ports 162 along their length. In another implementation, the power bus 164 may be implemented using multiple ribbon cables that allow the outlet ports 162 to be repositionable within the storage system 10. In another embodiment, separate wires are used to connect 5V DC, 20V DC, and 120V AC to the power configuration units 50 in the storage system 10.

Ports 162, in an implementation, interconnect with each of the contacts 168 of power bus 164 to provide access to all three power levels. Matching connectors 166 on the power configuration units 50, in this implementation, are provided with differently configured male contacts to selectively only receive power having at the required power level. For example, in an implementation where each of the ports 162 contain female connectors in electrical communication with AC power, DC 20V power, and DC 5V power, a power configuration unit 50 that is designed to provide AC power has a matching connector 166 with three male contacts designed to connect with the female connectors of port 162 that are in electrical communication with the AC contacts 168 of power bus 164. Similarly, a power configuration unit that is designed to provide DC 20V power has a matching connector 166 with two male contacts designed to connect with the female connectors of port 162 that are in electrical communication with the DC 20V contacts of power bus 164. Likewise, a power configuration unit that is designed to provide DC 5V power has a matching connector 166 with two male contacts designed to connect with the female connectors of port 162 that are in electrical communication with the DC 5V contacts of power bus 164. By providing access to all types of power via port 162, and selectively electrically obtaining only the type of power required by the electrical distribution unit, it becomes possible to connect any electrical distribution unit to any port within storage system 10.

Power configuration units 50 are connected to the power distribution unit 150 in connection with installation of the power configuration unit within the storage system 10. For example, as shown in FIG. 1, the power configuration units 50 in one implementation may be configured to be part of shelves 54 within storage system 10. In this implementation, the AC transformers, AC cords, and DC cords may be inserted into shelf 54 and then inserted into the storage system 10 as a unit. In this implementation, ports 162 of power distribution unit 150 are accessible at locations in the storage system to receive the matching connectors 166 of the power configuration units 150 so that the power configuration unit 150 can be plugged into the storage system to receive power from the power distribution unit 150 while contained within the storage system.

Thus, matching connector 166 of the power configuration unit 50 will connect with one of the ports 162 of the power distribution unit 150 when the shelf 54 is inserted into the storage system 10. By simply switching power configuration units 50 into and out of the storage system 10, it is possible to enable different charging systems to be made available within the storage system 10 without requiring the power distribution unit 150 or other electrical systems within the storage system 10 to be adjusted to accommodate the fact that a different type of laptop/tablet computer will be stored within the storage system 10. Likewise by including multiple different types of power configuration units 50 within a given storage system 10, it is possible for a single storage system 10 to be used to store/maintain multiple types of laptop/tablet computers.

Although the power configuration units 50 are shown as being coextensive with a given shelf, in another implementation a single shelf may support two or more power configuration units 50. In this implementation, for example, a first half of a shelf may be provided with power of a first type from a first power configuration unit 50 and a second half of the shelf may be provided with power of a second type from a second power configuration unit 50. This may further provide flexibility as to the type of and number of different laptop/tablet computers that may be stored within a given storage system 10. In another implementation the power configuration unit is separate from the shelf as discussed in greater detail below.

In an implementation, multiple types of computers designed to receive power at a particular power level may be collectively stored within the storage system. For example, tablet computers from Apple™ are configured to receive power via either a 30 pin connector, a Lightening connector, or a Thunderbolt connector. Tablet computers from Microsoft, e.g. Microsoft Surface™ have a different type of magnetic power connector. However, both types of connectors are able to plug into a USB port to receive power formatted according to one of the USB standards. By connecting the DC cords specific to the type of tablet computer that will be stored in each storage bay, it is possible for multiple types of tablet computers to be connected to a given power configuration unit 50 and stored within the storage system 10.

Likewise, different laptop computers tend to have different AC transformers. Where a mixture of laptop computers are to be stored within the storage system 10, the specific AC transformer 154 for each computer may be connected to a NEMA electrical AC outlet 152 of a power configuration unit 50 and stored within the associated shelf 54. The DC cord 160 from the AC transformer 154 may then extend into a bay assigned to that particular computer. By associating specific AC transformers with specific bays, it is possible for a mixture of laptop computers to be stored within the storage system 10 and receive power while stored within the storage system 10. Providing flexibility to use laptop specific AC transformers and device specific DC cords allows the storage system 10 to be used, for example, in a situation where students or other users are allowed to bring their own device and enable the device to be stored/charged when not otherwise being used.

Power Architecture

Figure 23:
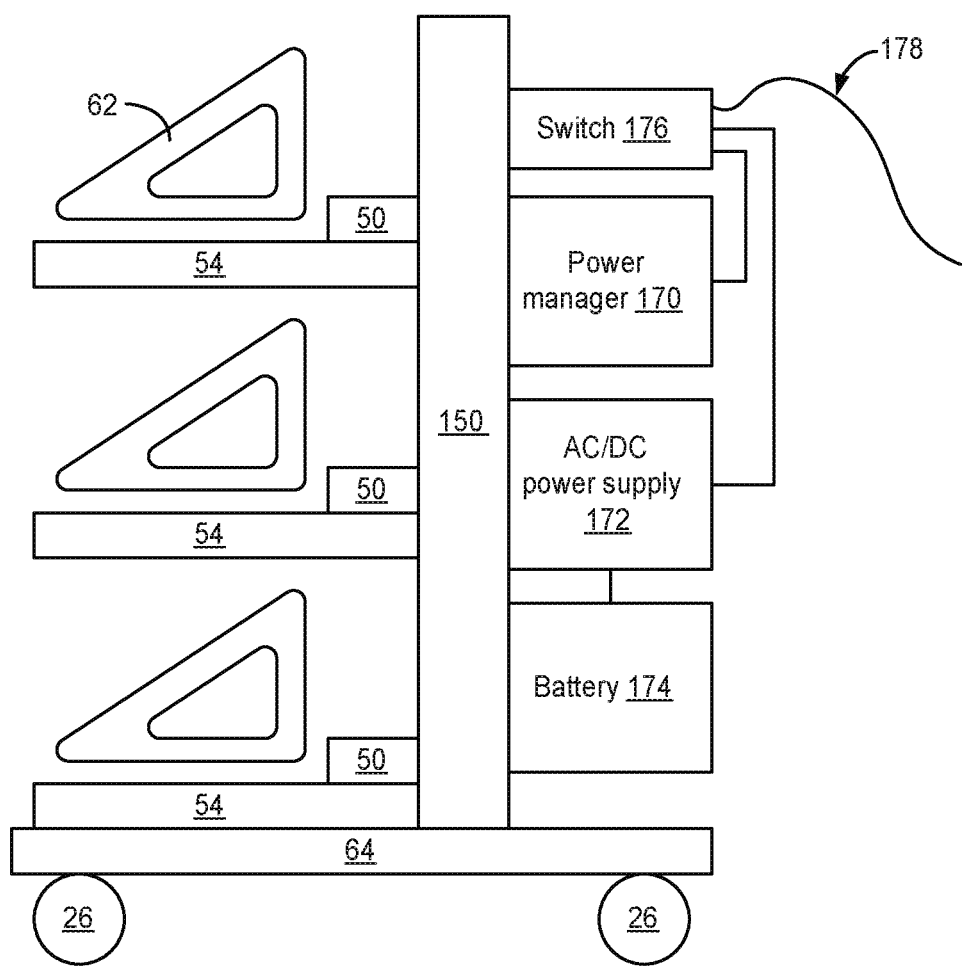
FIGS. 23-25 are functional block diagrams of example storage systems for portable computing devices.
Figure 24:
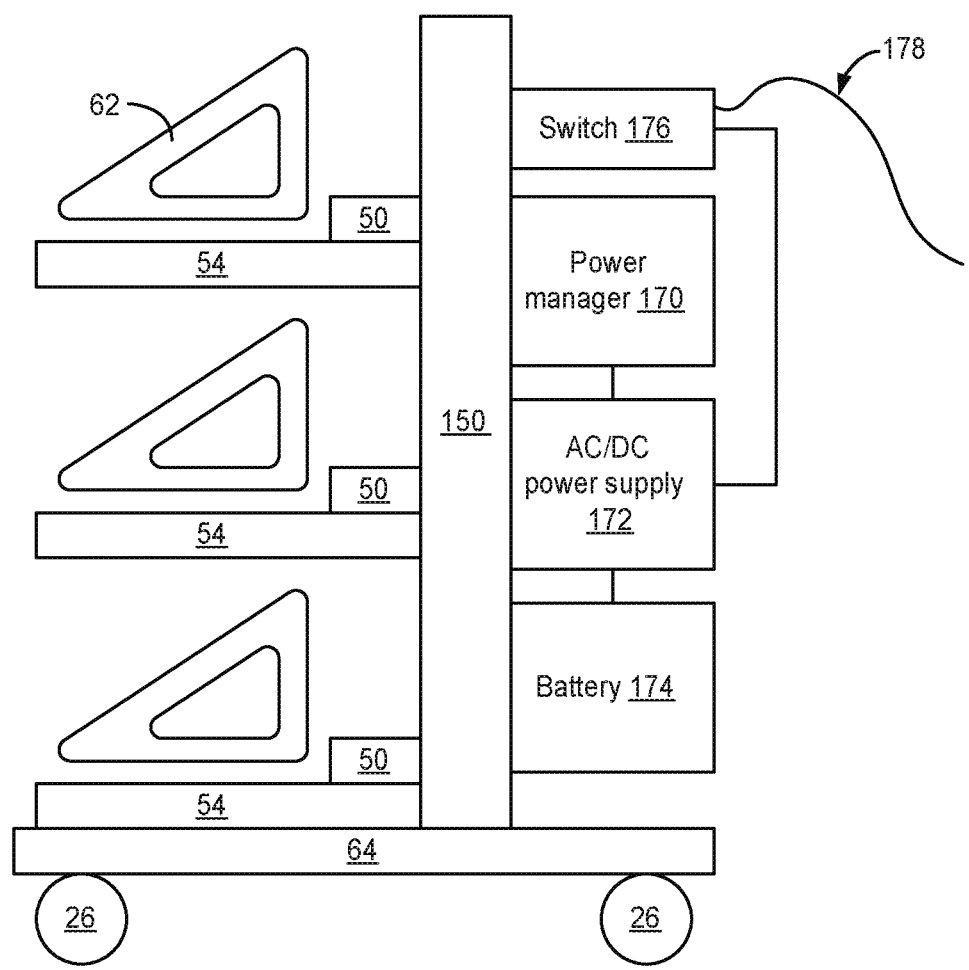
Figure 25:
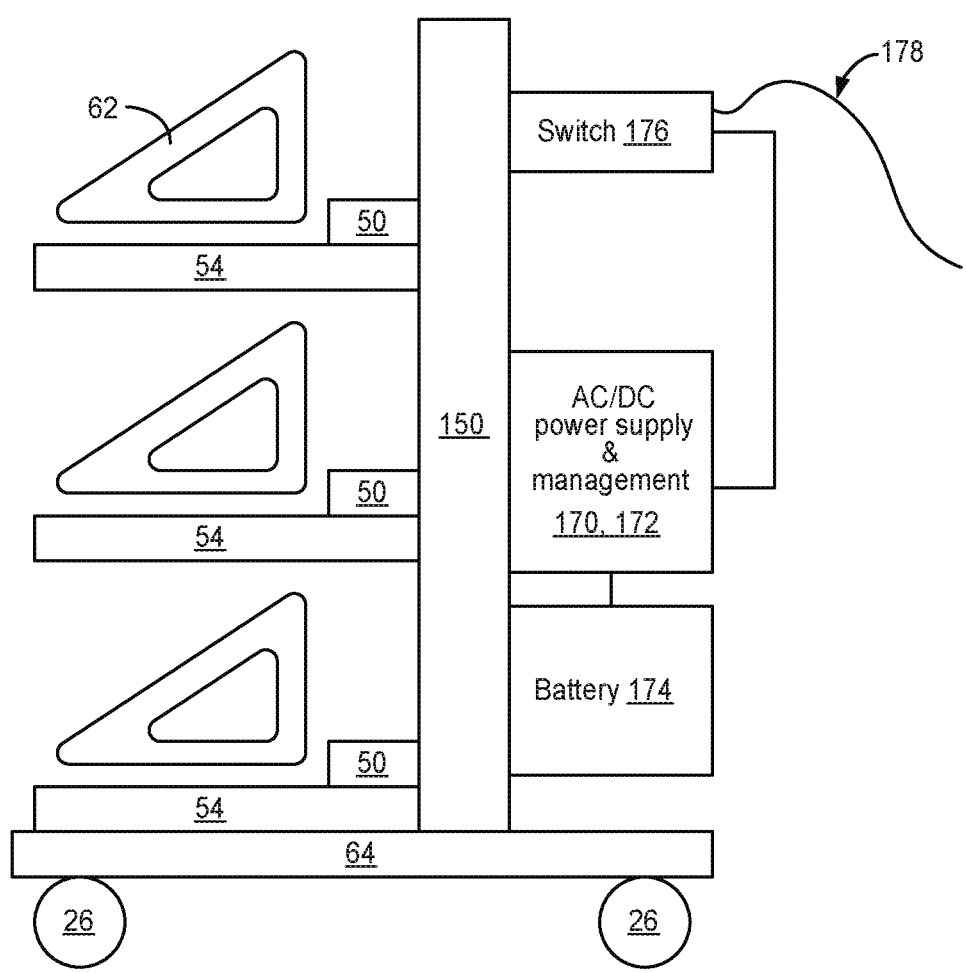

FIGS. 23-25 show several implementations of electrical components of an example storage system 10. As shown in FIG. 23, the storage system 10 includes a power manager 170, an AC/DC power supply 172, and a battery 174. Power to the storage system 10 is controlled via on/off switch 176.

Power, for example from a standard wall outlet, is received on power cord 178 and passed via switch 176 to AC/DC power supply 172. AC/DC power supply 172 provides AC current to power distribution unit 150 so that AC power may be supplied to power configuration units 50 designed to provide AC power on NEMA electrical AC outlets 152. AC/DC power supply 172 also converts a portion of the received AC power to DC power which is output to power distribution unit 150 so that DC power may be supplied to power configuration units 50 designed to provide DC power. As noted above, DC power may be supplied at a selected DC voltage, such as one of the 5 V DC power levels specified by one of the USB standards, or at a higher DC voltage level (e.g. 20 V DC) required by laptop computers.

In one implementation DC power is provided by AC/DC power supply 172 to the power distribution unit 150 at multiple DC power levels. In another implementation DC power is provided by AC/DC power supply 172 to the power distribution unit 150 at one of the selected DC power levels (e.g. at either 5 V DC or 20 V DC) and the power configuration units 50 convert the DC power to the correct voltage if necessary. For example, if the power distribution unit 150 is provided with 5V DC, a power configuration unit 50 that needs to supply 20V DC may up-convert the voltage from 5V to 20V DC. Similarly, if the power distribution unit 150 supplies 20V DC to the power configuration unit 50, the power configuration unit 50 may down-convert the provided power to the lower 5 V DC USB specified power level.

Power Management

In one implementation, the storage system 10 is powered from a 15 or 20 amp rated 90-130 VAC circuit or a 10 amp rated 208-264 VAC circuit. The maximum steady state current draw may be limited to 80% of the rated current: 12 amps for a 15 amp circuit, 16 amps for a 20 amp circuit, or 8 amps for a 10 amp circuit. In an implementation, the storage system senses the voltage on power cord 178 and automatically adjusts the AC/DC power supply 172 depending on the input voltage.

Power manager 170 performs power management within the storage system 10 and is responsible for power distribution between shelves. Many wall outlets in North America supply electricity at 120V AC and up to 15 Amps of current. This means, for practical purposes, that the amount of power available at the wall outlet is about 1800 Watts. To prevent the storage system 10 from overloading the external wall circuit, power usage within the storage system 10 may be limited to around 80% of the available wall power, e.g. to 1440 Watts. If a laptop computer requires 20V DC at about 8 Amps, a standard laptop computer with a fully discharged battery will initially consume approximately 160 Watts of power. As charging progresses, the laptop will consume less power. However, this implies that at most between 8-10 laptops may be charged at a given time when the laptops are fully discharged. Accordingly, depending on the type of power configuration units 50 installed in the storage system 10, it may be necessary to distribute power within the storage system 10 by selectively turning on/off power to the power configuration units 50.

In one implementation the power manager 170 distributes power between power configuration units 50 using a time multiplexing function to selectively turn on and off power between power configuration units 50 according to the amount of power consumed by the laptops connected to the power configuration units 50. In this implementation, the power manager 170 senses the amount of current being drawn by a particular power configuration unit 50 and, if additional power is available, will selectively energize additional power configuration units 50 until the maximum amount of power available is provided to the laptop/tablet computers stored in the storage system 10. In one implementation the power manager 170 includes an energy monitoring integrated circuit to detect the amount of power being drawn by each of the power configuration units 50 and selects groups of computers to receive power to optimize charging within the storage system 10.

Bridge Shelves

Figure 10:
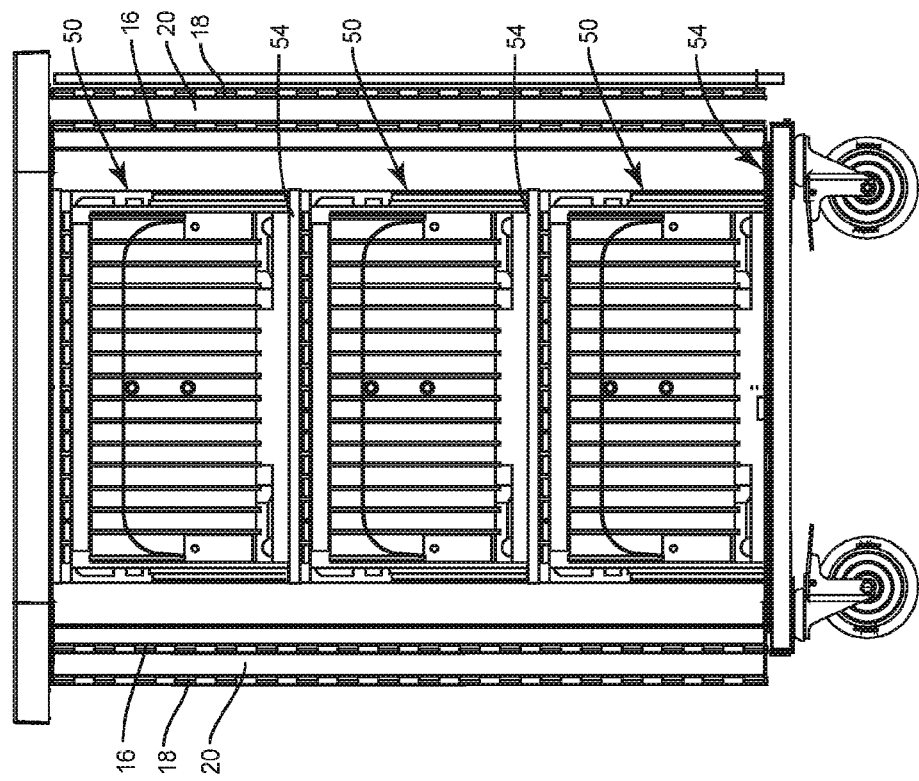
FIG. 10 is a front view of the example portable computer storage system of FIG. 1 with the front doors open and folded along the sides of the storage system.
Figure 11:
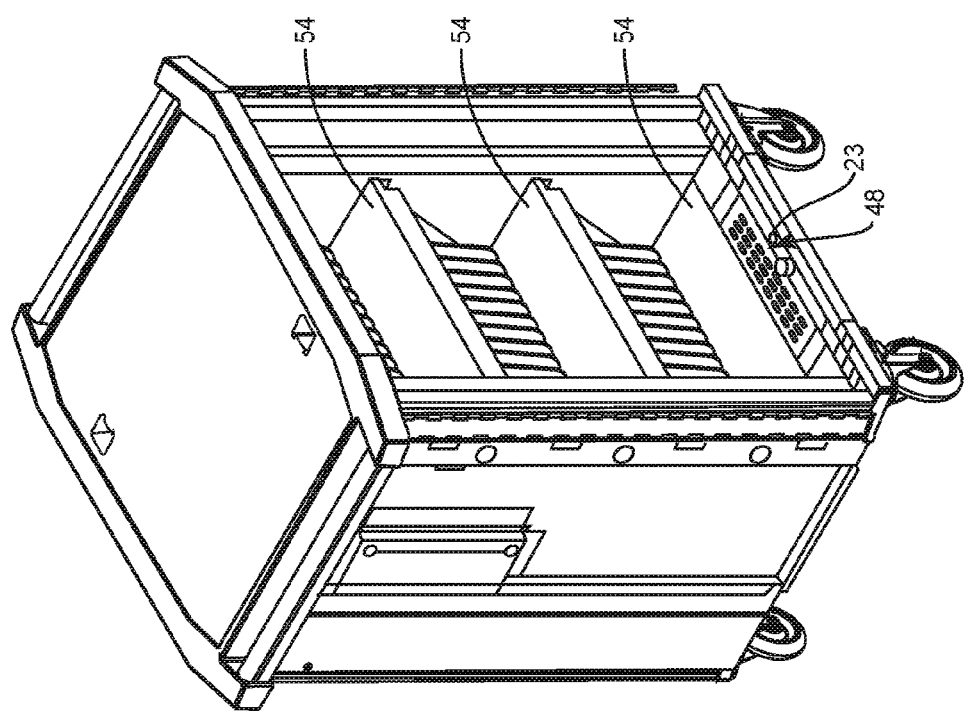
FIGS. 11 and 12 are front perspective views of the example portable computer storage system of FIG. 1 with the front doors open and folded along the sides of the storage system.
Figure 15:
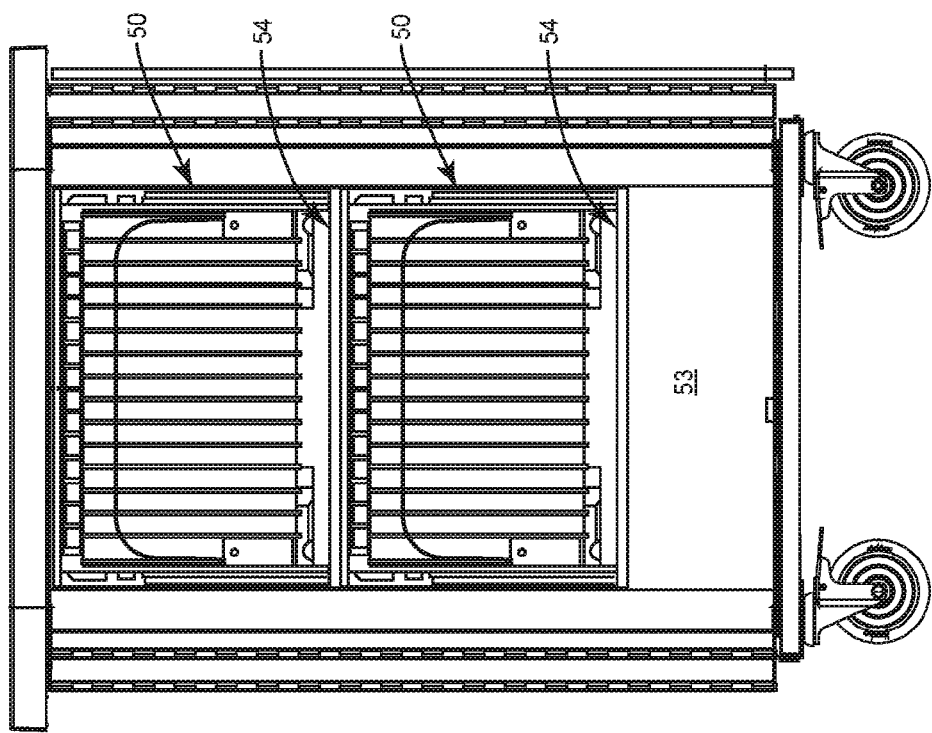
FIG. 15 is a front view of the example portable computer storage system of FIG. 1 having two shelves instead of three, with the front doors open and folded along the sides of the storage system.
Figure 16:
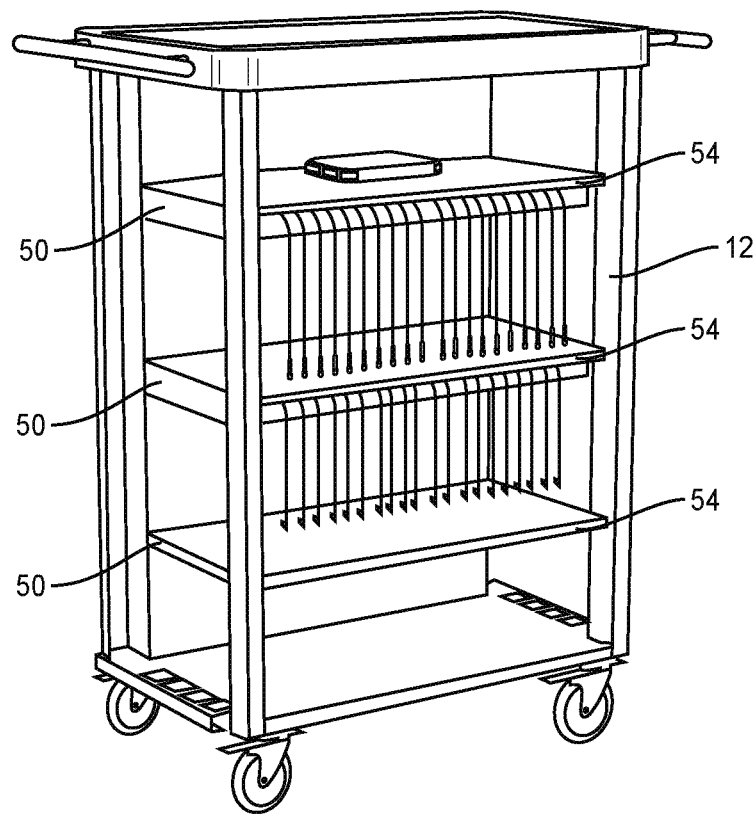
FIG. 16 is a front perspective view of an example storage system for portable computing devices, with front and side external panels removed to show the interior, according to an implementation.

FIGS. 10 and 15 show front views of an example storage system 10 with the doors open. In the implementation shown in FIG. 10, the storage system 10 has three shelves and three power configuration units 50 formed as modular units that rest on top of the metal shelves connected to the frame 12 of the storage system 10. In the implementation shown in FIG. 15, the storage system 10 has two shelves 54 connected to the frame 12 of the storage system 10 and two power configuration units 50 formed as modular units that rest on top of the shelves 54. The power configuration units 50, in this implementation, are designed to be supported by the shelves 54 within the storage system. The computers rest on the shelf 54, which supports the weight of both the computers and the power configuration unit 50 as described in greater detail below.

In an implementation shown in FIGS. 26-51, each power configuration unit 50 has a bridge 52 that spans above a base 64. The base 64, in this implementation, sits on shelf 54 which is connected to the framing of the interior of the storage system 10. The height of the bridge 52 is vertically adjustable relative to the base 64 to enable the power configuration unit 50 to accommodate laptop computers of different sizes. When the bridges 52 are all in a lower vertical position, as in FIG. 10, the storage system 10 can accommodate three shelves 54 and associated power configuration units 50. When the bridges 52 are all in a raised vertical position, as in FIG. 15, the storage system 10 can accommodate two shelves 54 and associated power configuration units 50. Different sized storage system 10s may be able to accommodate different numbers of shelves 54 and power configuration units 50. Where the storage system 10 is provided with two shelves 54 and associated power configuration units 50, in one implementation the storage system 10 has some additional storage space below the bottom shelf 53 (see FIG. 15). This storage space 53 may be used as storage for supplies or, optionally, may be used to store other electronic devices such as a 3-D printer, laser printer, wireless router, or other electronic device. Optionally an electrical accessory outlet may be placed within the storage space 53 to provide power to electrical devices stored therein. Although an implementation was shown in FIG. 15 in which the storage space is below the bottom shelf at the bottom of the storage system 10, in another implementation the storage space 53 is located elsewhere within the storage system, for example directly below the top surface 34.

Figure 21:
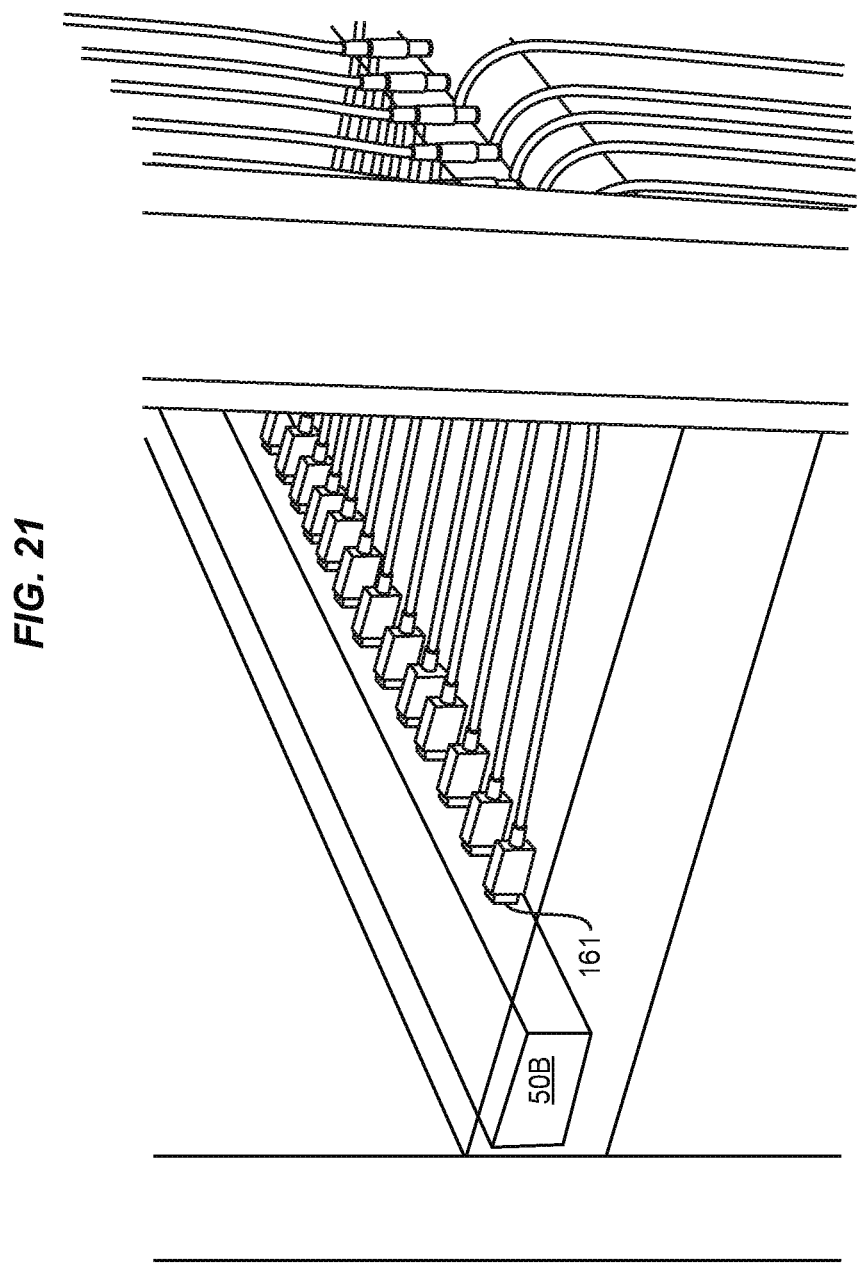

FIGS. 26-44 show an implementation of a power configuration unit 50. The power configuration unit 50 includes a bridge 52 supported by base 64. As shown in FIG. 21, bridge 52 has a top plate 56 and two side plates 58. One side plate is located on each edge of the top plate 56. A back plate 60 (see e.g. FIG. 42) spans between the side plates 28 along a rear of the top plate 56. The top plate 56, side plates 58, and back plate 60 are joined along their edges to form a rigid structure. In one implementation the top plate 56, side plates 58, and back plate 60 are molded of plastic material and joined using adhesive, mechanical fasteners, or ultrasonic welding. Other manners of joining these components may be used as well.

The top plate 56 supports dividers 62 which are suspended to hang down from the bridge 52. As shown in FIG. 22, the power configuration unit 50 does not have a bottom plate, but rather sits on top of the shelf 54. Shelf 54 is a separate component, in this implementation, that is connected (e.g. using mechanical fasteners such as screws or bolts) to the interior frame 12 of the storage system 10. The shelves 54 are movable to a plurality of positions within the storage system 10 to enable the storage system 10 to accommodate different numbers of shelves 54 as discussed above in connection with FIGS. 10 and 15.

In one implementation, the bridge 52 is configured to be too large to fit through the door opening at the front of the storage system 10 and is instead only able to be inserted into the storage system 10 and taken out of the storage system 10 from the rear of the storage system 10. In this implementation the power configuration unit 50 is designed to be too large to take out through the front doors to prevent a person from pulling the power configuration unit 50 out of the storage system 10. In this implementation, where the bridge is to be removed from the storage system 10, i.e. to be repositioned within the storage system 10 or reconfigured, the rear panel 42 of the storage system 10 is removed. Once the rear panel 42 is removed, the bridge 52 may be accessed from the rear of the cart and may be taken out of the cart if desired.

When computers are stored in the storage system 10, each computer is placed into a bay defined by a pair of adjacent dividers 62 hanging down from bridge 52. The outside bays in the power configuration unit are defined by one of the side plates 58 and an adjacent divider 62. The computers thus are supported by the shelf 54 and lean against one of the dividers 62 when stored in the bays. Optionally a non-slip padded surface may be added to the shelf 54 to help stabilize the computers while stored within the storage system 10.

By forming the dividers to hang down from above, i.e. to depend from the top plate 56 of the bridge 52, the dividers 62 support the top edge of the computers when the computers are stored in the storage system. With storage system 10s that have dividers that stand up from below, i.e. the dividers are attached to the shelf supporting the weight of the computers, it has been found that the top edges of the computers tend to lean against each other so that they rub along their upper edges. By forming the dividers to hang down and thus to provide separation along the upper edges of the computers, the computers are less likely to rub against each other hence preventing scuffing of the surface of the computers to extend the life of the computers or at least to help protect the aesthetic appearance of the computers.

Using dividers 62 that hang down from above also facilitates cleaning of the storage system 10. Specifically, over time dust may accumulate in the storage system 10, e.g. on the shelf 54 on which the power configuration units 52 are supported. When dividers are formed to rise up from below, dust tends to collect between the dividers 62 in the individual bays. Removal of the dust from the storage system 10 thus requires each bay to be individually cleaned. By forming bays using dividers 62 that hang down from above, removal of dust may be more straightforward by enabling all bays to be cleaned at once by simply removing dust from the shelf 54 in a single operation.

Portable computers come in different sizes. Some portable computers are over an inch (2.5 cm) thick, while other computers are significantly thinner, e.g. on the order of a half inch thick (1.25 cm). Likewise, different computers have different screen sizes and hence have different outside dimensions. To accommodate these differences, the power configuration unit 50 is adjustable to enable the bays to accommodate computers of different thicknesses and different outer dimensions.

Figure 31:
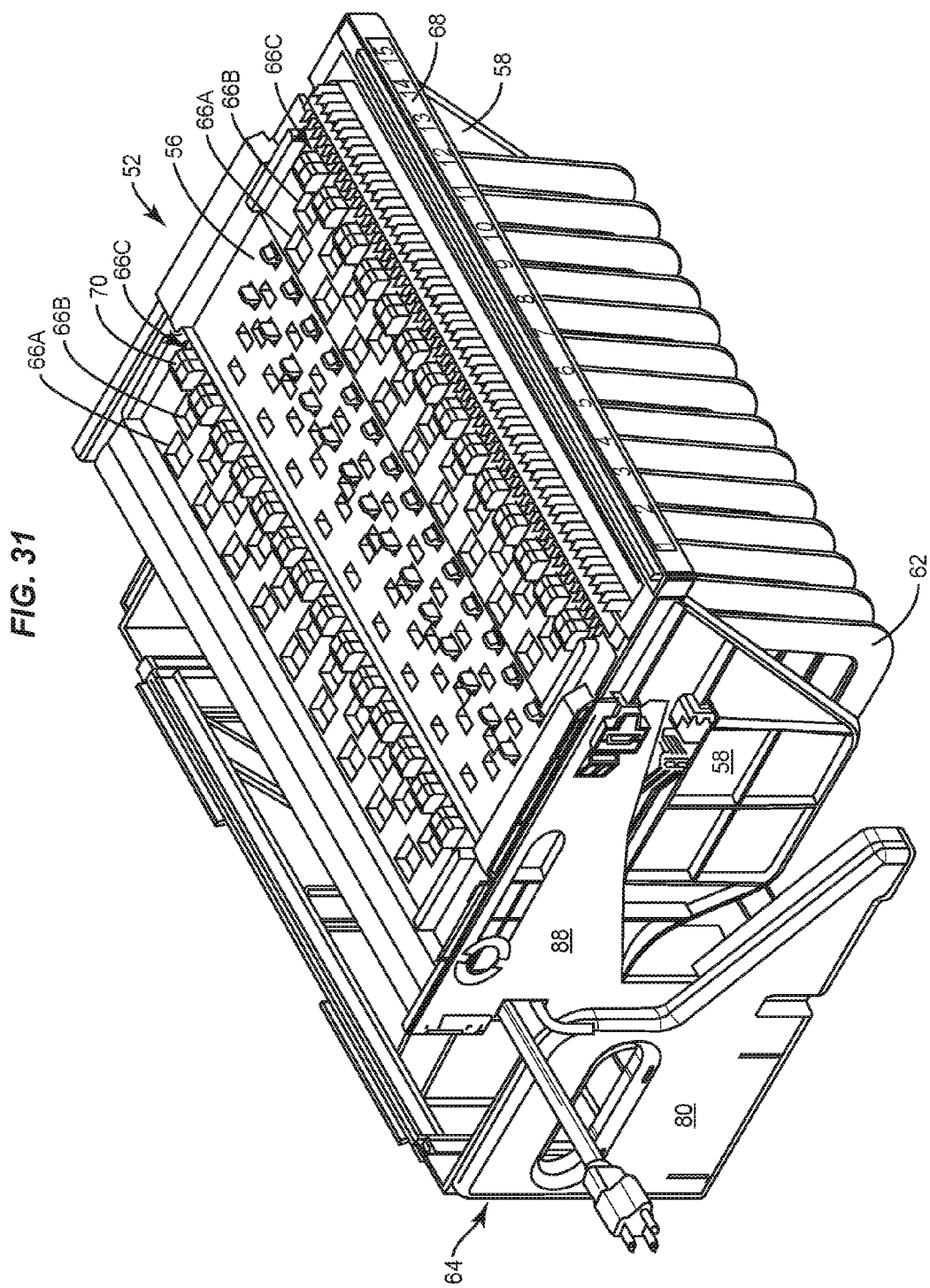
FIGS. 31 and 32 are front perspective views of the example power configuration unit of FIG. 26.
Figure 32:
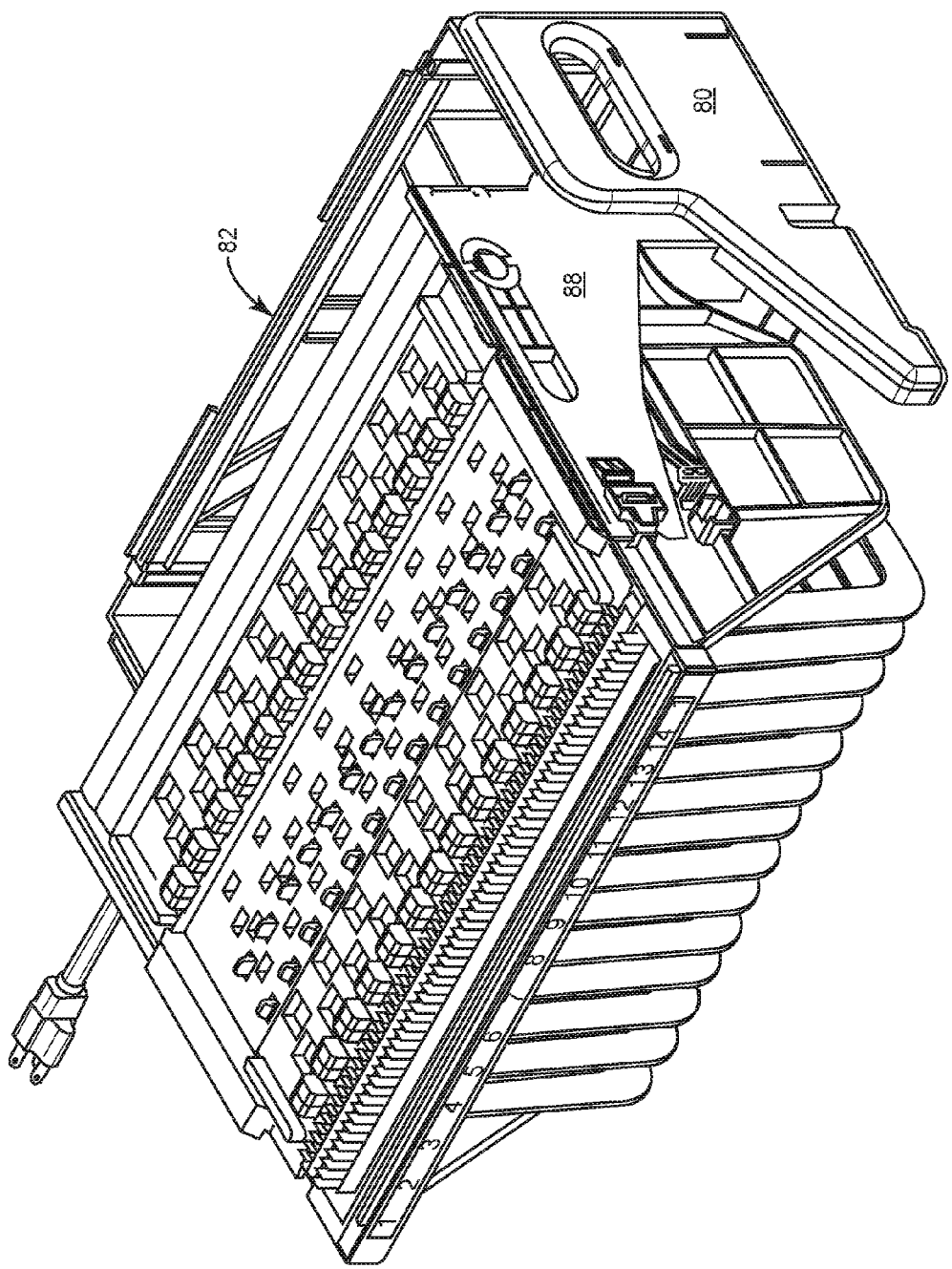
Figure 33:
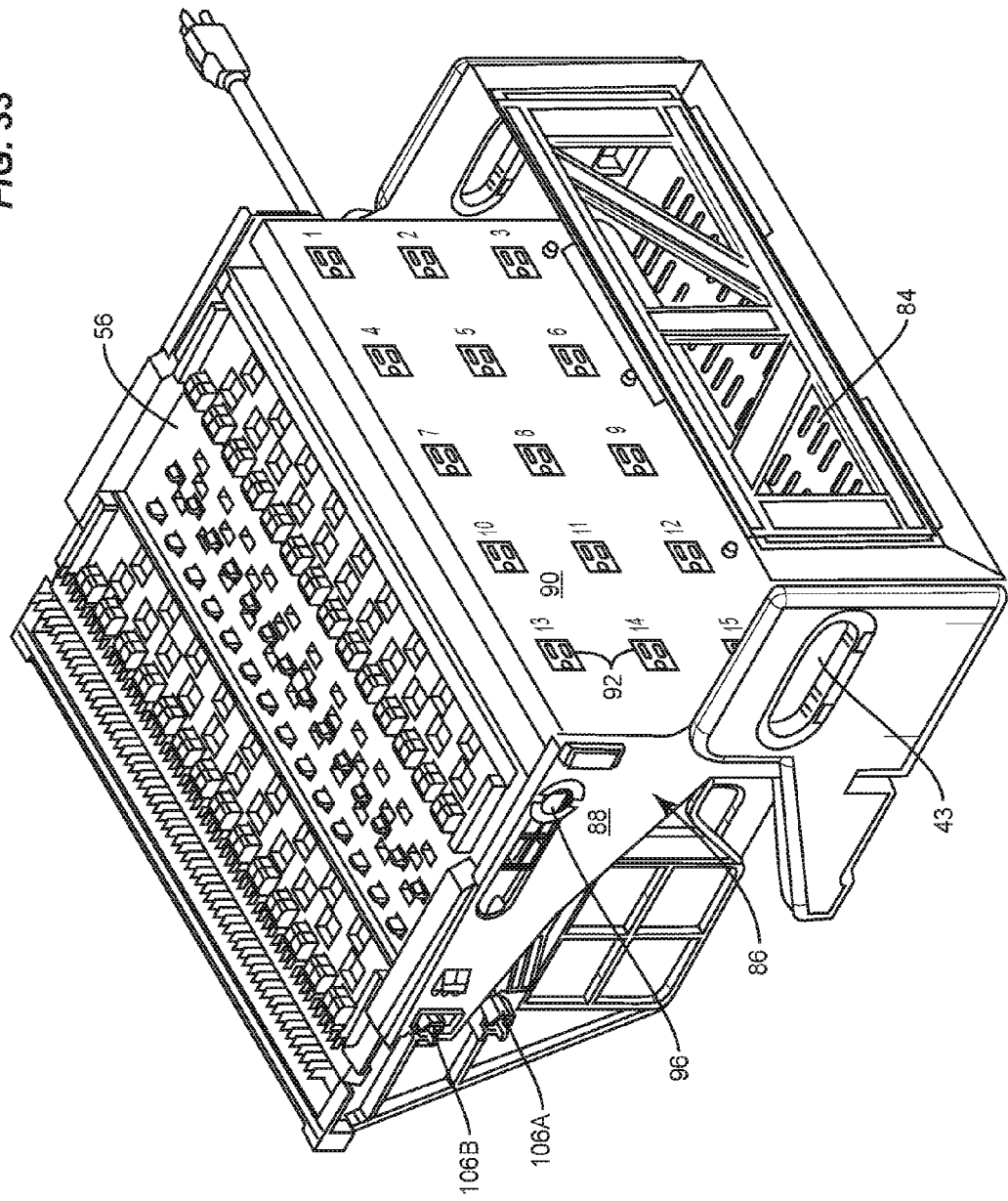
FIGS. 33 and 34 are rear perspective views of the example power configuration unit of FIG. 26.
Figure 34:
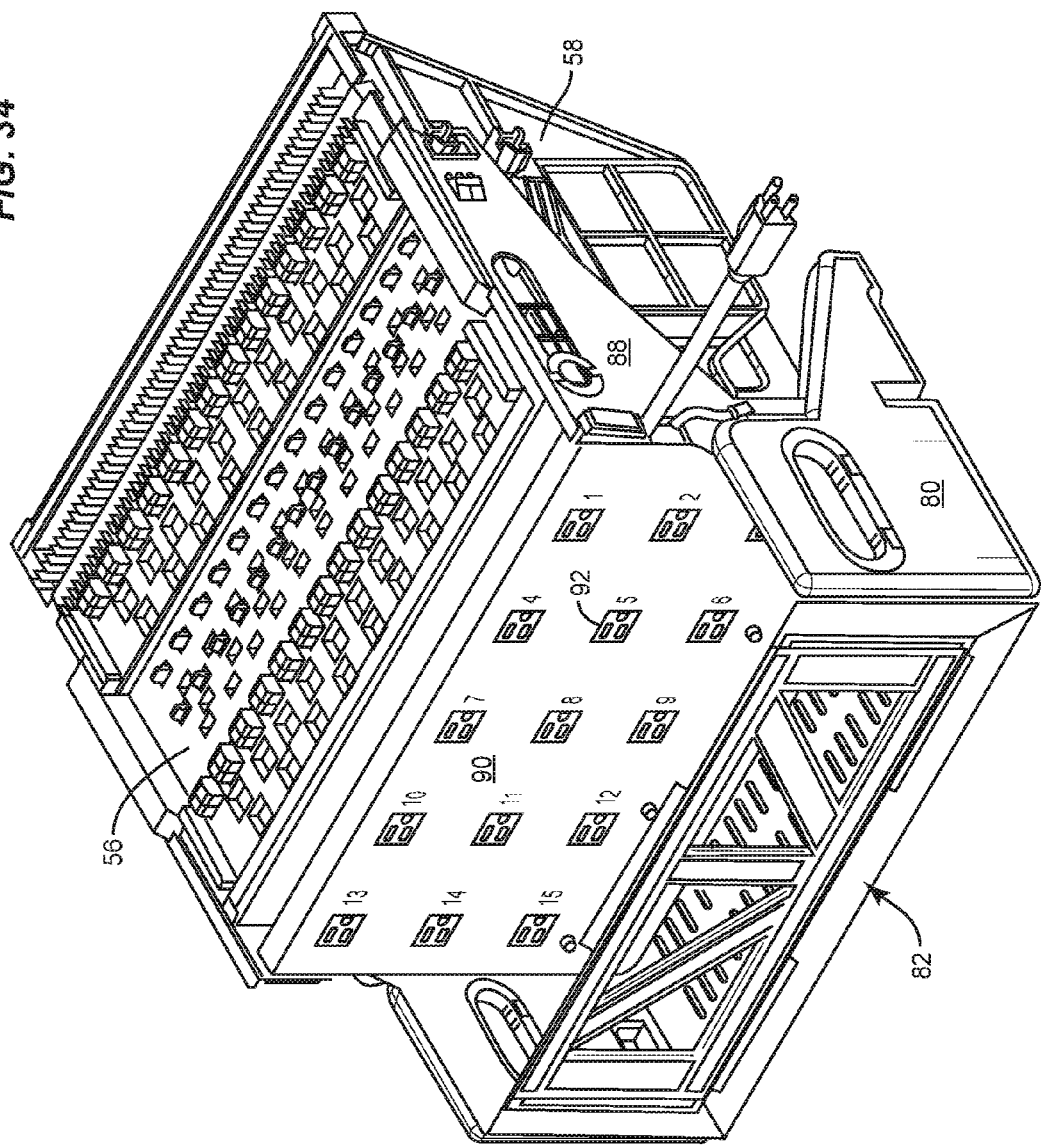
Figure 35:
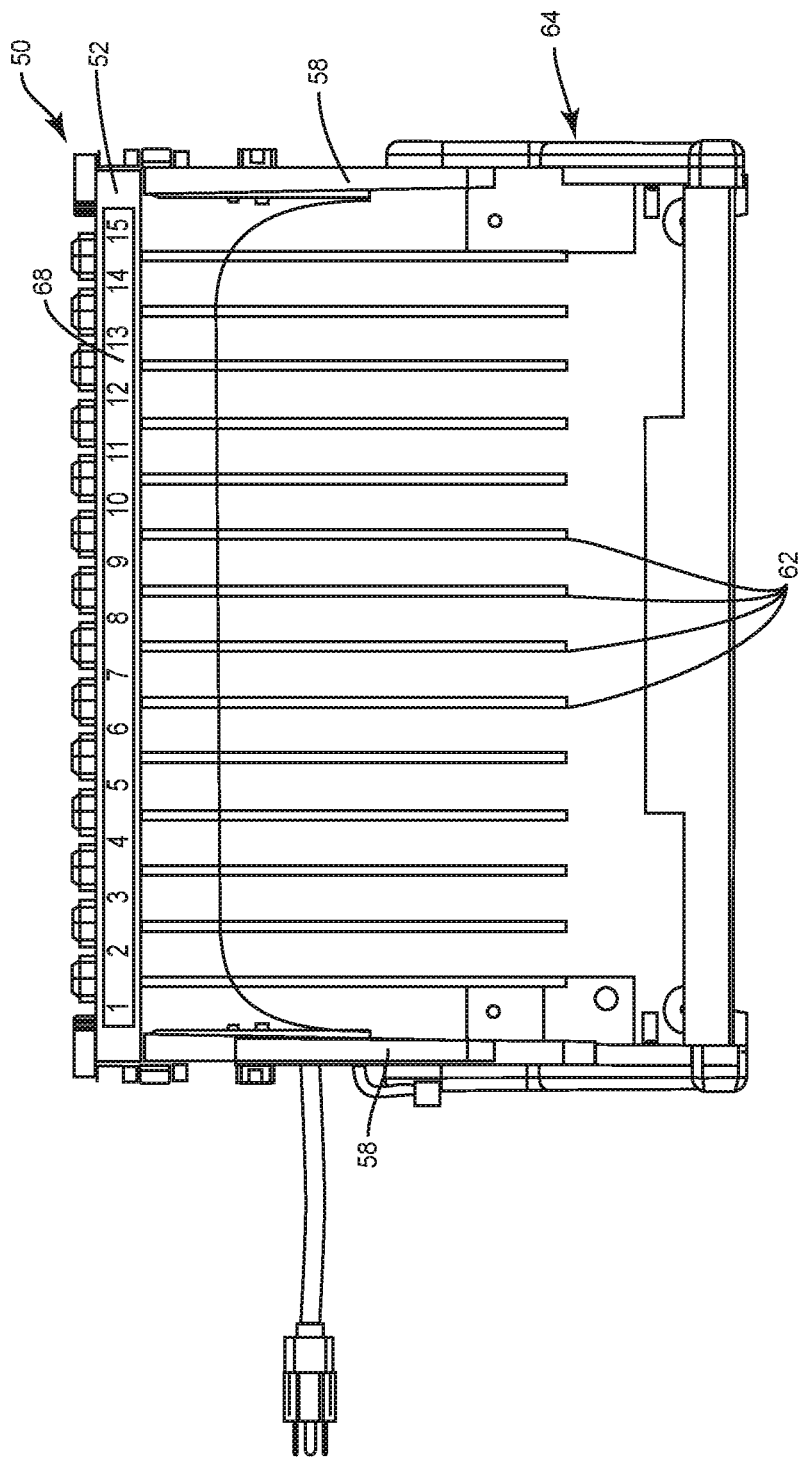
FIG. 35 is a front view of the example power configuration unit of FIG. 26 with the bridge in a raised position.
Figure 36:
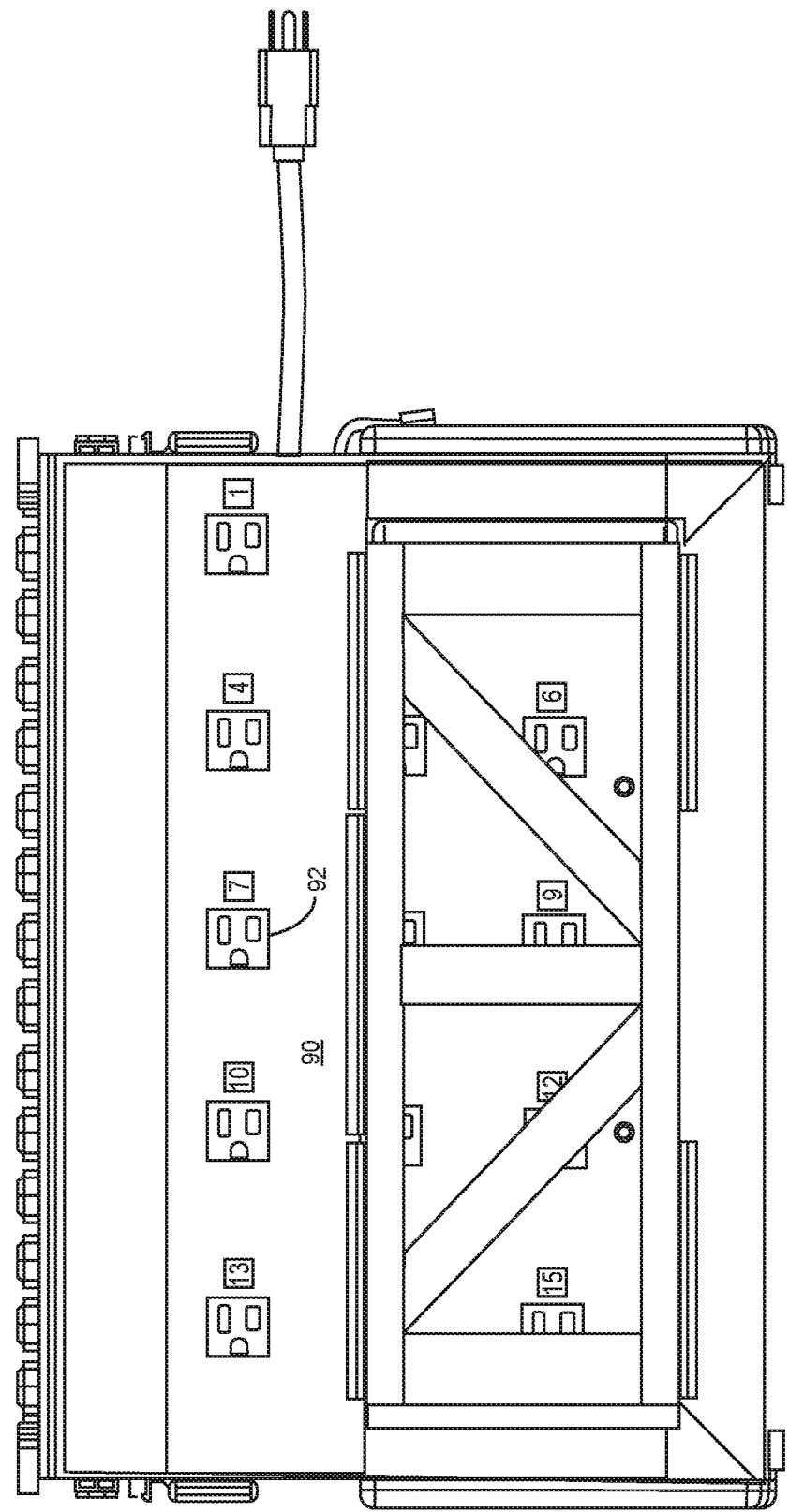
FIG. 36 is a rear view of the example power configuration unit of FIG. 26 with the bridge in the raised position.

Referring to FIGS. 31 and 32, the top plate 56 has three sets of post apertures 66A, 66B, 66C. Each set of post apertures 66A, 66B, 66C is formed as two rows, a front row and a back row. Accordingly, as shown in FIGS. 31 and 32, the post apertures include six rows of post apertures. The rows of apertures receive posts 70 of dividers 62 (see FIG. 45) to provide lateral stability to the dividers 62. In FIG. 31, posts 70 of dividers 62 are shown protruding through post apertures 66C. Posts 70 of divider 62 prevent the divider from moving laterally within the power configuration unit 50 to provide a strong lateral stability of the divider.

Figure 45:
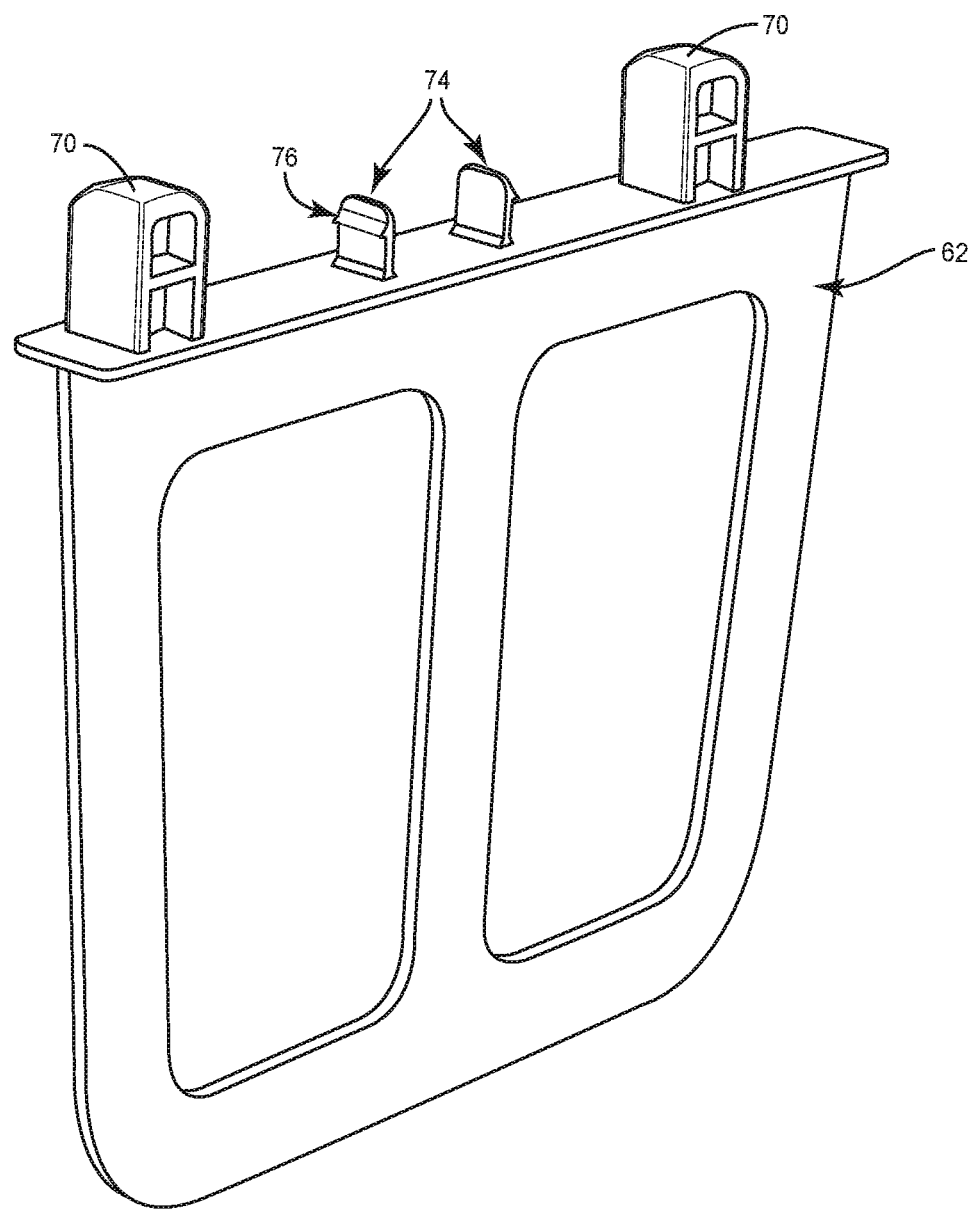
FIG. 45 is a perspective view of an example divider.

The top plate 56 also includes three sets of securing apertures 72A, 72B, 72C that are configured to receive securing tabs 74 of divider 62 (see FIG. 45). When the posts 70 of a divider 62 are inserted into a selected pair of post apertures 66 in the top plate 56, e.g. a selected pair of post apertures 66C as shown in FIG. 31, the securing tabs 74 of the divider 62 are passed into a corresponding pair of securing apertures 72C in the top plate 56. A lip 76 is formed on each securing tab 74. The lip 76 in an implementation has a sloped top surface and a flat lower surface. As the tab passes through the securing aperture 72, the sloped surface of the lip 76 causes the tab to deflect away from an edge of the securing aperture 72 until the lip 76 has passed through the securing aperture 72. Once the lip 76 has passed through the securing aperture the resilience of the material forming the securing tab 74 causes the securing tab 74 to snap back from its previously deflected condition, thus causing the flat lower surface of the lip 76 to extend over the top surface to secure the divider 62 to the bridge 52. To remove the divider 62, e.g. to enable the divider 62 to be repositioned within the power configuration unit 50, the two securing tabs 74 of the divider 62 are pressed together to cause the lips 76 to disengage the top surface so that the posts 70 and securing tabs 72 of the divider 62 can be pulled out of the respective apertures in the top surface.

Figure 28:
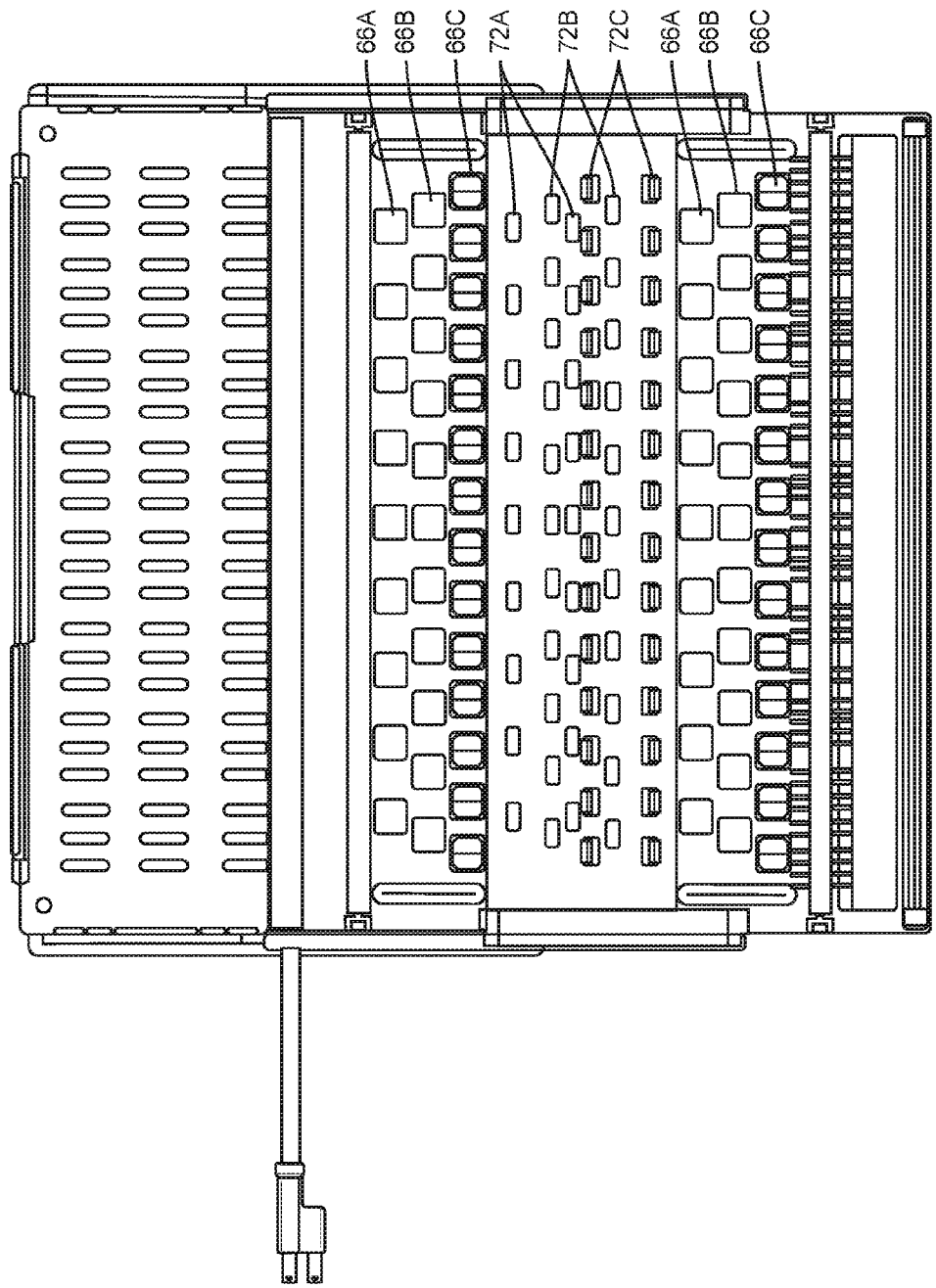
FIG. 28 is a top view of the example power configuration unit of FIG. 26.
Figure 37:
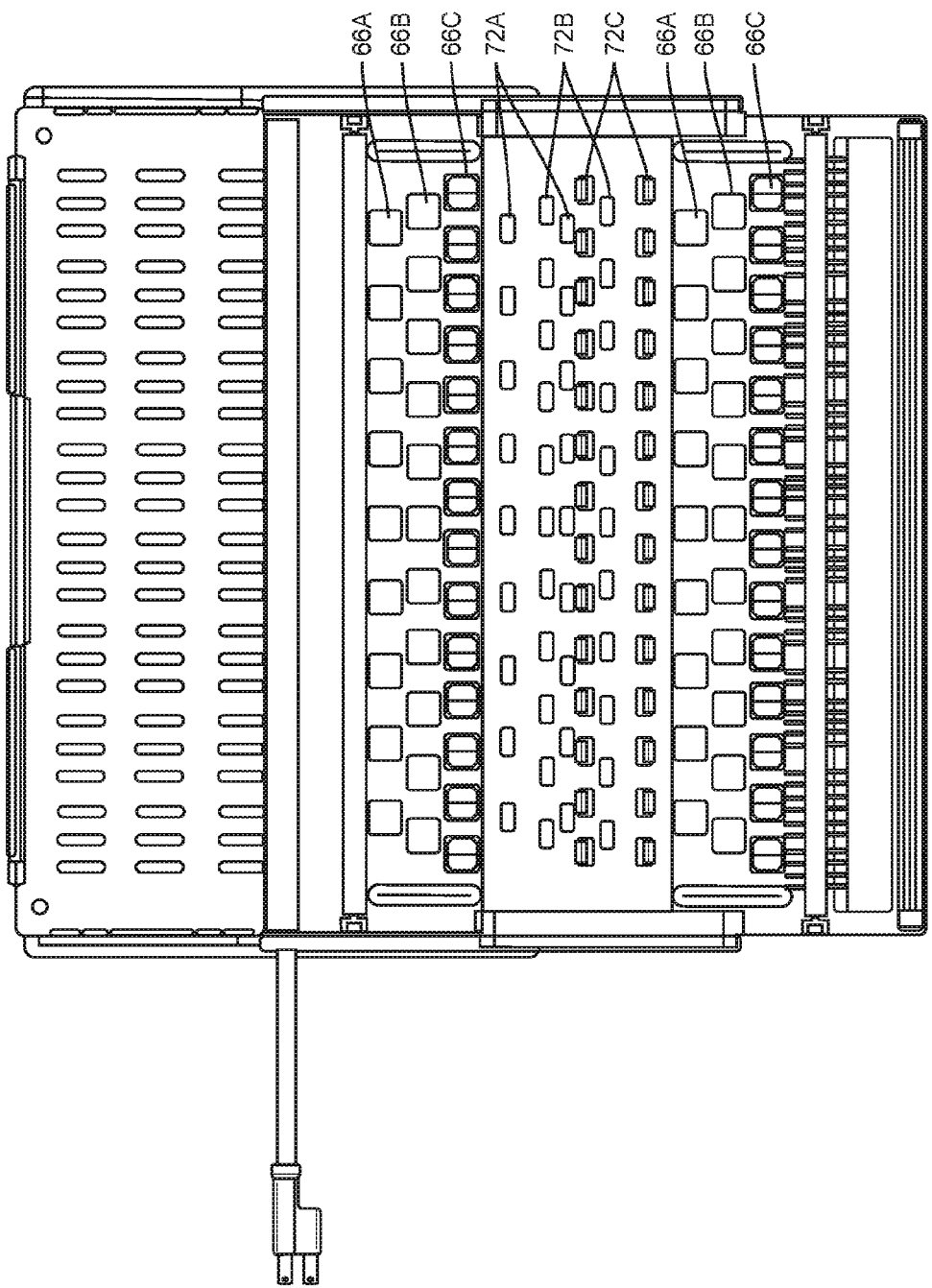
FIG. 37 is a top view of the example power configuration unit of FIG. 26 with the bridge in the raised position.
Figure 38:
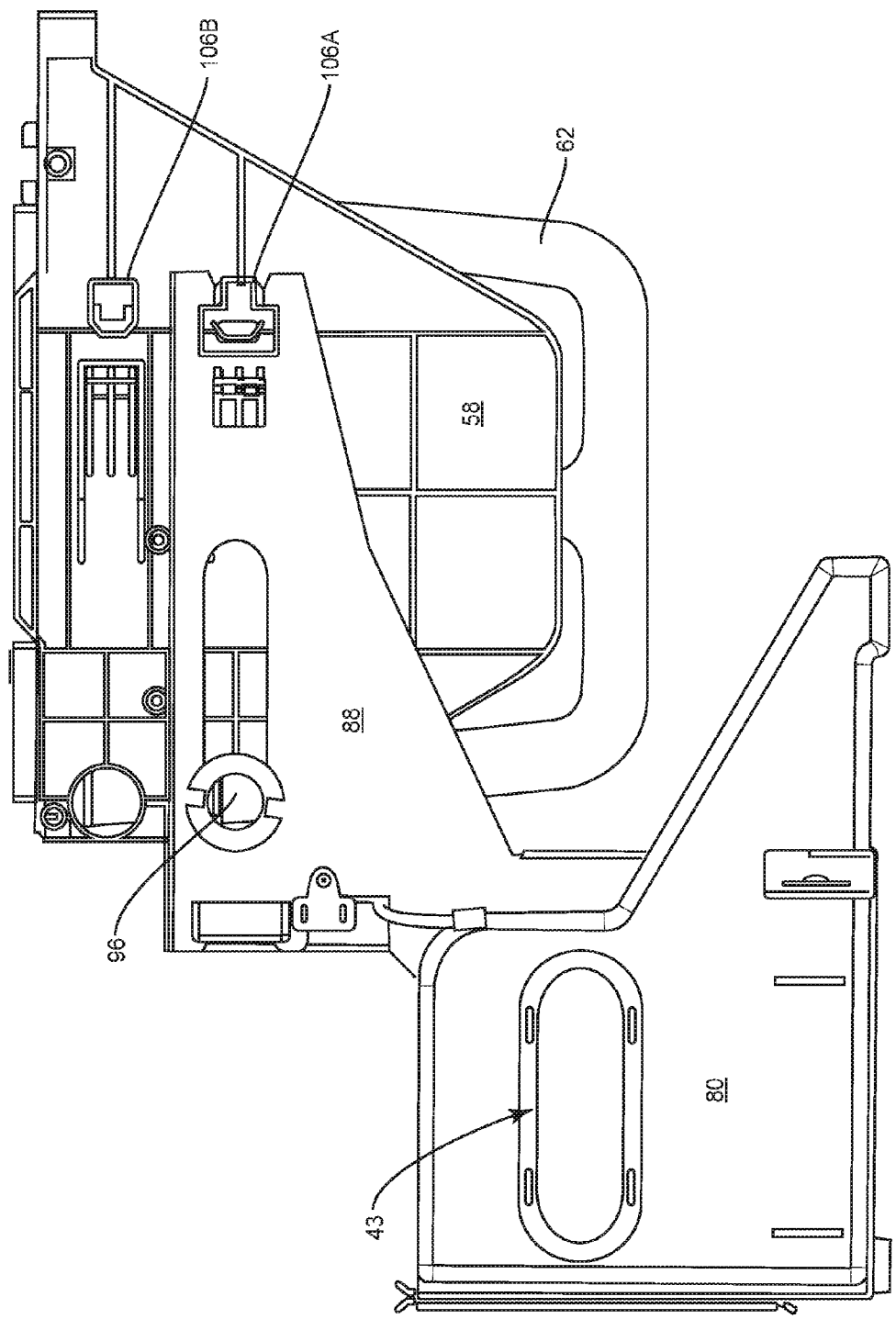
FIG. 38 is a left side view of the example power configuration unit of FIG. 26 with the bridge in the raised position.

As shown in FIGS. 28 and 37, each pair of post apertures 66 aligns with a corresponding pair of securing apertures 72 so that dividers may be located in multiple configurations within the power configuration unit 50. By having different numbers of apertures in each of the sets (e.g. 9 apertures in set 66A/72A, 11 apertures in set 66B/72B, 14 apertures in set 66C/72C) different numbers of dividers may be connected to the top plate 56 of the bridge 52, thereby enabling the number of bays that are formed by the power configuration unit 50 to be adjusted depending on the required thickness of each storage bay.

In the implementation shown in FIGS. 31-32, the first set of post apertures 66A and securing apertures 72A includes 2 rows of post apertures and 2 rows of securing apertures 72A. Each row of post apertures and each row of securing apertures in this first set includes 9 such apertures, thus enabling the first set of post apertures 66A and first set of securing apertures 72A to receive and retain 9 dividers 62. This enables the shelf and associated power configuration unit 52 to provide 10 individual computer storage bays to hold 10 portable computing devices. In one implementation, when the dividers are secured to the first set of post apertures 66A and securing apertures 72A, each bay has a width of 1.25 inches (3.2 cm).

In the implementation shown in FIGS. 31-32, the second set of post apertures 66B and securing apertures 72B includes 2 rows of post apertures and 2 rows of securing apertures 72B. Each row of post apertures 66B and each row of securing apertures 72B in this second set includes 11 such apertures, thus enabling the second set of post apertures 66B and second set of securing apertures 72B to receive and retain 11 dividers. This enables the shelf and associated power configuration unit 52 to provide 12 individual computer storage bays. In one implementation, when the dividers are secured to the second set of post apertures 66B and securing apertures 72B, each bay has a width of 1.0 inches (2.5 cm).

In the implementation shown in FIGS. 31-32, the third set of post apertures 66C and securing apertures 72C includes 2 rows of post apertures 66C and 2 rows of securing apertures 72C. Each row of post apertures 66C and each row of securing apertures 72C in this third set includes 14 such apertures, thus enabling the third set of post apertures 66C and third set of securing apertures 72C to receive and retain 14 dividers. This enables the shelf and associated power configuration unit 52 to provide 15 individual computer storage bays. In one implementation, when the dividers are secured to the third set of post apertures 66C and securing apertures 72C, each bay has a width of 0.83 inches (2.1 cm).

FIGS. 31-32 show the divider tabs extending through the apertures 66C and show 14 dividers 62 connected to the top plate 56. To reconfigure the power configuration unit 50 to have a different number of bays to accommodate a different number of computers, the securing tabs 74 of dividers 62 would be removed from the securing apertures 72C and some of the dividers 62 would be reinstalled into the power configuration unit 50 by inserting the posts 70 and tabs 74 of the dividers 62 into a different set of post apertures 66A or 66B and associated securing apertures 72A or 72B.

Figure 26:
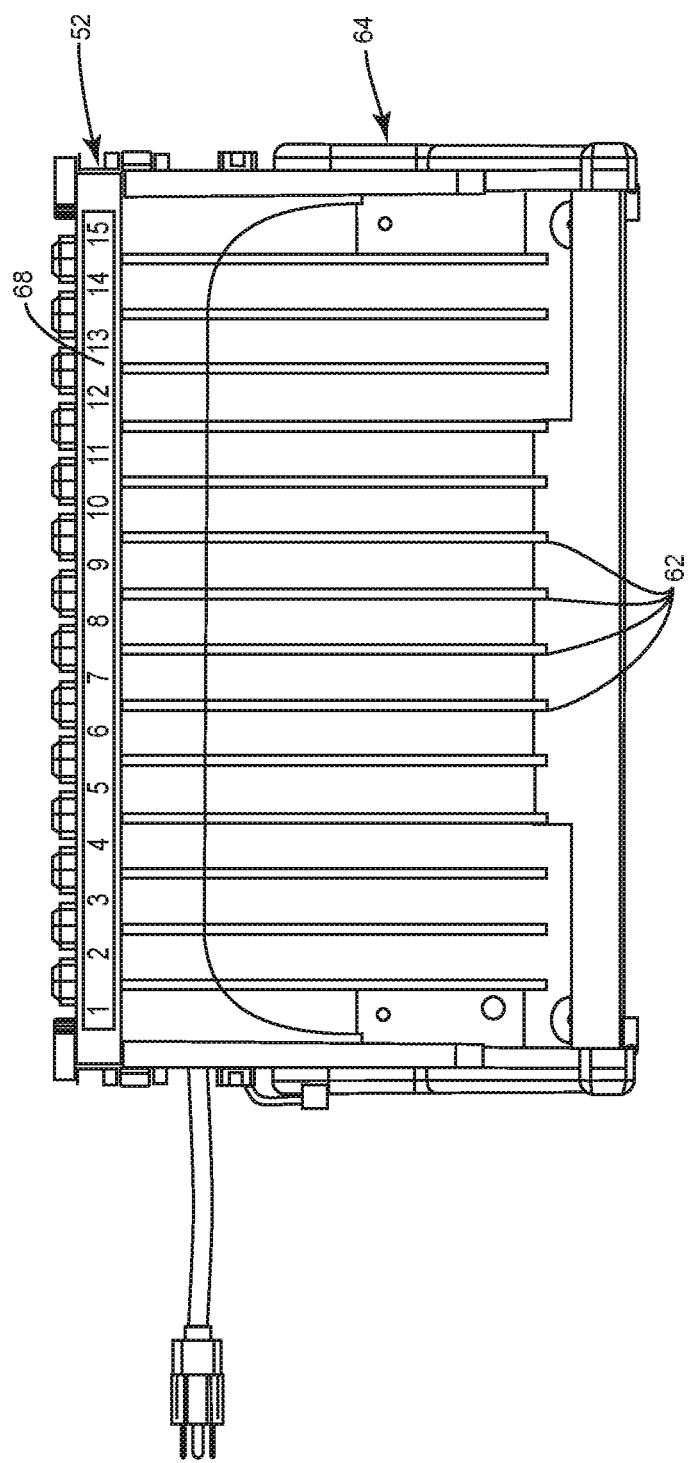
FIG. 26 is a front view of an example power configuration unit of the portable computer storage system of FIG. 1 with a bridge in a lowered position.
Figure 27:
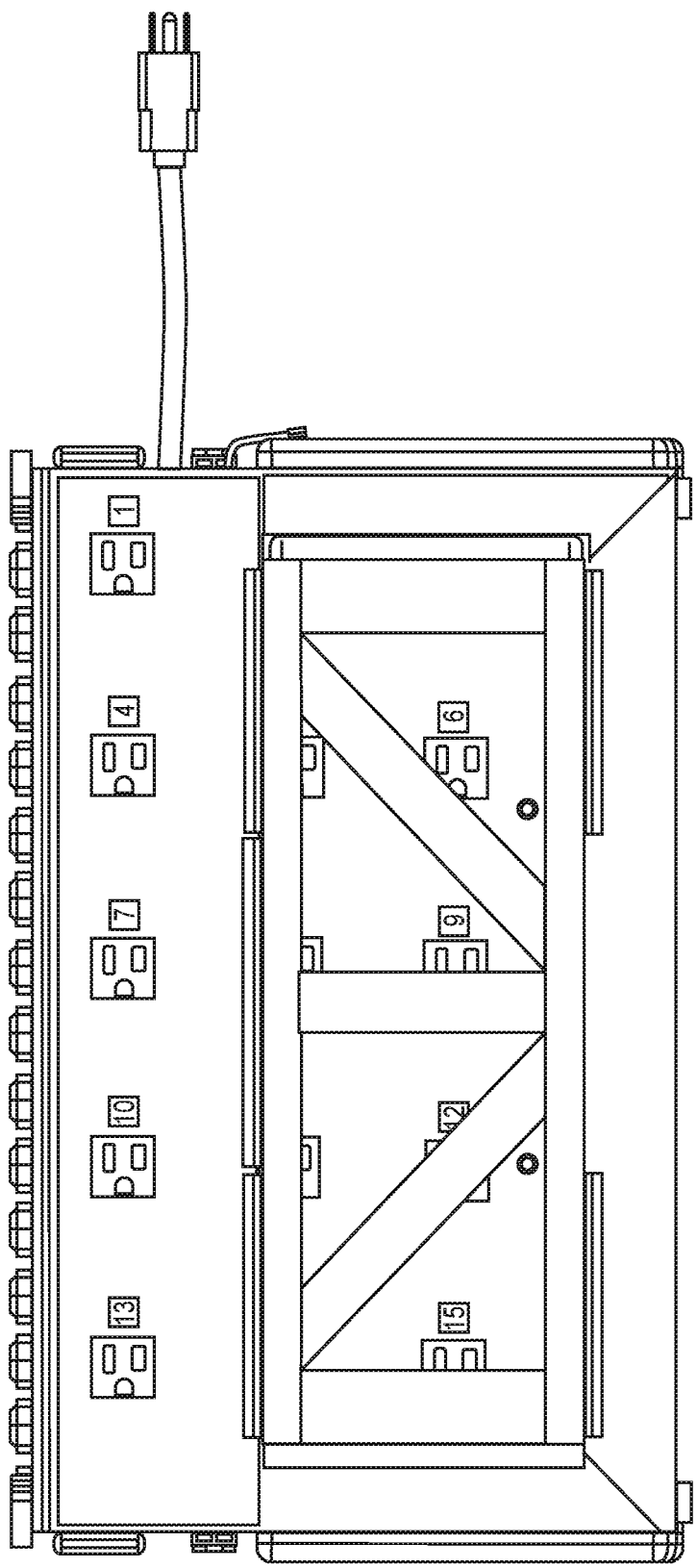
FIG. 27 is a rear view of the example power configuration unit of FIG. 26.

In an implementation, each of the bays is numbered, as shown in FIG. 26. In one implementation, the numbering is formed on a numbering strip 68 that is inserted into a channel at the front of the top plate 56 on bridge 52. In one implementation the power configuration unit 50 is provided with a set of numbering strips 68 that has the spacing of numbers adjusted to coincide with the different possible widths of the bays. For example, in an implementation that enables the bay width to be adjusted between 1.25, 1, and 0.83 inch widths, the set of numbering strips would likewise have a first numbering strip having bay numbers 1-10 spaced at 1.25 inch intervals, a second numbering strip having bay numbers 1-12 spaced at 1 inch intervals, and a third numbering strip having bay numbers 1-15 at 0.83 inch intervals. Where other numbers of bays may be accommodated, the numbering strips would likewise be adjusted to account for the different numbers of bays. The numbering strips may be individually provided, one numbering strip may have numbering on two sides, or a numbering strip having a triangular or square cross section may have numbering on three or more sides.

In an implementation, the base 64 has a pair of side frames 80, a back 82, and a floor 84. The base also includes a riser 86 including side arms 88 and rear electrical panel 90. Power is provided to the rear electrical panel 90 via cord 91 which connects to an electrical distribution system such as power distribution unit 150 within the storage system 10. Handles 43 optionally are provided in the base 64.

The side frame 80, back 82, floor 84, and rear electrical panel 90 form a bin for storage of AC transformers 154 associated with computers to be stored in the bays. Each AC transformer 154 (not shown) is plugged into a respective outlet 92 and a wire (DC power cord 160) is then routed forward across the top surface of top plate 56 to drop down in front of each bay. Optionally cord management structures may be formed on the top surface of top plate 56 to secure the cords along the top surface of the power configuration unit 50. Example cord management structures may include channels formed in top plate 56 to contain the cords and extending a cross a top surface of the top plate 56. Cords may be retained within the channels using physical structures designed to engage the cords when the cords are pressed into the channels or elastic or other stretchy material may be extended across the top of the channels to hold the cords within the channels.

Figure 44:
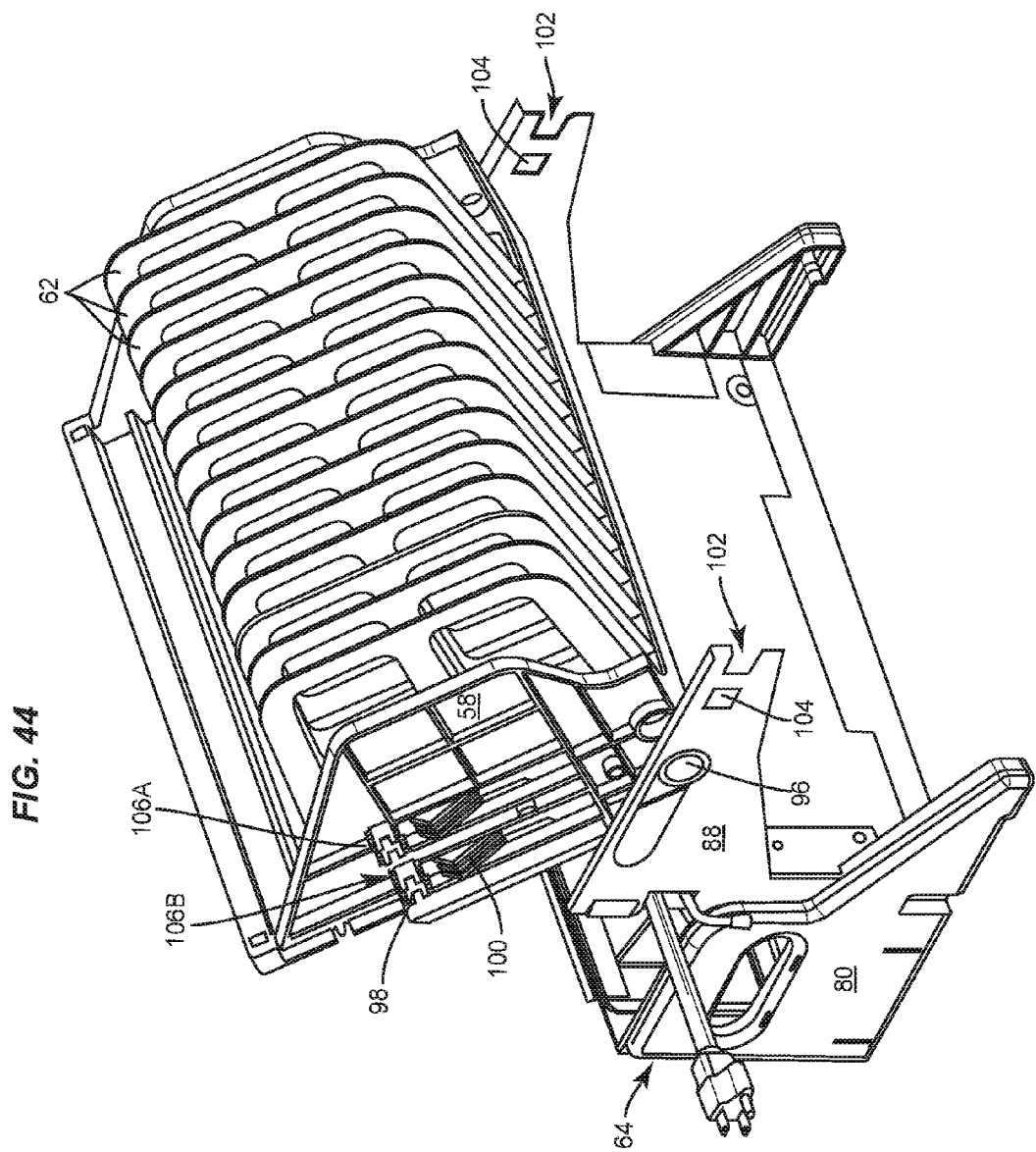
FIG. 44 is a front perspective view of the example power configuration unit of FIG. 26 with the bridge rotated for adjustment of dividers.

The bridge 52 is secured to each side arm 88 of the riser 86 by a respective latch 94 and pivot 96. Pivots 96 are placed at the rear of the bridge 52 and enable the bridge 52 to pivot relative to the base 64 for servicing as shown in FIG. 44. Pivoting the bridge 52 into this position provides access to the dividers 62, for example, to reposition the dividers 62 within the power configuration unit 50. The latches 94 secure the front corners of the bridge 52 to the side arms 88 to prevent the bridge 52 from moving relative to the base 64 during normal use.

In one implementation (See FIG. 44) each latch 94 includes a hook 98 and tab 100 which is biased away from the side plate 58. To engage the latch 94, the bridge 52 is rotated to align the latches 94 with corresponding cut-aways 102 in side frames 80. The bridge 52 is then pushed backward until the tab 100 enters aperture 102 and hook 98 engages a back edge of cut-away 102. This secures the bridge 52 relative to the base 64. To release the bridge 52, the tabs 100 are pressed in toward the side plates 58 until the tabs 100 are no longer retained within apertures 104. This enables the bridge 52 to be slid forward until hooks 98 no longer engage cut-away 102 to thereby release the front edge of the bridge 62 to enable the bridge to be rotated on pivots 96 into the position shown in FIG. 44.

Figure 29:
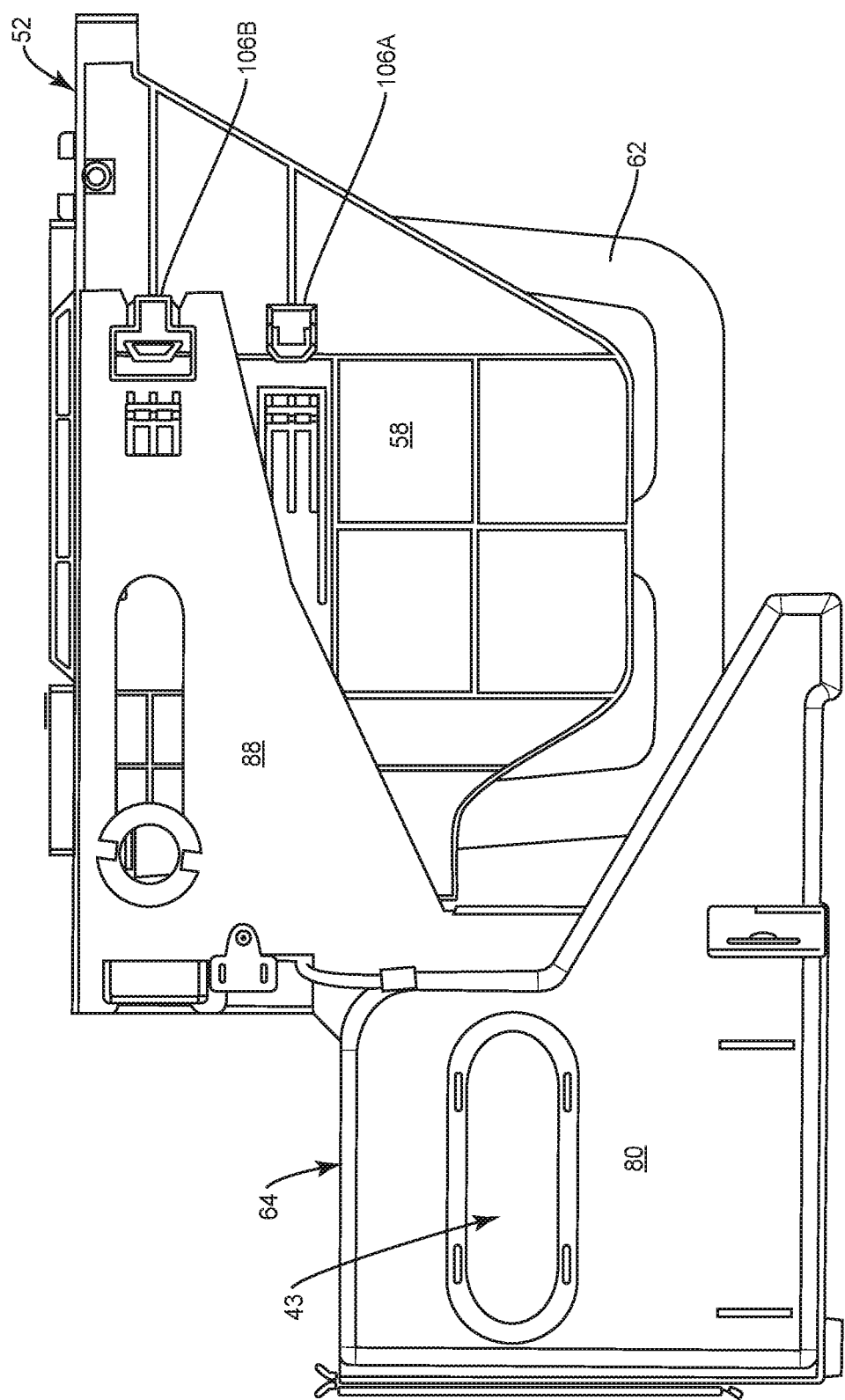
FIG. 29 is a left side view of the example power configuration unit of FIG. 26.
Figure 30:
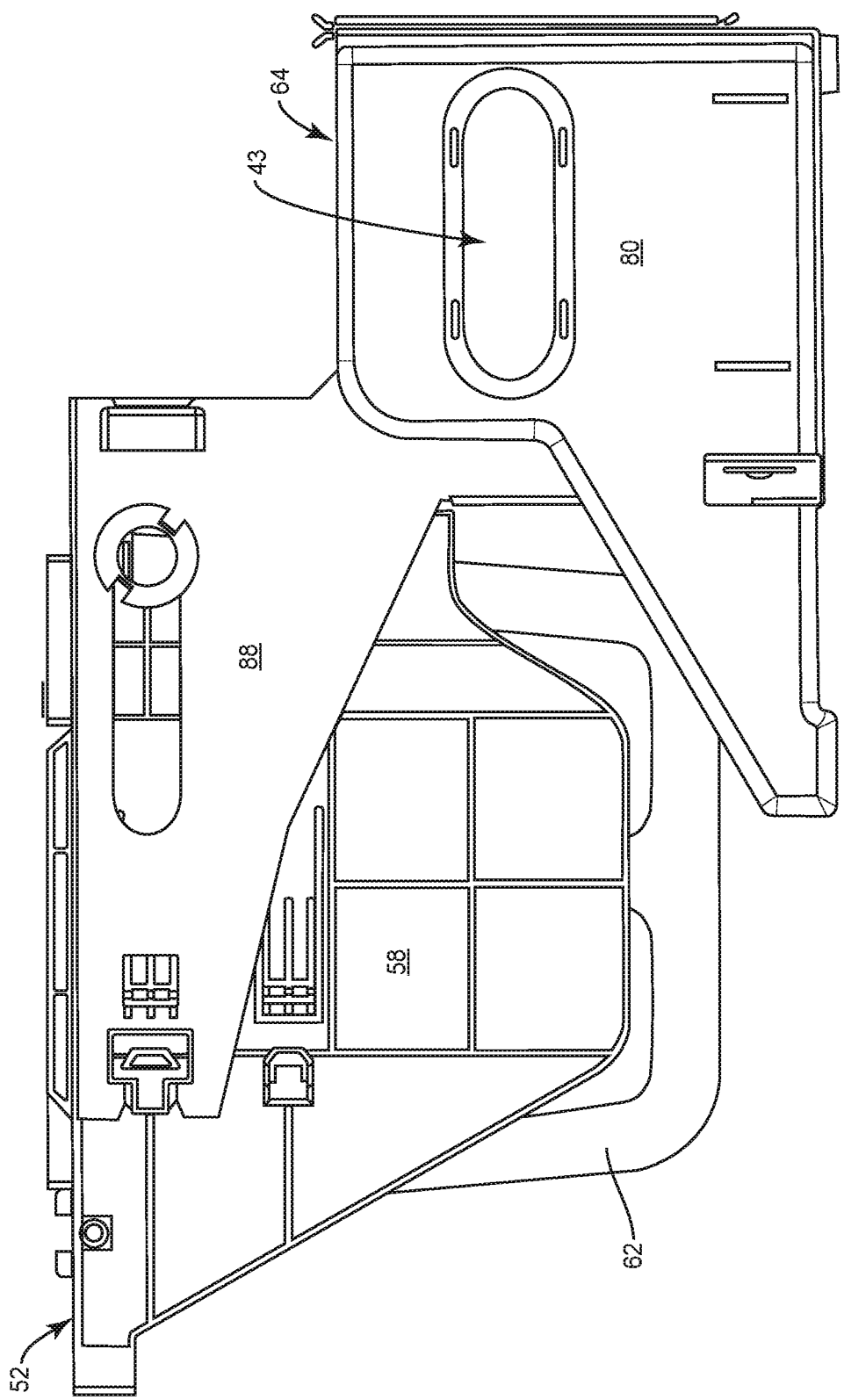
FIG. 30 is a right side view of the example power configuration unit of FIG. 26.
Figure 39:
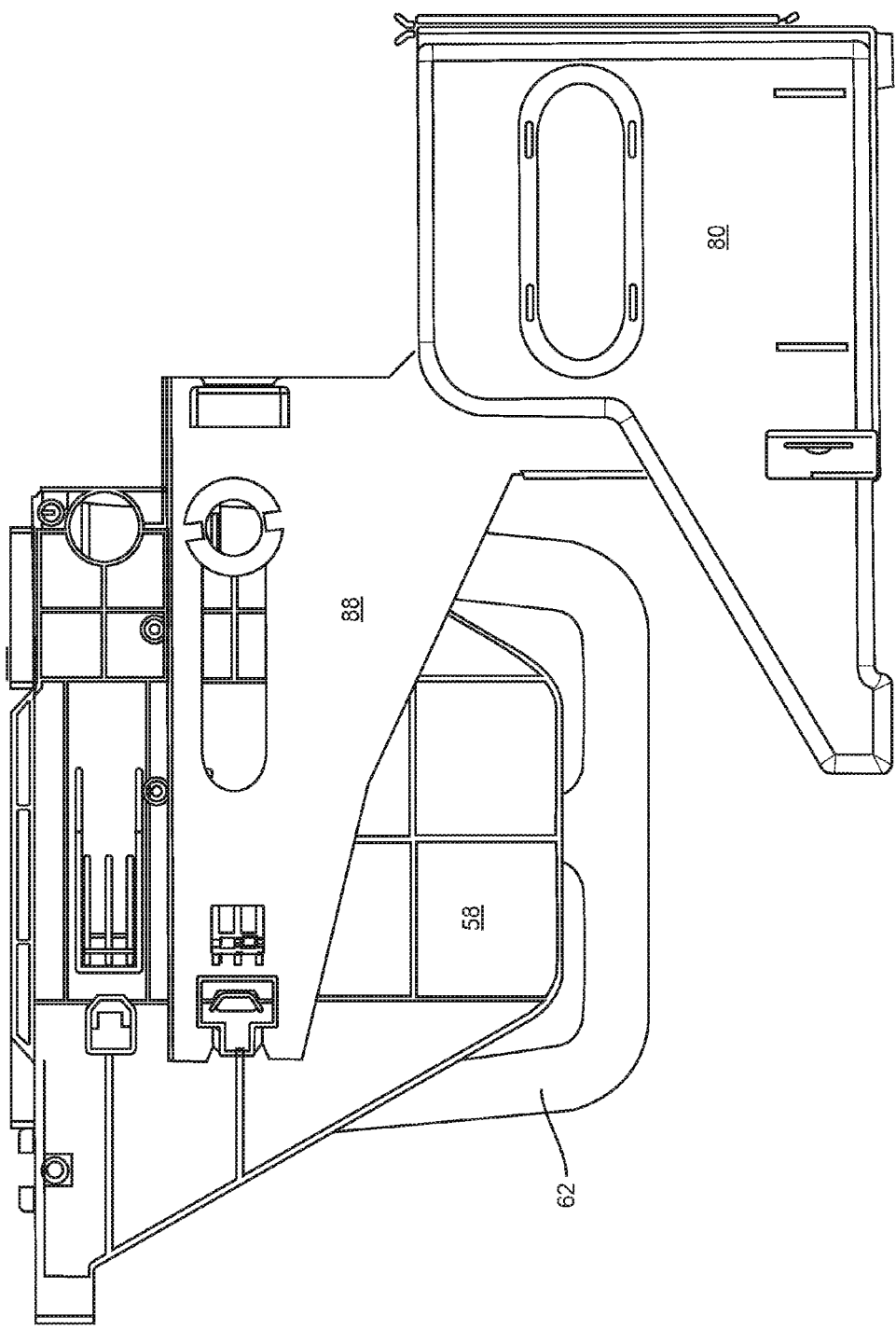
FIG. 39 is a right side view of the example power configuration unit of FIG. 26 with the bridge in the raised position.
Figure 40:
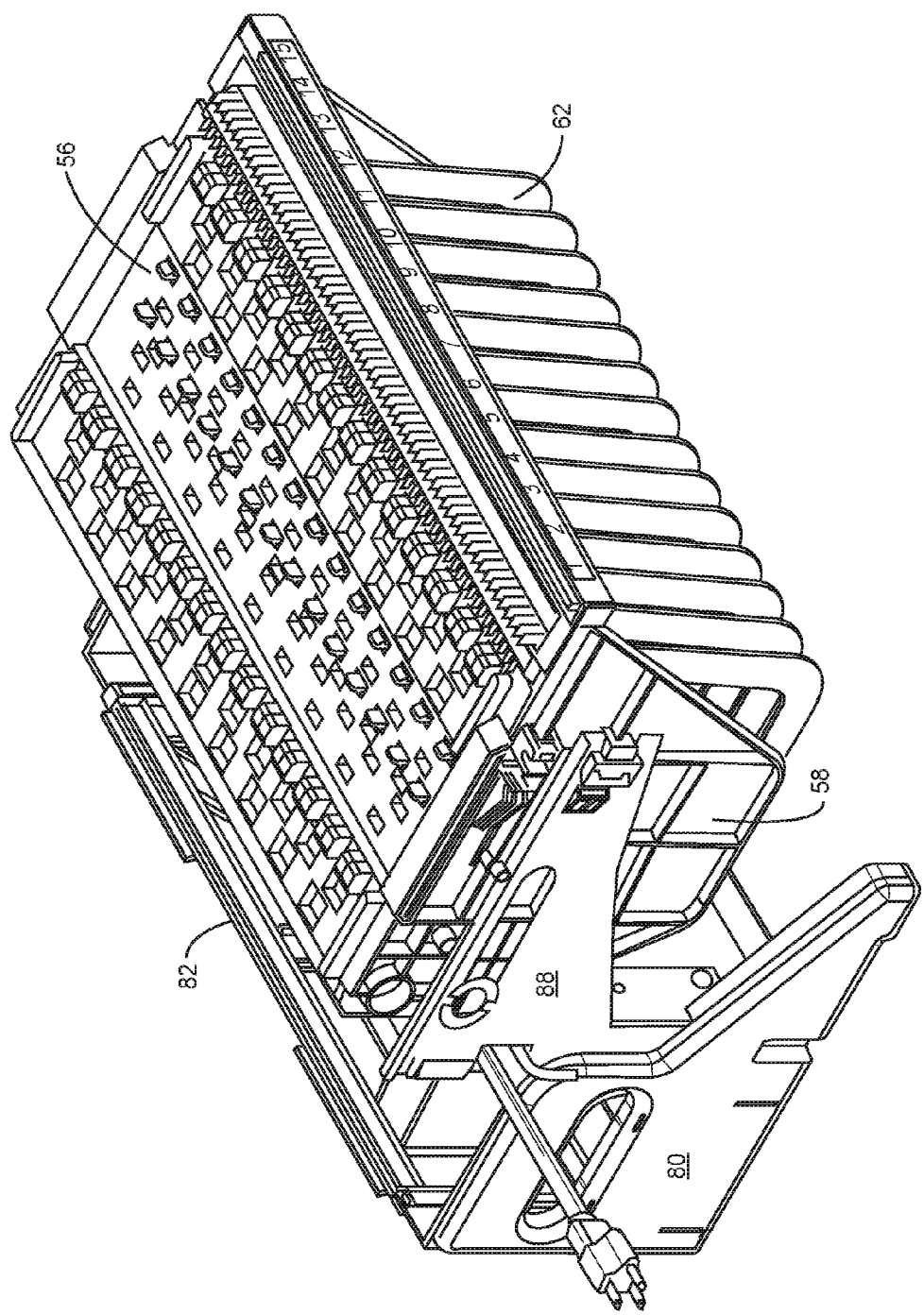
FIGS. 40 and 41 are front perspective views of the example power configuration unit of FIG. 26 with the bridge in the raised position.
Figure 41:
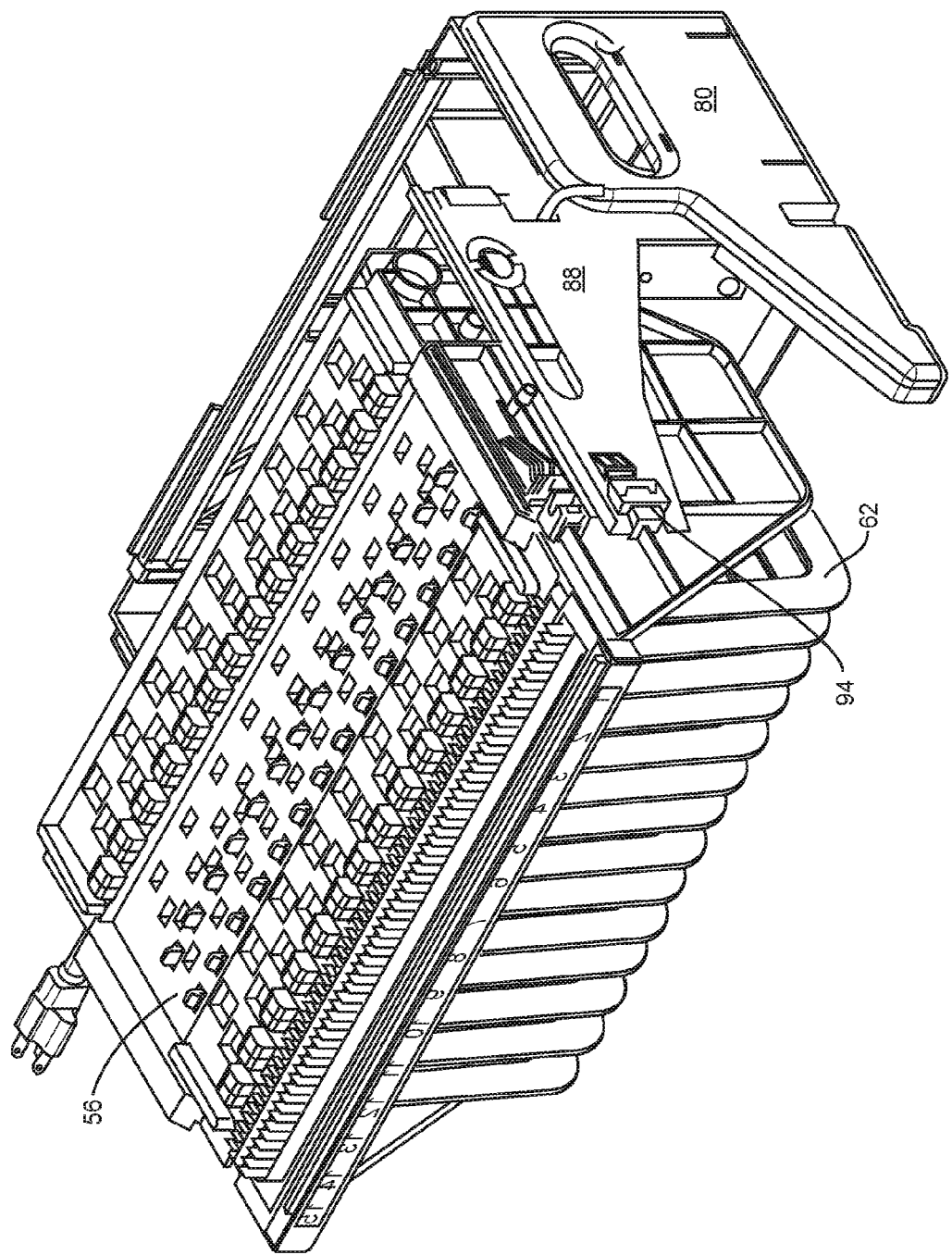
Figure 42:
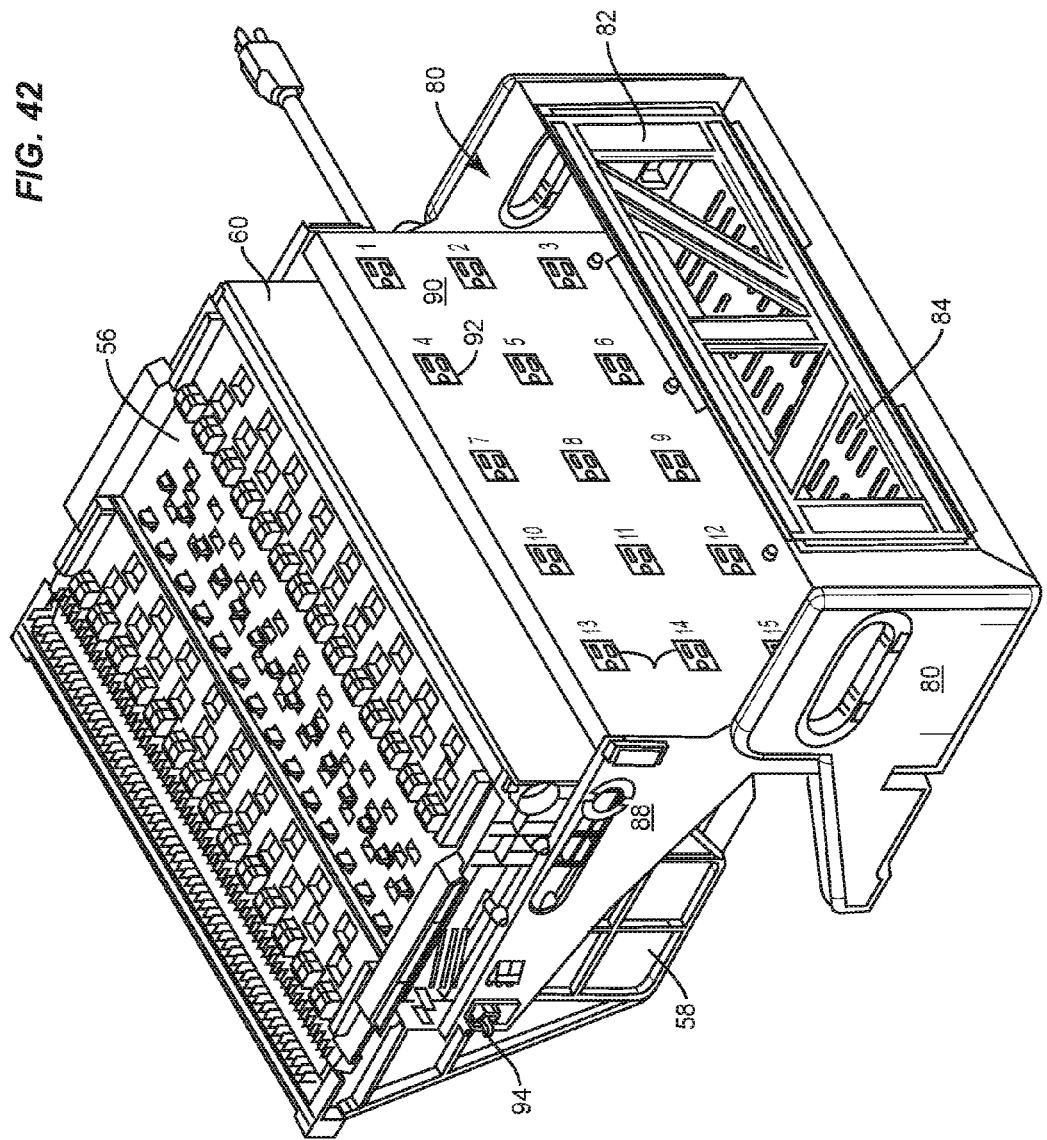
FIGS. 42 and 43 are rear perspective views of the example power configuration unit of FIG. 26 with the bridge in the raised position.
Figure 43:
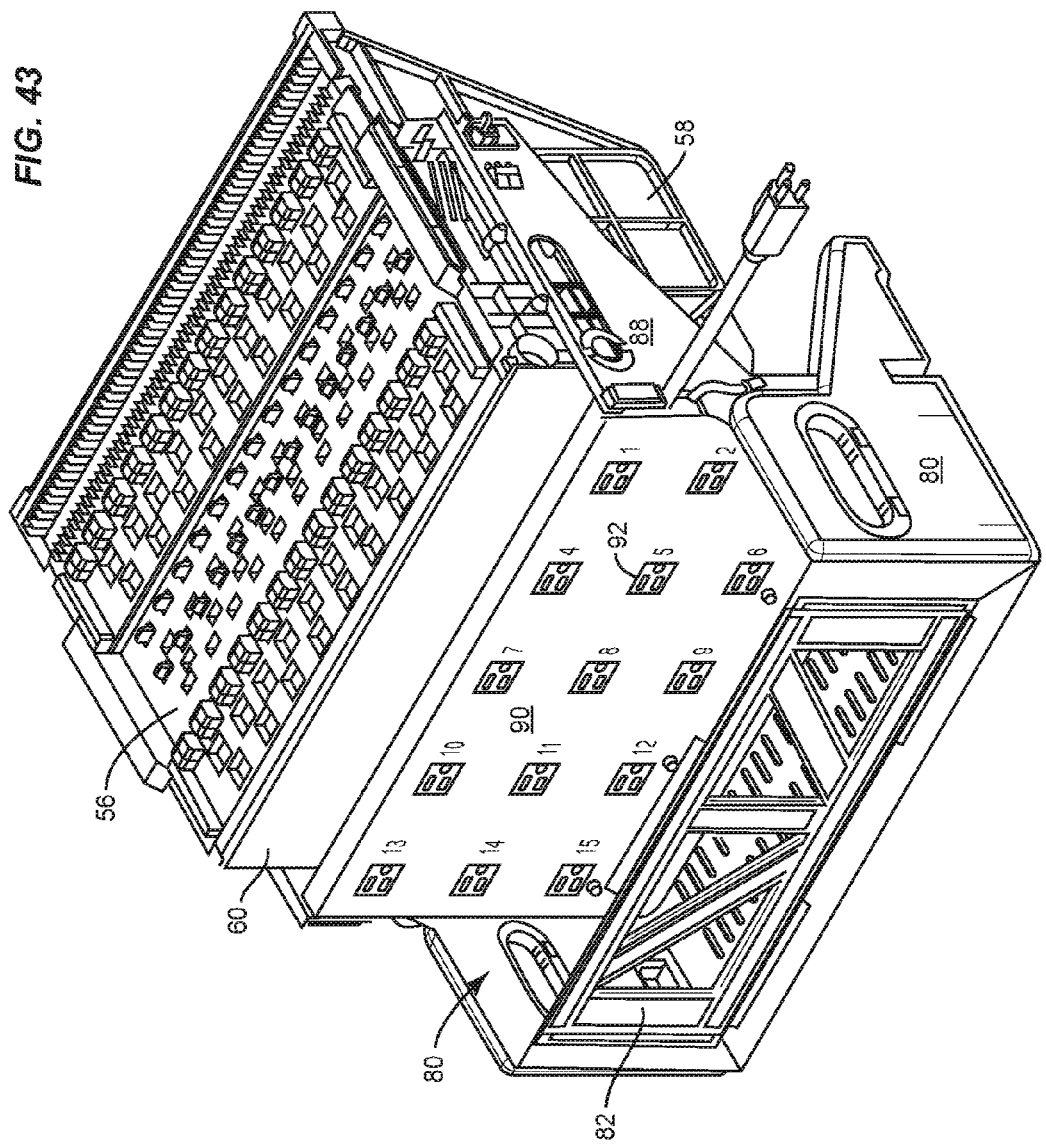

In one implementation each side plate 58 of bridge 52 has two sets of latches 94 and two pivots 96 which enable the bridge 52 to be mounted on the base 64 in two different vertical positions. The relative placement of these two vertically displaced mounting systems 106A, 106B is visible, for example, in FIG. 44 which shows the bridge 62 in a rotated position. FIG. 29 shows the power configuration unit 50 in a configuration where mounting system 106B is used to position the top of the bridge 52 in a lower position relative to the base 64. FIG. 39 shows the power configuration unit 50 in a configuration where mounting system 106A is used to position the top of the bridge 52 in a higher position relative to the base 64. Raising the top surface by using mounting system 106A enables each bay to have additional vertical height relative to the shelf 64 within the storage system on which the power configuration unit 50 sits to accommodate larger laptop computers. Lowering the top surface by using mounting system 106B enables each storage bay to have less vertical height relative to the shelf on which the power configuration unit 50 sits, to thereby enable the power configuration unit 50 to accommodate physically smaller laptop computers, while enabling a larger number of shelves 64 to be fit into a storage system 10 of a given size (compare FIGS. 10 and 15).

Figure 46:
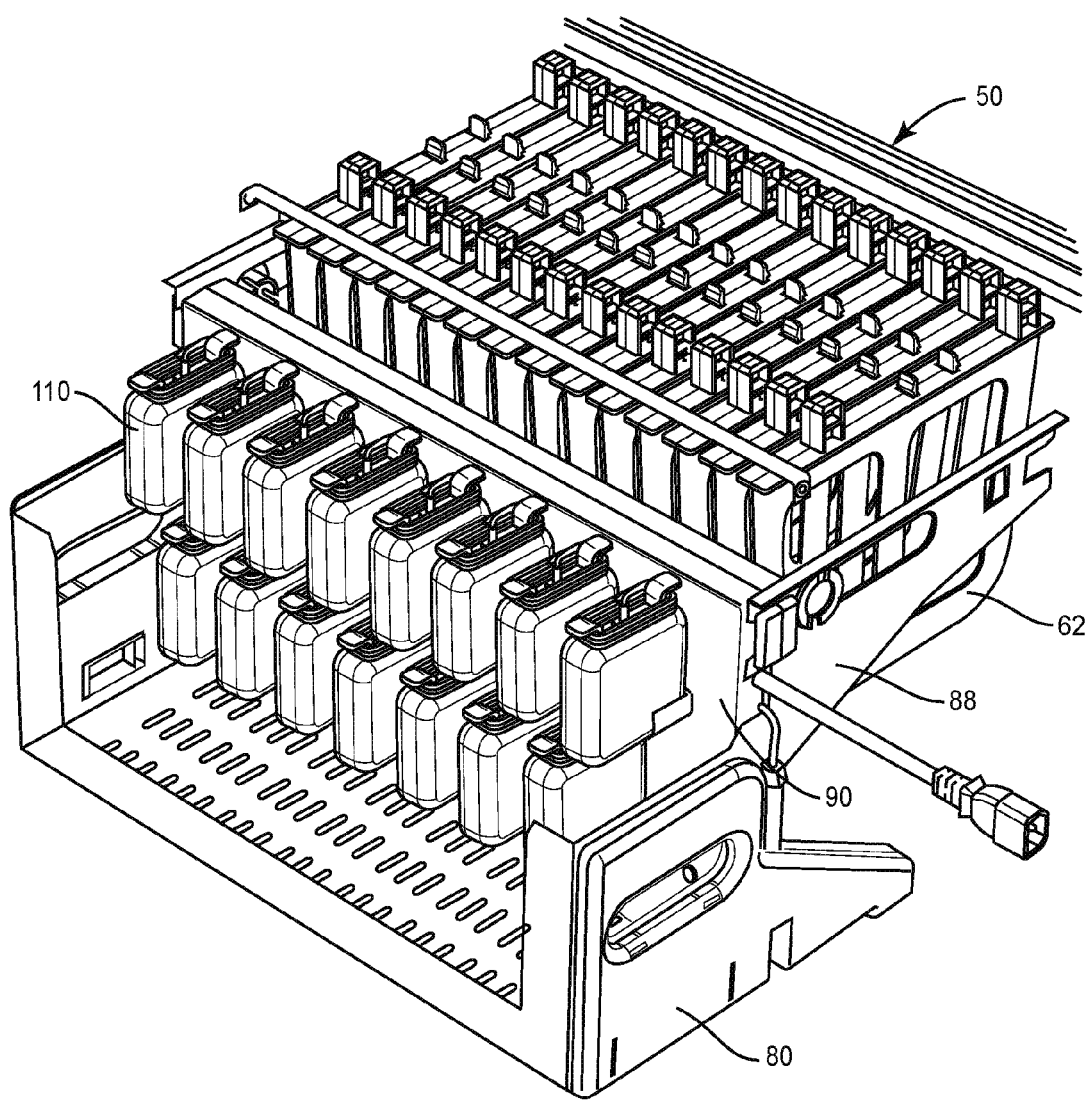
FIG. 46 is a rear perspective view of an example power configuration unit.
Figure 47:
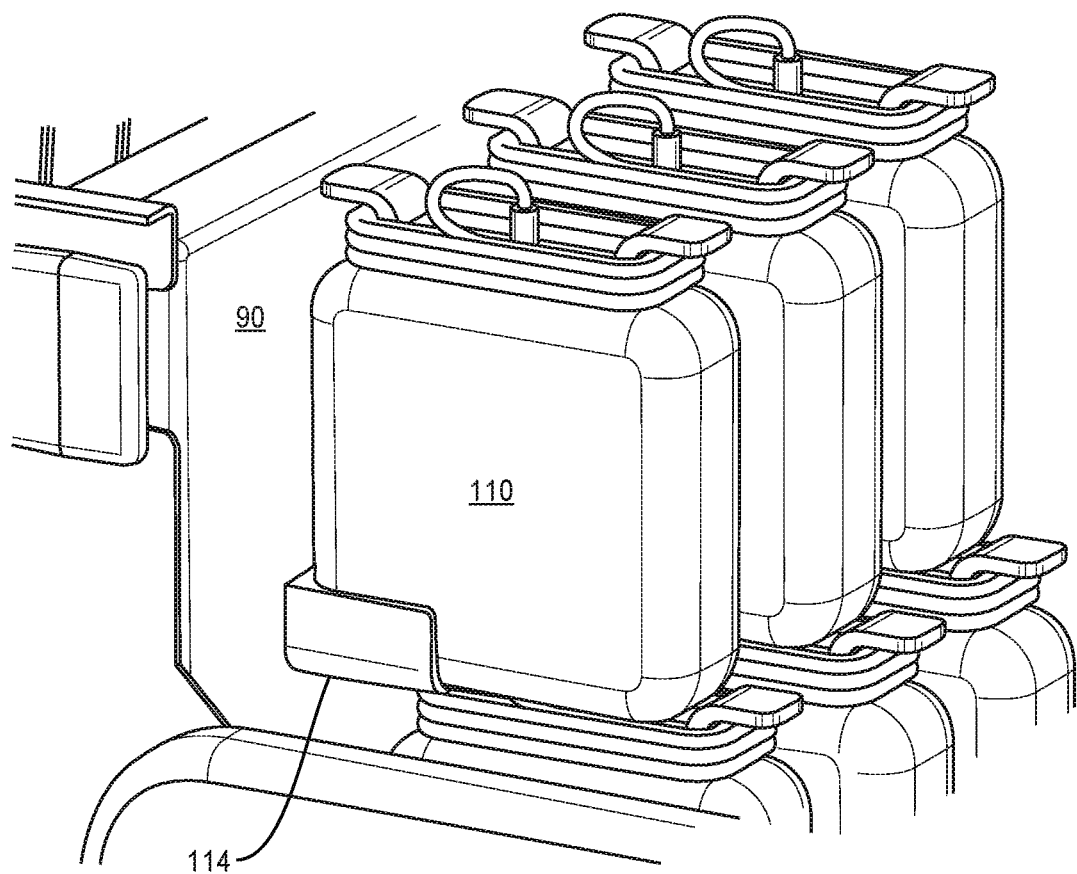
FIG. 47 is a perspective view of a power adapter mounted on a rear electric panel of the example power configuration unit of FIG. 46.
Figure 48:
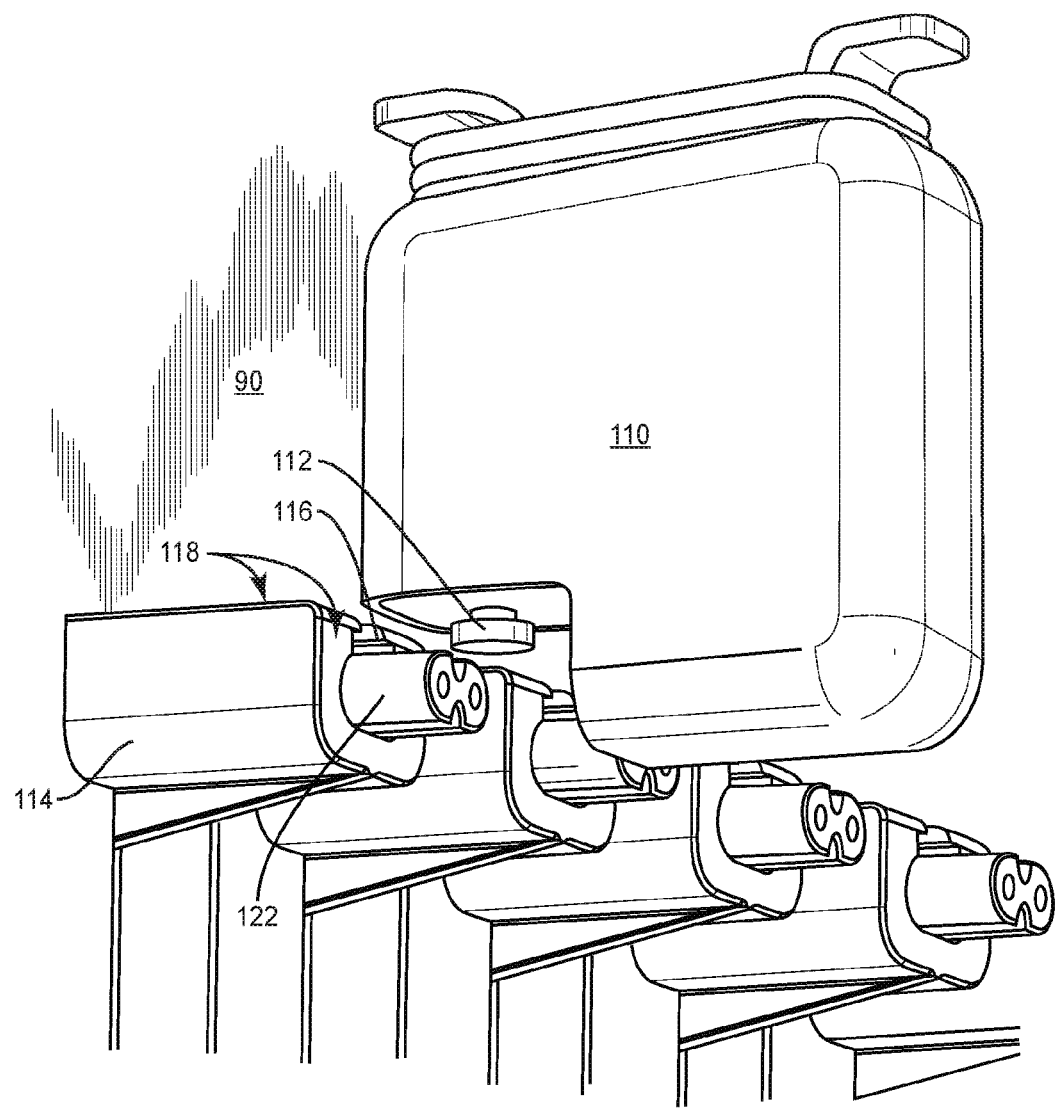
FIG. 48 is a rear perspective view of the shelf of FIG. 46 showing a detailed view of a plug stub and holding mechanism of the rear electric panel of FIG. 47.

FIGS. 46-51 show another implementation of a power configuration unit 50 including a rear electrical panel 90 designed to interconnect with proprietary Apple® AC transformers 110. Apple computers generally are designed to receive power from an AC transformer 110, which often is generally square. As shown in FIG. 48, the AC transformer 110 includes a removable plug 111 that is secured to the transformer body via a holding mechanism 112 (see FIG. 48). In the illustrated example, the holding mechanism is in the form of a disk on the end of a short peg. The Apple transformer 110 with removable plug is described in greater detail in U.S. Pat. No. 8,232,672, the content of which is hereby incorporated by reference.

Figure 50:
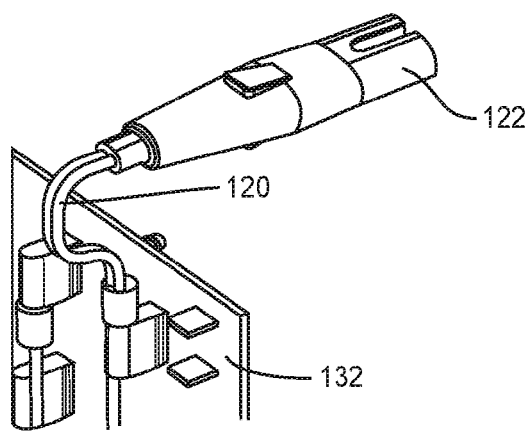
FIG. 50 is a perspective view of a power cord to extend through the plug stub of FIG. 48.

As shown in FIG. 48, in one implementation the electrical panel 90 is formed to include a set of plug stubs 114. Each plug stub 114 has a slot 116 to receive the holding mechanism 112 of the power transformer 110 and an exterior profile 118 to mimic the profile of the removable plug that normally connects with the Apple AC transformer 110. In one implementation the plug stub 114 is molded onto the electrical panel. A power cord 120 with an AC power connector 122 is provided to extend from power distribution board 132 and protrude through the plug stub 114. When the Apple AC transformer is inserted onto the plug stub, as shown in FIG. 48, the AC power connector 122 is positioned by the plug stub 114 to mate with a female connector on the AC transformer 110 and the slot 116 of the plug stub cooperates with holding mechanism 112 of AC transformer 110 to hold the AC transformer 110 in position along the back surface of the electrical panel 90 as shown in FIGS. 46 & 47. A set of AC transformers supported by a set of plug stubs 114 on the electrical panel 90 is shown in FIG. 46. As shown in FIG. 50, the power connector 122 in one implementation is a standard two barrel power cord designed to plug into a mating receptacle of AC transformer 110.

Figure 49:
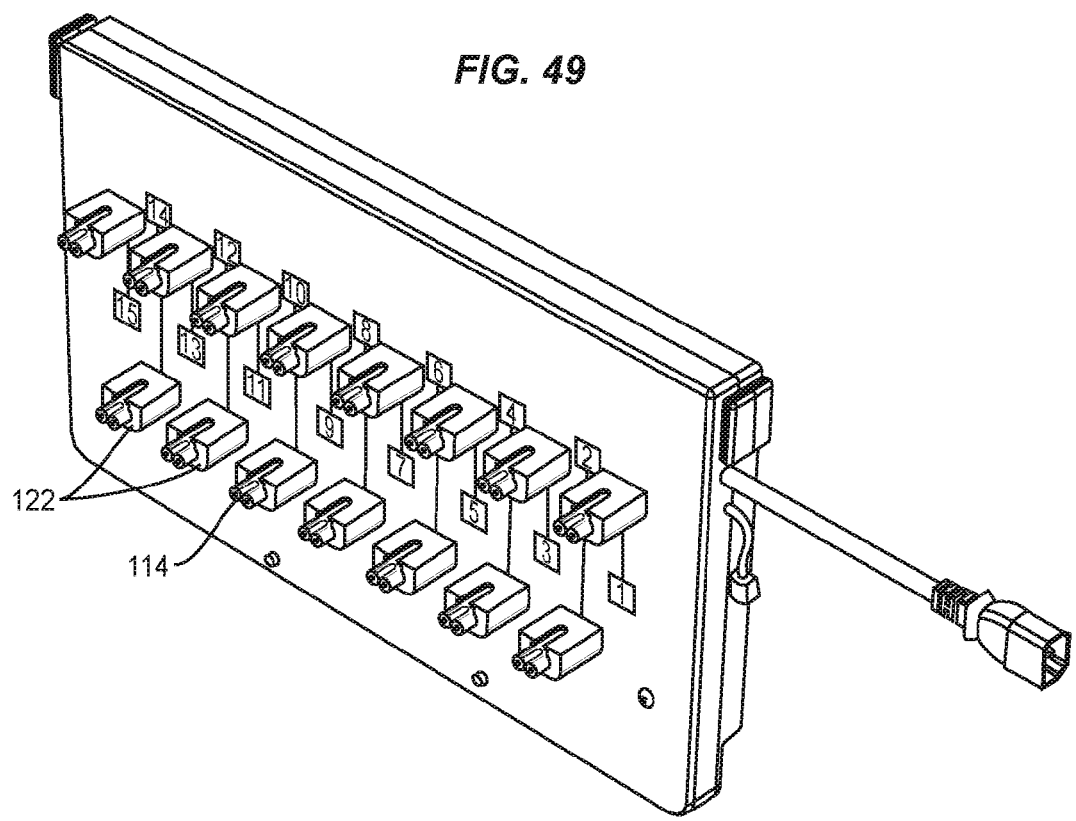
FIG. 49 is a perspective view of the rear electric panel of FIG. 47.

FIG. 49 shows the electrical panel 90 in greater detail. As shown in FIG. 49, the electrical panel 90 in this implementation has 15 stubs 114 formed thereon to enable 15 AC transformers to be connected to the electrical panel 90 as shown in FIG. 46, and to be connected to power supplied from a power distribution system on a reverse side of the electrical panel 90.

Wireless Router

Figure 51:
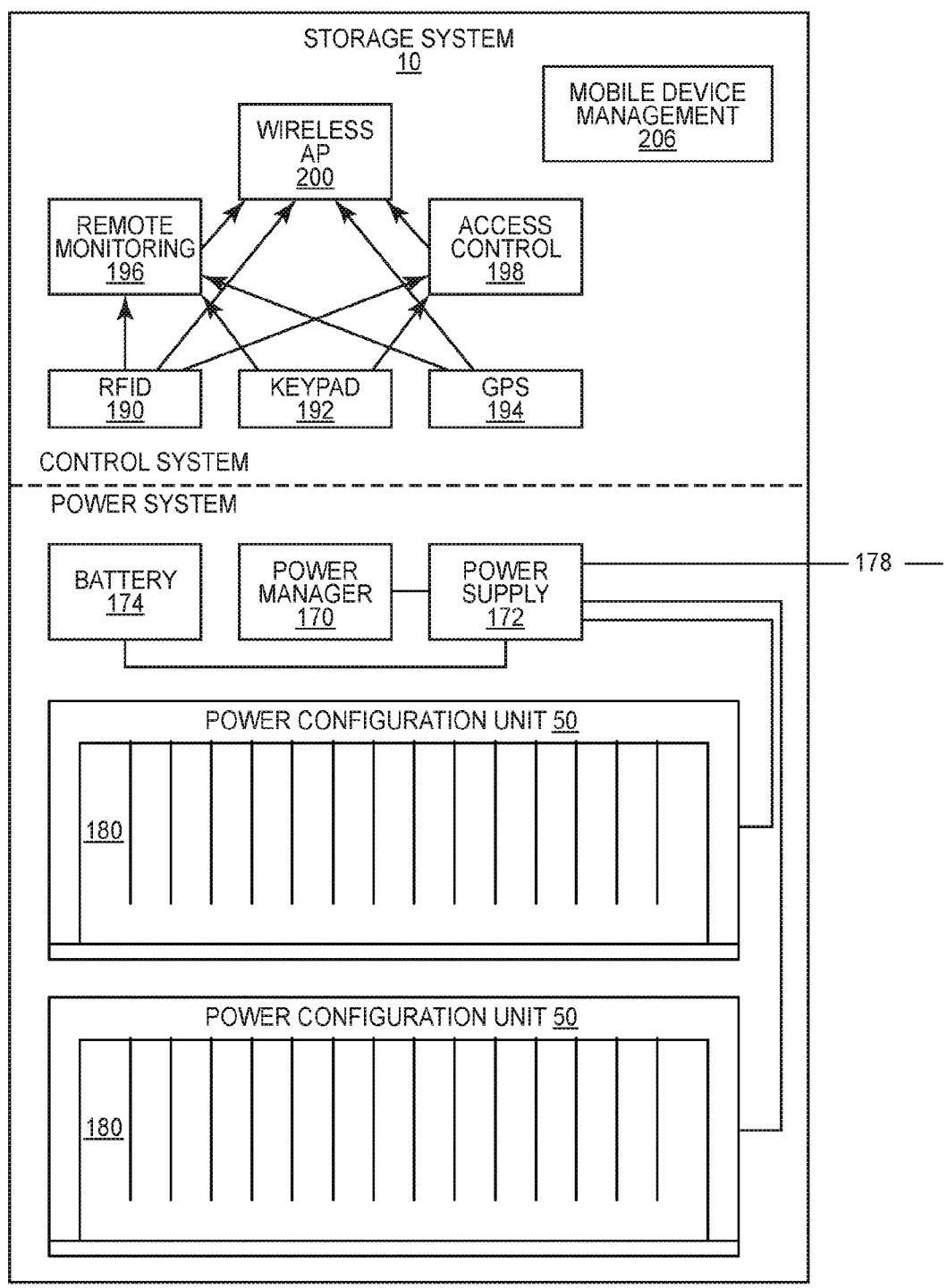
FIG. 51 is a functional block diagram of an example storage system.

FIG. 51 shows an implementation in which the storage system 10 has a number of additional features. Specifically, as shown in FIG. 51, in this implementation the storage system 10 includes two power configuration units 50 each of which is configured to provide 15 storage bays 180. Power is received from an external source such as wall power on power cord 178 and is provided to power supply 172. Power manager 170 controls power supply 172 to cause power supply 172 to distribute AC and/or DC power as required by the particular set of power configuration units installed in the storage system.

A battery 174 is provided in the cart and supplies power to components of the control system as well as to power supply 172 to supplement the power available on power cord 178. In an implementation, power manager 170 controls power supply 172 to draw power from battery 174 when extra power is needed in storage system 10, and controls power supply 172 to charge battery 174 when excess power is available on power cord 178.

The control system, in an implementation, includes a RFID system 190, a keypad 192, a GPS 194, a remote monitoring system 196, an access control system 198, and a wireless access point 200.

Figure 52:
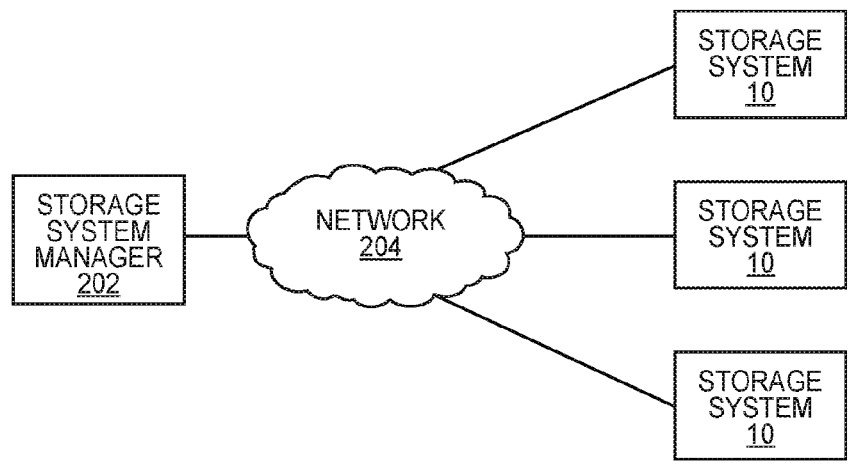
FIG. 52 is a functional block diagram of an example storage system interconnected with a storage system manager via a network.

Access control 198 may be, for example, an electronic locking system. As shown in FIG. 51, access control system 198 may receive access input from RFID reader 190 and/or keypad 192, to selectively enable access to the storage system 10. Where storage system 10 is designed to interface with a centralized storage system management system, as shown in FIG. 52, the access control may report successful and unsuccessful access attempts via wireless AP and/or to remote monitoring system.

Remote monitoring system may be connected to keypad 192 to maintain a log of access attempts. Remote monitoring system 196 also is connected to RFID system 190 to maintain a log of access attempts. Where individual assets such as computers are tagged with RFID tags, the remote monitoring system also receives input from the RFID system as to which assets are contained within the storage system 10. The remote monitoring system also receives input from GPS 194 to enable the location of the storage system 10 to be monitored. Where storage system 10 is designed to interface with a centralized storage system manager 202, as shown in FIG. 52, the remote monitoring system 196 may report GPS location information and asset control information obtained from RFID system 190 via wireless AP 200. Each of these components will be described in greater detail below.

Wireless Communication

Figure 9:
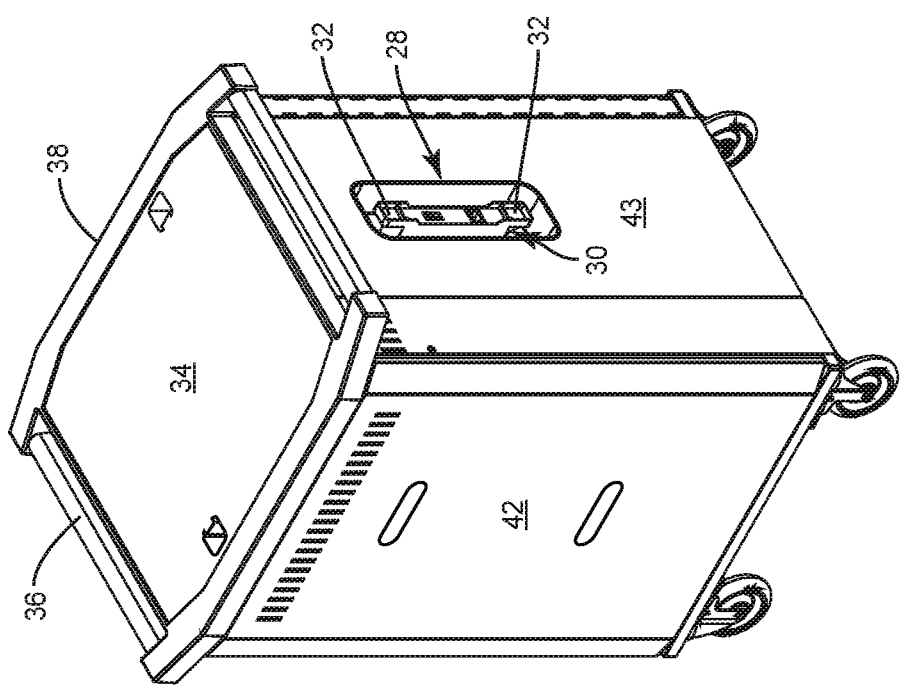

As shown in FIG. 51, the storage system 10 in one implementation includes a wireless access point 200. As shown in FIG. 9, wireless access point 200 may enable the storage system 10 to connect to a wireless local area network 204 (See FIG. 52) implemented, for example, using one of the wireless communication protocols such as IEEE 802.11 or one of the wireless communication protocols used in connection with cellular communications. Enabling the storage system 10 to connect to a wireless network 204 enables the status of the storage system 10 and the status of the assets stored within the storage system 10 to be monitored remotely at storage system management 202. Assets, in this context, includes the portable electronic devices stored in the storage system 10 as well as any peripheral devices (e.g. printer) that are also stored in the storage system. Optionally the storage system may include a remote monitoring system 196 to collect information about assets stored in the storage system 10 and forward the collected information via wireless access point 200 to the remote storage system manager 202. An example remote monitoring system is described in greater detail in U.S. patent application Ser. No. 14/612,566, filed Feb. 3, 2015, entitled Remote Monitoring System for Handheld Electronic Devices, the content of which is hereby incorporated herein by reference.

Digital Keypad

In some implementations, for example as shown in FIGS. 18-22 and 30-35, the storage system has an electronic access control system 198 implemented, for example, as an electronic lock. One type of interface to the access control system 198 may be implemented in the form of a digital keypad 192 enabling access to the storage system upon input of a correct code. In one implementation, the digital keypad 192 is implemented as described in provisional application 62/219,825 filed Sep. 17, 2015, entitled Electronic Lock Digital Keypad Interface, the content of which is hereby incorporated herein by reference. Entering a correct code into the electronic lock digital keypad 192 will cause a corresponding electronic locking mechanism to retract to enable access to the storage system.

RFID Access Control

Storage system 10 may also include an RFID scanner 190 configured to detect and read RFID tags. RFID tags in this implementation may be used in connection with access control 198 as well as for asset tracking.

In connection with asset tracking, each laptop, tablet, and peripheral to be stored in the storage system 10 is affixed with an RFID tag. The RFID tags are associated with assets by the storage system 10, remote monitoring system 196, or storage system manager 202 to enable the presence of the RFID tag to be correlated with the physical asset to be tracked. As computers are placed into the cart and removed from the storage system 10, the RFID tags are read by the RFID scanner 190. The RFID scanner reports the identity of the RFID tags visible within the storage system 10 to allow the remote monitoring system 196 or storage system manager 202 to maintain an inventory of which computers are stored in the particular storage system 10.

RFID tags may be scanned when the computers are placed into the storage system, taken out of the storage system, and optionally periodically while stored within the storage system. Optionally the RFID scanner 190 only transmits RFID tag information when there is a change, i.e. when a new RFID tag becomes visible within the storage system 10 or when a previously present RFID tag is no longer detected by the RFID scanner 190.

When the laptop/tablet is placed in the storage system 10, the RFID scanner associated with the wireless communication system 70 will detect the presence of the RFID tag and report the presence of the laptop/tablet to the remote monitoring system 74. Likewise when a laptop/tablet is removed from the storage system 10, the absence of the RFID tag will be detected by the RFID scanner and reported over the wireless network to the remote monitoring system. By detecting the absence/presence of RFID tags, and reporting the same to the remote monitoring system 196, the RFID scanner 190 can enable the laptop/tablet computers to be tracked as they are stored and removed from the storage system 10. Reporting can occur in real time—as events are occurring—or at a later point in time.

In one implementation, the RFID reader also controls access to the storage system 10 by requiring a person seeking to open a door of the storage system 10 to have an RFID access card. For example, a teacher in a school may have an identification card with an RFID chip in it that is registered with the remote monitoring system 196 and/or with storage system management 202. When the teacher would like to access the laptop/tablet computers stored in the storage system 10, the teacher will use the identification card to access the storage system 10 by causing the RFID scanner 190 to read the RFID chip in the identification card.

In this implementation, when an RFID access card is detected by the RFID scanner, the code provided by the RFID access card is forwarded to access control 198 which evaluates the code against a set of allowable access codes. If the user is authorized to access the storage system 10, the access control 198 will cause an electronic lock to unlock the doors 14 of the storage system 10.

Operations associated with accessing the storage system via the RFID scanner 190 and access control 198 may occur locally by causing the detected RFID code to be compared with a list of authorized RFID codes that are locally stored by the storage system 10. Alternatively, RFID code matching may involve transmission of the detected RFID code over the wireless network 204 to a central repository of authorized RFID codes, e.g. maintained by storage system manager 202.

Where RFID code matching occurs locally, optionally successful and unsuccessful attempts to access the storage system may be reported to the storage system manager 202 to enable the storage system manager 202 to maintain a log of who has accessed the storage system 10, when the access occurred, and which portable computing devices were inserted into and/or removed from the storage system during the access operation.

As noted above, in particular situations it may be desirable to have individual laptop/tablet computers assigned to particular individuals, such as to particular students. In an implementation, each bay within the storage system 10 is individually secured such as by having a door or retractable bolt across the front of the storage bay that is lockable such that a laptop/tablet computer stored within the bay is not able to be removed from the storage system 10 unless the bay door is unlocked. In this implementation, each individual (e.g. each student) may be provided with an identification card containing an RFID chip which must be detected by the RFID reader to open the door of the bay that currently contains the laptop/tablet computer assigned to the particular individual. In this implementation, the remote monitoring system is able to detect not only that a particular laptop/tablet computer has been removed from the storage system 10, but also that a particular individual associated with a particular identification card was used to remove the laptop/tablet computer.

In another implementation, the storage system 10 forms an association between a particular electronic device and an individual allowed to remove that electronic device from the storage system. When an electronic device is to be removed from the storage system, the storage system 10 detects the identity of the individual i.e. from the RFID chip in the access card possessed by the individual. If the individual attempts to take an electronic device that does not match the access card, an alarm may sound. Additionally, to assist the user with identifying the correct electronic device that is to be removed from the storage system, in one implementation an LED is illuminated in the storage bay where the assigned laptop or tablet computer is located, to help the individual identify the correct storage bay containing the electronic device associated with the access card.

By forming an association between the RFID tag on the computer and a particular individual, the storage system is able to selectively vend a particular computer to a particular individual so that the individual always receives the same computer from the set of stored computers. For example, when a student would like to take out a laptop computer, the student may enter their student ID code, scan a bar code from their smartphone, scan a student ID, perform a fingerprint scan, or otherwise identify themselves to the storage system such as by providing multiple of these types of information. The storage system will correlate the student identifying information with the storage location where the student's laptop is stored, and open that storage location so that the computer may be removed. When returning the computer, the student may similarly provide student identifying information or the student may simply scan the RFID tag of the computer to cause the storage system to open a storage bay to receive the computer. The storage system may open the same storage bay every time for the particular student's computer or may open any available storage bay and dynamically associate the student's identifying information with the selected storage bay.

RFID tags may be provided internal to the laptop/tablet computer, may be adhered to the laptop/tablet computer, or may be provided in a case that is used to cover/protect the laptop/tablet computer. In one implementation, the RFID tag is embedded in a tablet case that is designed to prevent the tablet from being harmed if dropped while outside of the storage system 10. In this implementation, the RFID tag may be formed internal to the case to prevent access to the RFID tag to prevent tampering with the RFID tag. Where the power configuration unit is designed to provide wirefree power to the laptop/tablet computers (discussed below), the case may also be designed to include power contacts and/or inductive coils to enable the case to receive contact based or inductive wirefree power while stored within the storage system.

GPS

In an implementation, the storage system 10 also includes a Global Positioning System (GPS) receiver 194 to detect GPS coordinates of the location of the storage system. This is particularly relevant in an implementation that is designed to be mobile, such as in connection with computer carts. The GPS coordinates may be provided to storage system management 202 so that the location of the storage system 10 is known at the storage system management 202. This may be useful to enable the location of individual storage systems 10 to be determined, for example where a storage system 10 such as a computer cart is lost or stolen.

Battery 174

In an implementation, the storage system 10 includes a battery 174 is charged when the storage system 10 is plugged into an external source of power. When the storage system 10 is not plugged into an external source of power, battery 174 is may continue charging any laptop/tablet computers stored in the storage system 10 and may also be used to run peripheral functions associated with the storage system 10, such as electronic access control 198, wireless access point 200, remote monitoring system 196, RFID scanner 190, and other functions described in greater detail herein.

For example, the battery 174 may continue to provide power to an electronic access control 198 to enable the electronic access control 198 to selectively open the doors of the storage system 10 when provided with authenticated credentials even though the storage system 10 is not connected to an external source of power. Likewise the wireless access point 200 may continue to be powered to enable the status of the storage system 10 and the devices stored therein to be monitored by storage system manager 202. Optionally the remote monitoring system 196 may notify storage system manager 202 via wireless access point 200 that the storage system 10 has been disconnected from an external source of power.

Battery 174, in one implementation, is used to power wireless access point 200 to enable the storage system to continue communicating with external systems via network 204 while not connected to an external source of power. By providing an internal source of power (battery 174) it is possible to continue to monitor laptop/tablet computers as the laptop/tablet computers are removed and inserted into the storage system 10. Likewise the electronic RFID scanner 190 and access control 198 described above will continue to receive power so that access to the storage system 10 may continue to be controlled via the electronic access and monitoring components when the storage system 10 is disconnected from an external source of power. Likewise the battery 174 backup enables the GPS receiver 194 to continue to operate to enable the location of the storage system 10 to be determined when the storage system 10 is not connected to an external source of power, for example while the storage system 10 is being moved between classrooms.

In another implementation, battery 174 also is used to supplement the amount of power available from the wall outlet while the storage system is plugged into the wall outlet to enable faster charging of computers stored in the storage system 10. For example, as described above, the amount of power available at a standard 120 V AC wall outlet is approximately 1800 Watts. To prevent the storage system from overloading the external circuit, the power manager 170 will limit the amount of power used by the storage system to 1440 Watts.

In one implementation, battery 174 is a standard small 12V car battery having approximately 45 Amp hours of stored electricity. In this implementation, when battery 174 is fully charged the battery 174 is able to provide approximately 540 Watts of charging power for an hour before being depleted. Thus, by using a battery 174 to supplement the amount of power available from an external wall outlet, the charging power available to charge computers stored within the storage system may be increased from 1440 Watts to 1980 Watts, or almost 40%. Assuming a laptop will draw 160 Watts when fully discharged, this allows the storage system to charge 12 laptops simultaneously instead of 9 laptops to greatly increase the rate at which laptop computers stored in the storage system may be charged.

A battery 174 with a larger Amp Hour capacity will provide concomitantly greater charge speed increase to the storage system to allow a larger number of laptops to be charged simultaneously. As laptops become closer to being fully charged the laptops will draw less current. Any current available from the wall outlet not used to charge laptops may be used to recharge the battery 174. In this manner the storage system 10 is able to accelerate the manner in which laptops are charged to increase the availability of the laptops for use.

Some forms of tablet computers draw 2 A current at 5V, which means that tablet computers draw on the order of 10 W of power. Thus, in an implementation where battery 174 is capable of providing 540 Watts of power, the battery 174 will have sufficient power to charge 54 tablet computers for one hour before being depleated. Thus, in an implementation designed to hold 30 tablet computers, the storage system should be able to provide significant charge to the tablet computers even when the storage system is not connected to an external source of power, i.e. is not plugged into a wall outlet.

Mobile Device Management

In one implementation, the storage system also includes mobile device management software 206 which communicates with storage system manager 202 over network 204 to enable data to be received by the storage system 10 to be synchronized to the laptop/tablet computers stored within the storage system 10. Because the laptop/tablet computers are secured within the storage system 10, it is possible to perform device management on the laptop/tablet computers to ensure that the laptop/tablet computers have the correct software installed. For example, in an environment where individuals are allowed to bring their own device, it may be desirable to ensure that every laptop/tablet computer has the correct version of antivirus and antispyware software installed and updated on their device.

Mobile device management (MDM) 206 may be implemented, optionally using a MDM program running on a host computer stored within storage system 10 and connected to the laptop and tablet computers stored within the storage system 10. Host computer, in this implementation, is connected to a data network implemented within storage system that interconnects each of the laptop and tablet computers to the host computer. Data network, in this implementation, may be wireless or wired and enables data and software stored on the host to be synchronized with the laptop/tablet computers while the tablet/laptop computers are connected within the storage system. This enables the host to interact with the laptop/tablet computers to determine what software has been installed on the devices and to enable additional software to be updated/installed while the devices are stored in the storage system 10.

Wire Free

FIGS. 53-61 show an example storage system 110 in the form of a desktop locker incorporating a wire free charging system 208 that enables AC transformers 154, AC power cords 156, and DC power cords 160 to be eliminated. The example storage system 10 in FIGS. 54-61 has been shown as a desktop locker designed to hold 20 tablet computers in individual compartments 210 defined by dividers 62. Although the example storage system 10 has been shown in the form of a desktop locker, the wire free charging system 208 may be utilized in other forms of portable computing device storage systems, such as wall mounted storage systems, floor mounted storage systems, desk mounted storage systems, lockers, mobile storage systems (e.g. carts and cases), and other types of storage systems designed to provide storage for portable computing devices. Likewise, although the illustrated example will show use of the wire free charging system 208 designed to provide wire free charging to tablet computers, the wire free charging system may be utilized in connection with other types of portable computing devices, such as cell phones, MP3 players, mini-tablet computers, and laptop computers.

Figure 53:
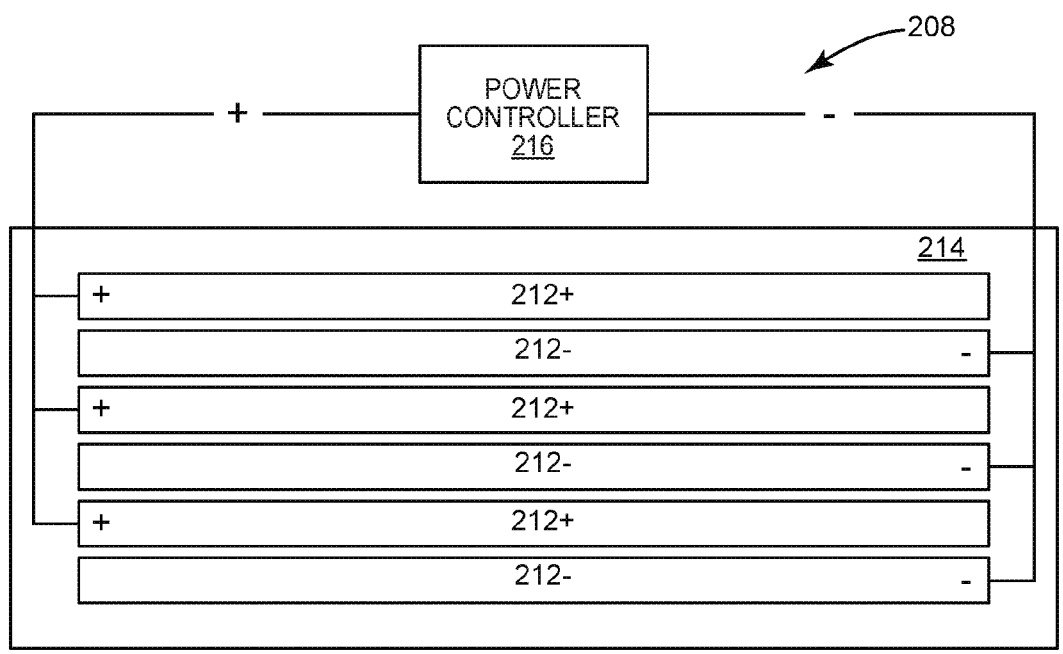
FIG. 53 is a functional block diagram of a wire-free charging system for use in a storage system according to an embodiment.

In one embodiment, the wire free charging system is formed to have contact strips 212 as shown in FIG. 53 and as described in one or more of U.S. Pat. Nos. 7,932,638, 7,982,436, 7,986,059, and/or 8,081,408, the content of each of which is hereby incorporated by reference. Specifically, as shown in FIG. 53, the wire free charging system is formed as a pad 214 having a first plurality of contact strips 212+ and a second plurality of contact strips 212−. Different electrical potential is applied to contact strips 212+ and 212−. For example, charging potential of positive 5 volts may be applied to contact strips 212+ and ground potential may be applied to contact strips 212−. The particular electrical potentials applied to the contact strips 212+, 212− will depend on the power requirements of the portable computing devices to be stored in the storage system. The electrical contact strips alternate to form an electrically conductive pad having multiple electrical contact points.

The electrical potential applied to the contact strips 212+, 212− is set by power controller 216. Power controller 216 is used to adjust the voltage levels applied to contact strips 212+, 212−. Power controller 216 may be externally instructed as to the voltage levels required by the portable computing devices, or may sense the current and voltage levels required by the portable computing devices in contact with contact strips 212+, 212−. A given wire free charging system may be utilized with multiple types of portable computing devices at different times and may simultaneously provide charging power to multiple devices by spanning across a set of individual compartments 210. Power controller 216 prevents a person from being shocked by quickly disabling power to the contact strips 212 upon detection of a short.

As shown in FIG. 54, the wire free charging system 208 is placed in a location within the storage system 10 and configured to span a plurality of compartments 210. In one embodiment, as shown in FIG. 54, the wire free charging system 208 is formed to span along a bottom of the compartments 210. In another embodiment (not shown) the wire free charging system 208 may be formed to span the back, front (i.e. by being placed on a door to contact the portable computing device when the door is closed), or on the top of the compartments. Optionally, the wire free charging system may be stationary as shown in FIG. 54. In another example the wire free charging system is movable to be moved into contact with the portable computing devices once the portable computing devices are placed within the storage system 10. In one implementation the wire-free charging system 208 may be formed in the shelf 54 itself rather than being formed as a separate unit that sits on top of shelf 54 as shown in the example implementation shown in FIG. 54.

FIGS. 55-57 show an example portable computing device 218 placed within one of the compartments 210 and resting on the pad 214 of wire free charging system 208. Contacts 220 (see FIG. 58) on an edge of the portable computing device 218 contact the contact strips 212 of the pad 214 to enable charging power to be received by the portable computing device from the pad 214 so that the portable computing device may be charged when placed in the storage system. By providing a wire free charging system 20 within the storage system 10 it is possible to charge portable computing devices 218 without requiring the portable computing devices 218 to be connected to power using a power cord.

As shown in FIGS. 55-57, a wire-free power configuration unit includes a bottom plate 222 and dividers 62 that clip or otherwise attach to bottom plate 222. Pad 214 of wire free charging system 208 is provided to span along bottom plate 222 at a bottom of the dividers 62. Having the dividers 62 and wire free charging system pad 214 supported by bottom plate 222 enables a modular wire-free power configuration unit to be created which may be retrofitted into existing storage systems 10 to enable the wire free charging system to be used to replace existing wired charging systems in previously manufactured storage systems 10. Providing a modular charging unit further facilitates manufacturing by allowing the dividers and bottom plate to be assembled outside the storage system and then inserted into the storage system 10 as a unit.

Currently available portable computing devices commonly do not have edge charging contacts 220, but rather have a power input port designed to receive power and often to be used as an input/output data port. An example of this type of port is the Lightning port utilized by many Apple products such as the iPad, iPad mini, iPhone 5/5S and iPhone 6/6S. Other types of portable computing devices may have other types of power/data ports.

According to an embodiment, a case 224 is used to enable the portable computing device 218 to receive power from pad 214 of wire-free charging system 208. In this embodiment, case 224 has contacts 226 exposed on at least one edge. Contacts 226 are connected to a power port adapter 228 that engages a power port of portable computing device 218 contained within the case 224. FIG. 58 shows an example case 224 having a first set of contacts 220 on the left edge and a second set of contacts 220 on the right edge. The contacts 220 are designed to contact the contact strips 212 of pad 214 of wire-free charging system 208 when the portable computing device 218 is placed on top of the pad 214 in the storage system 10. By providing the contacts 220 on more than one edge, a person may place the device into the storage system in multiple orientations and still cause at least one set of contacts to come into contact with the traces so that the portable computing device receives power while stored within the storage system, however only a single set of contacts on one edge is required to receive power from the wire-free charging system. In other examples the contacts are placed on one edge or on all four edges. FIG. 59 shows a close-up view of the example contacts 220 on one edge of case 224, and FIG. 60 shows a portable computing device 218 installed within case 224.

In the example case shown in FIGS. 58-60, the electrical contacts 220 are connected to a power port adapter 228 which is designed to insert into the power port of the portable computing device 218. In other embodiments, the manner in which the contacts on the case are connected to the power port may be implemented in a different manner, such as by having a male connector on the case which is designed to insert into a female power port on the portable computing device.

Although an implementation was described in which a contact-based wire-free charging system 208 was provided within the storage system 10, in another implementation an induction based wire-free charging system may be utilized in the storage system 10 instead of the contact-based wire-free charging system 208. In this implementation if the portable computing device 218 does not include an inductive coil, one or more coils within the protective case 224 are designed to resonate and obtain charge inductively from an inductive charging system provided within the storage system 10. For example, coils may be provided in the dividers 62 forming the individual compartments 210. Resonance of the coils in dividers 62 will cause reciprocal resonance in coils (not shown) formed within the conductive cases 224 to thereby inductively transfer power from the storage system to the portable computing devices 218. Many coil configurations within the storage system 10 and within the cases 224 may be utilized to enable power to be provided to the laptop/tablet computers inductively. Where the coil is formed within the case 224 rather than within the device itself, the coil from the case may be connected to the power port of the electronic device e.g. via power port adapter 228 to enable inductive charge received at the case 224 to be utilized to charge the device.

Functions of the storage system described herein may be implemented as programmable logic used in conjunction with a programmable logic device such as a Field Programmable Gate Array (FPGA) or microprocessor. Alternatively, these functions may be implemented by a set of program instructions that are stored in a computer readable memory and executed on one or more processors. Programmable logic can be fixed temporarily or permanently in a tangible medium such as a read-only memory chip, a computer memory, a disk, or other storage medium. All such embodiments are intended to fall within the scope of the present invention.

The following reference numbers are used in the attached drawings:

10 Storage System
    12 interior frame
    14 front doors
    16 first front hinges
    18 second front hinges
    20 spacer
    22 handle
    23 lock hole in frame
    24 lock
    25 rods
    26 castors
    27 brackets
    28 power cord winding
    29 tab
    30 recessed area
    32 tabs
    34 top surface
    35 grommet holes
    36 handles
    38 edges
    40 corners
    42 rear panel
    43 side panels
    44 hand holds
    46 ventilation holes on sides/back
    48 ventilation holes in bottom
    50 power configuration unit
    52 bridge
    53 space below bottom shelf
    54 shelf
    56 top plate
    58 side plate
    60 back plate
    62 divider
    64 base
    66 ABC post apertures in top plate
    68 numbering strip
    70 post
    72 ABC Securing apertures
    74 securing tabs
    80 side frame
    82 back
    84 floor
    86 riser
    88 side arms
    90 rear electrical panel
    91 cord
    92 outlet
    94 latch
    96 pivot
    98 hook
    100 tab
    102 cut-away
    104 aperture
    106 AB mounting system
    110 AC transformer
    112 holding mechanism
    114 plug stub
    116 slot
    118 exterior profile
    120 power cord
    122 power connector
    124 control card
    126 output transistors
    128 contacts
    130 pins
    132 power distribution board
    150 power distribution unit
    152 NEMA electrical AC outlets
    154 laptop computer power transformers
    156 AC cord
    158 cavity within shelf
    160 DC power cords
    161 USB ports
    162 ports
    164 power bus
    166 matching connectors
    170 Power Manager
    172 AC/DC power supply
    174 battery
    176 switch
    178 power cord
    180 individual bays
    190 RFID scanner
    192 keypad
    194 GPS receiver
    196 Remote Monitoring system
    198 Access Control system
    200 Wireless Access Point
    202 Storage system manager
    204 network
    206 mobile device management
    208 wire free charging system
    210 individual compartments
    212 contact strips
    214 pad
    216 power controller
    218 portable computing device 220 contacts
222 bottom plate
224 case
226 contacts
228 power port adapter It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto. The following reference numerals are used in the figures:

What is claimed is:

1. A storage system, comprising:
a computer storage compartment;
a first shelf;
a first power configuration unit, the first power configuration unit having a first base and a first bridge, the first bridge extending from the first base and spanning above the first shelf;
a first plurality of dividers connected to the first bridge and extending downward toward the first shelf, the first plurality of dividers forming first individual storage bays within the computer storage compartment;
a second shelf;
a second power configuration unit, the second power configuration unit having a second base and a second bridge, the second bridge extending from the second base and spanning above the second shelf; and
a second plurality of dividers connected to the second bridge and extending downward toward the second shelf, the second plurality of dividers forming second individual storage bays within the computer storage compartment;
wherein the first plurality of dividers do not contact the first shelf;
wherein the second plurality of dividers do not contact the second shelf;
wherein the storage system further comprises a power distribution unit, the power distribution unit supplying power within the storage system to the first power configuration unit and to the second power configuration unit; and
wherein the power distribution unit supplies approximately 5V DC power to the first power configuration unit and supplies approximately 110V AC power to the second power configuration unit.

2. The storage system of claim 1, wherein the first plurality of dividers are removably connected to the first bridge and attachable to the first bridge in a plurality of spacing intervals to form first individual storage bays of different widths, and
wherein the second plurality of dividers are removably connected to the second bridge and attachable to the second bridge in a plurality of spacing intervals to form second individual storage bays of different widths.

3. The storage system of claim 1, further comprising a battery connected to the power distribution unit to supply power to the first power configuration unit and to the second power configuration unit when the power distribution unit is not connected to an external source of power.

4. The storage system of claim 1, further comprising a battery connected to the power distribution unit to supply power to the first power configuration unit and to the second power configuration unit to supplement an amount of power available at the power distribution unit from an external source of power.

5. The storage system of claim 1, further comprising a wire-free charging pad on the shelf below the first plurality of dividers to span across at least a plurality of the first individual storage bays within the computer storage compartment.

6. The storage system of claim 1, wherein the first plurality of dividers are removably connected to the first bridge and attachable to the first bridge in a plurality of spacing intervals to form first individual storage bays of different widths, and
wherein the second plurality of dividers are removably connected to the second bridge and attachable to the second bridge in a plurality of spacing intervals to form second individual storage bays of different widths.

7. The storage system of claim 1, further comprising a battery connected to the power distribution unit to supply power to the first power configuration unit and to the second power configuration unit when the power distribution unit is not connected to an external source of power.

8. The storage system of claim 1, further comprising a battery connected to the power distribution unit to supply power to the first power configuration unit and to the second power configuration unit to supplement an amount of power available at the power distribution unit from an external source of power.

9. The storage system of claim 1, further comprising a wire-free charging pad on the shelf below the first plurality of dividers to span across at least a plurality of the first individual storage bays within the computer storage compartment.

10. The storage system of claim 1:
wherein the first bridge is connectable to the first base in two vertical positions;
wherein the first bridge has a pair of side plates, each side plate having first and second connectors for selective connection to the first base, wherein the first and second connectors are vertically spaced to enable the first bridge to be connected to the first base in a first of the two vertical positions in which the first bridge is at a first vertical height relative to the first base and enable the first bridge to be connected to the first base in a second of the two vertical positions in which the first bridge is at a second vertical height relative to the first base.

11. A storage system, comprising:
a computer storage compartment;
a first shelf;
a first power configuration unit, the first power configuration unit having a first base and a first bridge, the first bridge extending from the first base and spanning above the first shelf;
a first plurality of dividers connected to the first bridge and extending downward toward the first shelf, the first plurality of dividers forming first individual storage bays within the computer storage compartment;
a second shelf;
a second power configuration unit, the second power configuration unit having a second base and a second bridge, the second bridge extending from the second base and spanning above the second shelf; and
a second plurality of dividers connected to the second bridge and extending downward toward the second shelf, the second plurality of dividers forming second individual storage bays within the computer storage compartment;

wherein the first plurality of dividers do not contact the first shelf;

wherein the second plurality of dividers do not contact the second shelf;

wherein the storage system further comprises a power distribution unit, the power distribution unit supplying power within the storage system to the first power configuration unit and to the second power configuration unit; and wherein the power distribution unit supplies approximately 20V DC power to the first power configuration unit and supplies approximately 110V AC power to the second power configuration unit.

12. The storage system of claim 11, wherein the first plurality of dividers are removably connected to the first bridge and attachable to the first bridge in a plurality of spacing intervals to form first individual storage bays of different widths, and wherein the second plurality of dividers are removably connected to the second bridge and attachable to the second bridge in a plurality of spacing intervals to form second individual storage bays of different widths.

13. The storage system of claim 11, further comprising a battery connected to the power distribution unit to supply power to the first power configuration unit and to the second power configuration unit when the power distribution unit is not connected to an external source of power.

14. The storage system of claim 11, further comprising a battery connected to the power distribution unit to supply power to the first power configuration unit and to the second power configuration unit to supplement an amount of power available at the power distribution unit from an external source of power.

15. The storage system of claim 11, further comprising a wire-free charging pad on the shelf below the first plurality of dividers to span across at least a plurality of the first individual storage bays within the computer storage compartment.

16. The storage system of claim 11:
wherein the first bridge is connectable to the first base in two vertical positions;
wherein the first bridge has a pair of side plates, each side plate having first and second connectors for selective connection to the first base, wherein the first and second connectors are vertically spaced to enable the first bridge to be connected to the first base in a first of the two vertical positions in which the first bridge is at a first vertical height relative to the first base and enable the first bridge to be connected to the first base in a second of the two vertical positions in which the first bridge is at a second vertical height relative to the first base.

17. A storage system, comprising:
a computer storage compartment;
a first shelf;
a first power configuration unit, the first power configuration unit having a first base and a first bridge, the first bridge extending from the first base and spanning above the first shelf;
a first plurality of dividers connected to the first bridge and extending downward toward the first shelf, the first plurality of dividers forming first individual storage bays within the computer storage compartment;
a second shelf;
a second power configuration unit, the second power configuration unit having a second base and a second bridge, the second bridge extending from the second base and spanning above the second shelf; and
a second plurality of dividers connected to the second bridge and extending downward toward the second shelf, the second plurality of dividers forming second individual storage bays within the computer storage compartment;

wherein the first plurality of dividers do not contact the first shelf;

wherein the second plurality of dividers do not contact the second shelf;

wherein the storage system further comprises a power distribution unit, the power distribution unit supplying power within the storage system to the first power configuration unit and to the second power configuration unit; and wherein the power distribution unit supplies approximately 5V DC power to the first power configuration unit and supplies approximately 20V DC power to the second power configuration unit.

18. The storage system of claim 17, wherein the first plurality of dividers are removably connected to the first bridge and attachable to the first bridge in a plurality of spacing intervals to form first individual storage bays of different widths, and wherein the second plurality of dividers are removably connected to the second bridge and attachable to the second bridge in a plurality of spacing intervals to form second individual storage bays of different widths.

19. The storage system of claim 17, further comprising a battery connected to the power distribution unit to supply power to the first power configuration unit and to the second power configuration unit when the power distribution unit is not connected to an external source of power.

20. The storage system of claim 17, further comprising a battery connected to the power distribution unit to supply power to the first power configuration unit and to the second power configuration unit to supplement an amount of power available at the power distribution unit from an external source of power.

21. The storage system of claim 17, further comprising a wire-free charging pad on the shelf below the first plurality of dividers to span across at least a plurality of the first individual storage bays within the computer storage compartment.

22. The storage system of claim 17:
wherein the first bridge is connectable to the first base in two vertical positions;
wherein the first bridge has a pair of side plates, each side plate having first and second connectors for selective connection to the first base, wherein the first and second connectors are vertically spaced to enable the first bridge to be connected to the first base in a first of the two vertical positions in which the first bridge is at a first vertical height relative to the first base and enable the first bridge to be connected to the first base in a second of the two vertical positions in which the first bridge is at a second vertical height relative to the first base.

23. A storage system, comprising:
a computer storage compartment;
a first shelf;

a first power configuration unit, the first power configuration unit having a first base and a first bridge, the first bridge extending from the first base and spanning above the first shelf;

a first plurality of dividers connected to the first bridge and extending downward toward the first shelf, the first plurality of dividers forming first individual storage bays within the computer storage compartment;

a second shelf;

a second power configuration unit, the second power configuration unit having a second base and a second bridge, the second bridge extending from the second base and spanning above the second shelf; and a second plurality of dividers connected to the second bridge and extending downward toward the second shelf, the second plurality of dividers forming second individual storage bays within the computer storage compartment;

wherein the first plurality of dividers do not contact the first shelf;

wherein the second plurality of dividers do not contact the second shelf;

wherein the storage system further comprises a power distribution unit, the power distribution unit supplying power within the storage system to the first power configuration unit and to the second power configuration unit; and wherein the power distribution unit supplies approximately 110V AC power to the first and second power configuration units, and wherein at least one of the first and second power configuration units includes an AC/DC power transformer to convert 110V AC power to a selected DC power level for distribution to DC outlets in the power configuration unit.

24. The storage system of claim 23, wherein the first plurality of dividers are removably connected to the first bridge and attachable to the first bridge in a plurality of spacing intervals to form first individual storage bays of different widths, and wherein the second plurality of dividers are removably connected to the second bridge and attachable to the second bridge in a plurality of spacing intervals to form second individual storage bays of different widths.

25. The storage system of claim 23, further comprising a battery connected to the power distribution unit to supply power to the first power configuration unit and to the second power configuration unit when the power distribution unit is not connected to an external source of power.

26. The storage system of claim 23, further comprising a battery connected to the power distribution unit to supply power to the first power configuration unit and to the second power configuration unit to supplement an amount of power available at the power distribution unit from an external source of power.

27. The storage system of claim 23, further comprising a wire-free charging pad on the shelf below the first plurality of dividers to span across at least a plurality of the first individual storage bays within the computer storage compartment.

28. The storage system of claim 23:

wherein the first bridge is connectable to the first base in two vertical positions;

wherein the first bridge has a pair of side plates, each side plate having first and second connectors for selective connection to the first base, wherein the first and second connectors are vertically spaced to enable the first bridge to be connected to the first base in a first of the two vertical positions in which the first bridge is at a first vertical height relative to the first base and enable the first bridge to be connected to the first base in a second of the two vertical positions in which the first bridge is at a second vertical height relative to the first base.

29. An insert for a storage system, the insert comprising:

a base;

a bridge connected to the base; and a plurality of dividers connected to the bridge and extending downward from the bridge toward the base;

wherein the bridge is connectable to the base in two vertical positions; and wherein the bridge has a pair of side plates, each side plate having first and second connectors for selective connection to the base, wherein the first and second connectors are vertically spaced to enable the bridge to be connected to the base in a first of the two vertical positions in which the bridge is at a first vertical height relative to the base and enable the bridge to be connected to the base in a second of the two vertical positions in which the bridge is at a second vertical height relative to the base.

30. The insert for the storage system of claim 29, wherein the first and second connectors connect the bridge to the base to enable the bridge to be articulated in a transverse and rotational direction relative to the side plates.

31. The insert for the storage system of claim 30, wherein the first connectors comprise pivots to retain the bridge and enable the bridge to be pivoted relative to the base to expose a bottom area of the bridge to provide a user with easy accessibility to the dividers connected to the bridge.

32. The insert for the storage system of claim 29, wherein the bridge further comprises a first set of divider mounting apertures having a first lateral spacing and a second set of divider mounting apertures having a second lateral spacing.

33. The insert for the storage system of claim 32, the bridge further comprising a numbering strip, the numbering strip having a first set of numbers on a first side corresponding to the first lateral spacing and having a second set of numbers on a second side corresponding to the second lateral spacing.

34. The insert for the storage system of claim 32, wherein the first set of divider mounting apertures has fewer apertures than the second set of divider mounting apertures.

35. The insert for the storage system of claim 34, wherein when the plurality of dividers are connected to the bridge using the first set of divider mounting apertures the lateral spacing between adjacent dividers is larger than when the plurality of dividers are connected to the bridge using the second set of divider mounting apertures.

36. The insert for the storage system of claim 34, wherein the bridge further comprises a third set of divider mounting apertures having a third lateral spacing, wherein the first set of divider mounting apertures has fewer apertures than the third set of divider mounting apertures, and wherein the third lateral spacing is smaller than the first lateral spacing.

37. The insert for the storage system of claim 29, further comprising a transformer to receive AC power and transform the AC power into DC power at a first DC power level.

* * * * *